(12) United States Patent
Ichitsubo et al.

(10) Patent No.: US 11,515,617 B1
(45) Date of Patent: Nov. 29, 2022

(54) RADIO FREQUENCY ACTIVE ANTENNA SYSTEM IN A PACKAGE

(71) Applicant: Micro Mobio Corporation, Palo Alto, CA (US)

(72) Inventors: Ikuroh Ichitsubo, Sagamihara (JP); Masaya Kuwano, Sagamihara (JP); Koshiro Matsumoto, Tokyo (JP); Guan-Wu Wang, Palo Alto, CA (US); Kanya Kubota, Higashi-Omi (JP)

(73) Assignee: Micro Mobio Corporation, Palo Alto, CA (US)

( * ) Notice: Subject to any disclaimer, the term of this patent is extended or adjusted under 35 U.S.C. 154(b) by 328 days.

(21) Appl. No.: 16/840,218

(22) Filed: Apr. 3, 2020

Related U.S. Application Data

(60) Provisional application No. 62/828,996, filed on Apr. 3, 2019.

(51) Int. Cl.
*H01Q 1/22* (2006.01)
*H01Q 9/04* (2006.01)
*H01L 23/66* (2006.01)
*H01L 23/552* (2006.01)

(52) U.S. Cl.
CPC ......... *H01Q 1/2283* (2013.01); *H01L 23/552* (2013.01); *H01L 23/66* (2013.01); *H01Q 9/0407* (2013.01); *H01L 2223/6677* (2013.01)

(58) Field of Classification Search
CPC ................ H01Q 1/2283; H01Q 9/0407; H01L 2223/6677; H01L 23/552; H01L 23/66
See application file for complete search history.

(56) References Cited

U.S. PATENT DOCUMENTS

| | | | |
|---|---|---|---|
| 4,977,041 A | 12/1990 | Shiozawa |
| 5,450,090 A | 9/1995 | Geis |
| 5,525,942 A | 6/1996 | Horii |
| 5,656,972 A | 8/1997 | Norimatsu |
| 5,880,635 A | 3/1999 | Stash |
| 5,923,289 A | 7/1999 | Buer |
| 6,025,651 A | 2/2000 | Nam |

(Continued)

*Primary Examiner* — Hasan Islam
(74) *Attorney, Agent, or Firm* — Roark IP

(57) ABSTRACT

The wireless RF semiconductor system is described for use in wireless communication devices that operate in frequency range from approximately 6 GigaHertz (GHz) to 100 GHz. The system comprises of at least one RF antenna and at least one RF integrated circuit fabricated (or built) on the same semiconductor substrate inside a one single packaged module. The wireless RF semiconductor system is described in a variety of different configurations with its functionality divided up over several single chip circuits. The system simplifies assembly, reduces size and cost, and allows for a quick time to market, while maximizing the RF performance demanded by fixed and mobile 4G, 5G and other wireless standards. The system uses a novel idea of configuration and packaging of active and passive RF components into a single module. This in turn allows RF manufacturers to unlock the potential of very high frequencies operation that were previously thought too expensive and unattainable to average user. The wireless RF semiconductor system can be implemented in both mobile solutions (such as phones and tablets) and fixed applications (such as repeaters, base-stations, and distributed antenna systems).

20 Claims, 40 Drawing Sheets

(56) References Cited

U.S. PATENT DOCUMENTS

| | | | |
|---|---|---|---|
| 6,151,509 | A | 11/2000 | Chorey |
| 6,262,630 | B1 | 7/2001 | Eriksson |
| 6,320,464 | B1 | 11/2001 | Suzuki |
| 6,462,622 | B1 | 10/2002 | Mori |
| 6,625,050 | B2 | 9/2003 | Suva |
| 6,678,506 | B1 | 1/2004 | Dolman |
| 6,756,844 | B2 | 6/2004 | Nanao |
| 6,798,287 | B2 | 9/2004 | Wu |
| 7,157,966 | B2 | 1/2007 | Baree et al. |
| 7,444,124 | B1 | 10/2008 | Loeb et al. |
| 7,515,916 | B1 | 4/2009 | Alexander |
| 7,619,468 | B1 | 11/2009 | Bowles |
| 9,000,847 | B2 * | 4/2015 | Zhao ............... H03F 1/223 330/310 |
| 9,438,186 | B2 | 9/2016 | Srinidhi |
| 10,056,922 | B1 * | 8/2018 | Tsvelykh ........ H01P 1/20345 |
| 10,916,861 | B2 * | 2/2021 | Yoon ............... H01Q 9/045 |
| 2003/0122079 | A1 | 7/2003 | Pobanz |
| 2003/0201827 | A1 | 10/2003 | Ohnishi |
| 2004/0127185 | A1 | 7/2004 | Abrahams |
| 2004/0203552 | A1 | 10/2004 | Horiuchi |
| 2004/0266371 | A1 | 12/2004 | Summers et al. |
| 2005/0174173 | A1 | 8/2005 | Blodgett |
| 2005/0189990 | A1 | 9/2005 | Mizuta et al. |
| 2005/0239415 | A1 | 10/2005 | Sagae |
| 2006/0097783 | A1 | 5/2006 | Okubo |
| 2006/0132232 | A1 | 6/2006 | Baree et al. |
| 2007/0190952 | A1 | 8/2007 | Waheed et al. |
| 2007/0225033 | A1 | 9/2007 | Yoon |
| 2008/0218270 | A1 | 9/2008 | Hau et al. |
| 2008/0299759 | A1 | 12/2008 | Chatterjee |
| 2008/0303121 | A1 | 12/2008 | Lin |
| 2009/0040885 | A1 | 2/2009 | Horimai |
| 2009/0315622 | A1 | 12/2009 | Suzuki |
| 2010/0144286 | A1 | 6/2010 | Sorensen |
| 2012/0025916 | A1 | 2/2012 | Deguchi |
| 2012/0219048 | A1 | 8/2012 | Camuffo |
| 2013/0137381 | A1 | 5/2013 | Vassilou |
| 2014/0118063 | A1 | 5/2014 | Briffa |
| 2014/0292404 | A1 * | 10/2014 | Geng ............... H03F 3/20 330/149 |
| 2016/0035696 | A1 | 2/2016 | Tao |
| 2016/0211810 | A1 | 7/2016 | Kerek |
| 2018/0337148 | A1 * | 11/2018 | Baek ............... H01L 24/20 |
| 2020/0015357 | A1 * | 1/2020 | Kim ............... H01L 23/13 |

* cited by examiner

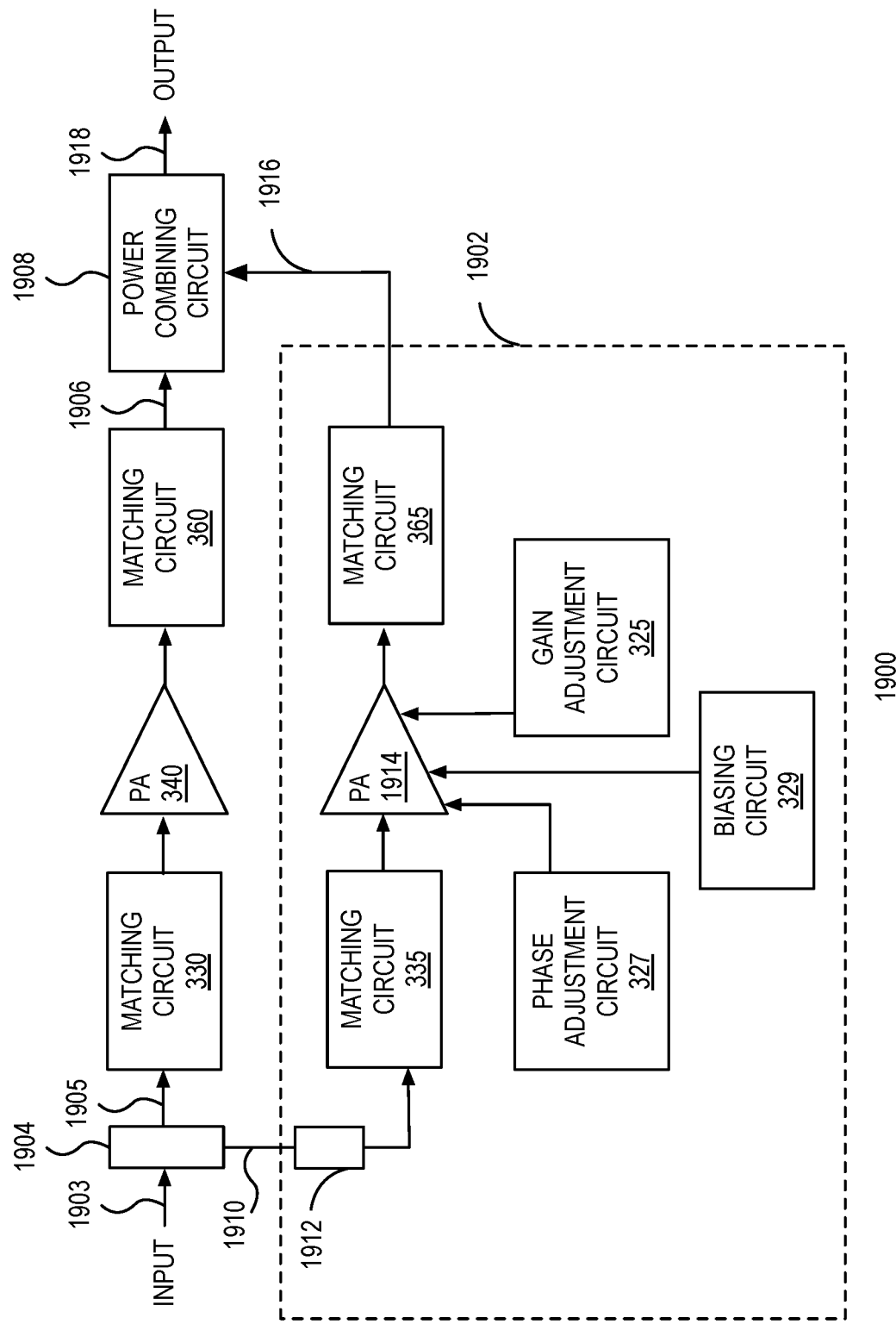

28 GHz, 39 GHz

RADIO FREQUENCY ACTIVE ANTENNA SYSTEM IN A PACKAGE

CROSS REFERENCES TO RELATED APPLICATIONS

The present application claims the benefit of U.S. Patent Provisional Application Ser. No. 62/828,996, filed on Apr. 3, 2019. The content of this application is incorporated herein in its entirety by reference.

BACKGROUND

The present invention relates to radio frequency circuits.

Portable devices such as laptop personal computers, Personal Digital Assistant and cellular phones with wireless communication capability are being developed in ever decreasing size for convenience of use. Correspondingly, the electrical components thereof must also decrease in size while still providing effective radio transmission performance. However, the substantially high transmission power associated with radio frequency (RF) communication increases the difficulty of miniaturization of the transmission components.

A major component of a wireless communication device is the power amplifiers (PA). A PA can be fabricated on a semiconductor integrated circuit (IC) chip to provide signal amplification with substantial power. The power amplifier chip can be interconnected with certain off-chip components such as inductors, capacitors, resistors, and transmission lines for operation controls and for providing impedance matching to the input and output RF signals.

One significant challenge for power amplifiers is power consumption. As RF devices are used in longer distances and broader frequencies, the RF devices can consume power at increased rates. Batteries of the RF devices often need to be frequently recharged. Several attempts have been made to improve power amplifiers' power consumption. A power amplifier using so called "Doherty Technique" includes a plurality of serially connected power amplifiers. Another attempt utilizes a number of power amplifiers arranged in a parallel circuit. Another design attempts to reduce power amplifiers' power consumption using quadrature balanced amplifiers. These designs, however, usually cannot provide high quality signals over a wide output power range and a wide frequency range.

SUMMARY

An aspect of this disclosure includes a radio frequency (RF) system comprising: a plurality of phase shift and gain control single chip circuits each having a phase shifter and gain controller which are each configured to receive one of a plurality of RF signals and adjust a phase and a gain of one of the RF signals; a plurality of power amplifier single chip circuits each having a power amplifier which receives one of the RF signals from each of the plurality of phase shift and gain control single chip circuits, each power amplifier capable of amplifying one of the RF signals; and a plurality of antennas coupled to the plurality of power amplifier single chip circuits wherein each antenna is capable of transmitting one of the plurality of RF signals.

Another aspect of this disclosure is a method of transmitting a radio frequency (RF) signal comprising: inputting an input RF signal to a first splitter and splitting the RF signal into two signals; sending one of the RF signals to a second splitter and one of the RF signals to a third splitter to create a plurality of RF signals; inputting the plurality of RF signals into a plurality of phase shift and gain control single chip circuits each having a phase shifter and gain controller which receive one of the plurality of RF signals and adjust a phase and a gain of one of the plurality of RF signals; sending the plurality of signals to a plurality of power amplifier single chip circuits each having a power amplifier which receives one of the plurality of RF signals from each of the plurality of phase shift and gain control single chip circuits, wherein each power amplifier amplifies one of the RF signals; and transmitting the plurality of RF signals from a plurality of antennas coupled to the plurality of power amplifier single chip circuits.

Another aspect of the disclosure is a radio frequency (RF) system comprising: a plurality of single chip circuits which are each configured to receive one of a plurality of RF signals, each of said plurality of single chip circuits having a phase shifter to adjust a phase of one of the RF signals, a gain controller to adjust a gain of one of the RF signals and a power amplifier to amplify one of the RF signals; and a plurality of antennas coupled to the plurality of single chip circuits, each of said plurality of antennas being capable of transmitting one of the RF signals.

Another aspect of the disclosure is a radio frequency (RF) system comprising: a plurality of phase shift and gain control single chip circuits each having a phase shifter and gain controller which are configured to receive one of a plurality of RF signals and adjust a phase and a gain of one of the RF signals; and a plurality of power amplifier single chip circuits coupled to each of the plurality of phase shift and gain control single chip circuits capable of amplifying one of the plurality of RF signals, wherein the power amplifier single chip circuits each have a plurality of antennas coupled to the plurality of power amplifiers and wherein each of the plurality of antennas is capable of transmitting one of the plurality of RF signals.

Another aspect of the disclosure is a radio frequency (RF) system comprising: a plurality of single chip circuits which are configured to receive a plurality of RF signals, each of said plurality of single chip circuits having: a phase shifter to adjust a phase of one of the plurality of RF signals; a gain controller to adjust a gain of the one of the plurality of RF signals; a power amplifier to amplify the one of the plurality of RF signals; and an antenna capable of transmitting the one of the plurality of RF signals.

Another aspect of the disclosure is a radio frequency (RF) system comprising: a plurality of single chip circuits which are configured to receive a plurality of RF signals, each of said plurality of single chip circuits having: a plurality of phase shifters to adjust a phase of each of the RF signals; a plurality of gain controllers to adjust a gain of each of the RF signals; a plurality of power amplifiers to amplify each of the RF signals; and a plurality of antennas capable of transmitting each of the RF signals.

Another aspect of the disclosure is a radio frequency (RF) system comprising: a single chip circuit configured to receive a plurality of RF signals, said single chip circuit having: at least four phase shifters to adjust a phase of each of the RF signals; at least four gain controllers to adjust a gain of each of the RF signals; at least four power amplifiers to amplify each of the RF signals; and at least four antennas capable of transmitting each of the RF signals.

Another aspect of the disclosure is a radio frequency (RF) system comprising: a single chip circuit configured to receive a plurality of RF signals, said single chip circuit having: at least four phase shifters to adjust a phase of each of the RF signals; at least four gain controllers to adjust a gain of each of the RF signals; and at least four power amplifiers to amplify each of the RF signals; and at least four antennas coupled to the single chip circuit capable of transmitting the plurality of RF signals.

Another aspect of the disclosure is a radio frequency (RF) system comprising: a phase shift, gain control and power amplifier single chip circuit configured to receive a plurality of RF signals, said phase shift, gain control and power amplifier single chip circuit having: at least four phase shifters to adjust a phase of each of the RF signals; at least four gain controllers to adjust a gain of each of the RF signals; and at least four power amplifiers to amplify each of the RF signals; and an antenna single chip circuit having at least four antennas coupled to the phase shift, gain control and power amplifier single chip circuit capable of transmitting the plurality of RF signals.

Another aspect of the disclosure is a radio frequency (RF) system comprising: a phase shift and gain control single chip circuit configured to receive a plurality of RF signals, said single chip circuit having: at least four phase shifters to adjust a phase of each of the RF signals and at least four gain controllers to adjust a gain of each of the RF signals; a power amplifier single chip circuit coupled to the phase shift and gain control single chip circuit, said power amplifier single chip circuit having at least four power amplifiers and capable of amplifying the RF signals; and an antenna single chip circuit having at least four antennas coupled to the power amplifier single chip circuit and capable of transmitting the plurality of RF signals.

Another aspect of the disclosure is a circuit comprising: a power divider configured to divide an input signal into a first divided signal and a second divided signal, wherein the first divided signal is coupled to a first power amplifier and the second divided signal is coupled to the adjacent channel leakage correction circuit; wherein the adjacent channel leakage correction circuit comprises: a phase shifter and attenuation circuit to change the phase of the second divided signal to have the opposite phase of the first divided signal and to lower the signal power level of the second divided signal; a second power amplifier coupled to the phase shifter and attenuation circuit and configured to amplify and adjust the output of the phase shifter and attenuation circuit; a power combining circuit coupled to the output of the first power amplifier and second power amplifier and configured to substantially remove leakage from the first power amplifier output signal by combining the output signal of the first power amplifier with the second power amplifier output signal.

Another aspect of the disclosure is a method comprising: dividing a radio frequency input signal into a first divided signal and a second divided signal at a power divider; forwarding the first divided signal to a first amplifier and outputting a first amplifier output signal; forwarding the second divided signal to a phase shifter and attenuation circuit to shift the phase of the second divided signal to be approximately opposite to that of the first amplifier output signal and lower the signal power level of the second divided signal; passing the second divided signal to a second power amplifier to amplify and adjust the second divided signal to output a second power amplifier output signal; combining the first power amplifier output signal and the second power amplifier output signal in a power combining circuit to substantially remove leakage from the first power amplifier output in a power combining circuit output signal.

Another aspect of the disclosure is a wireless radio frequency (RF) semiconductor single packaged module comprising: an RF antenna and an RF integrated circuit (IC) arranged with a ground plane located in between; and wherein the module can transmit or receive at least one or more RF frequency bands.

Another aspect of the disclosure is a wireless radio frequency (RF) semiconductor single packaged module comprising: an RF integrated circuit (IC) and a baseband IC shielded by a ground located between the RF IC and the baseband IC and an RF antenna; and wherein the module can transmit or receive at least one RF frequency band.

BRIEF DESCRIPTION OF THE DRAWINGS

The following drawings, which are incorporated in and from a part of the specification, illustrate embodiments of the present specification and, together with the description, serve to explain the principles of the specification.

FIG. 19 is a schematic diagram for a linear amplifier with an adjacent channel leakage correction circuit.

DETAILED DESCRIPTION

Figure 1A:
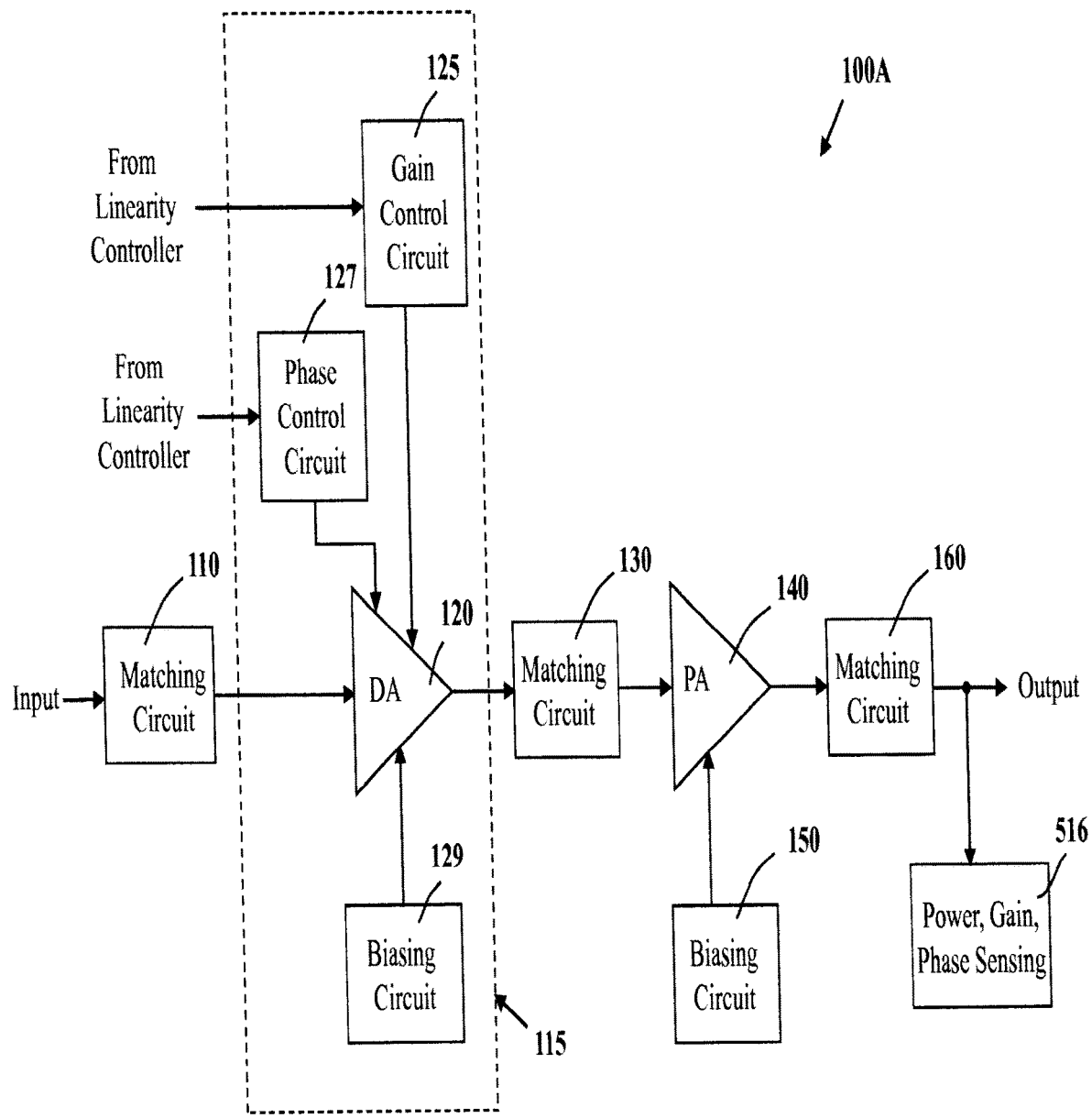
FIGS. 1A-1D are schematic diagrams for power amplifier circuits with linearity controls in accordance to the present invention.
Figure 5A:
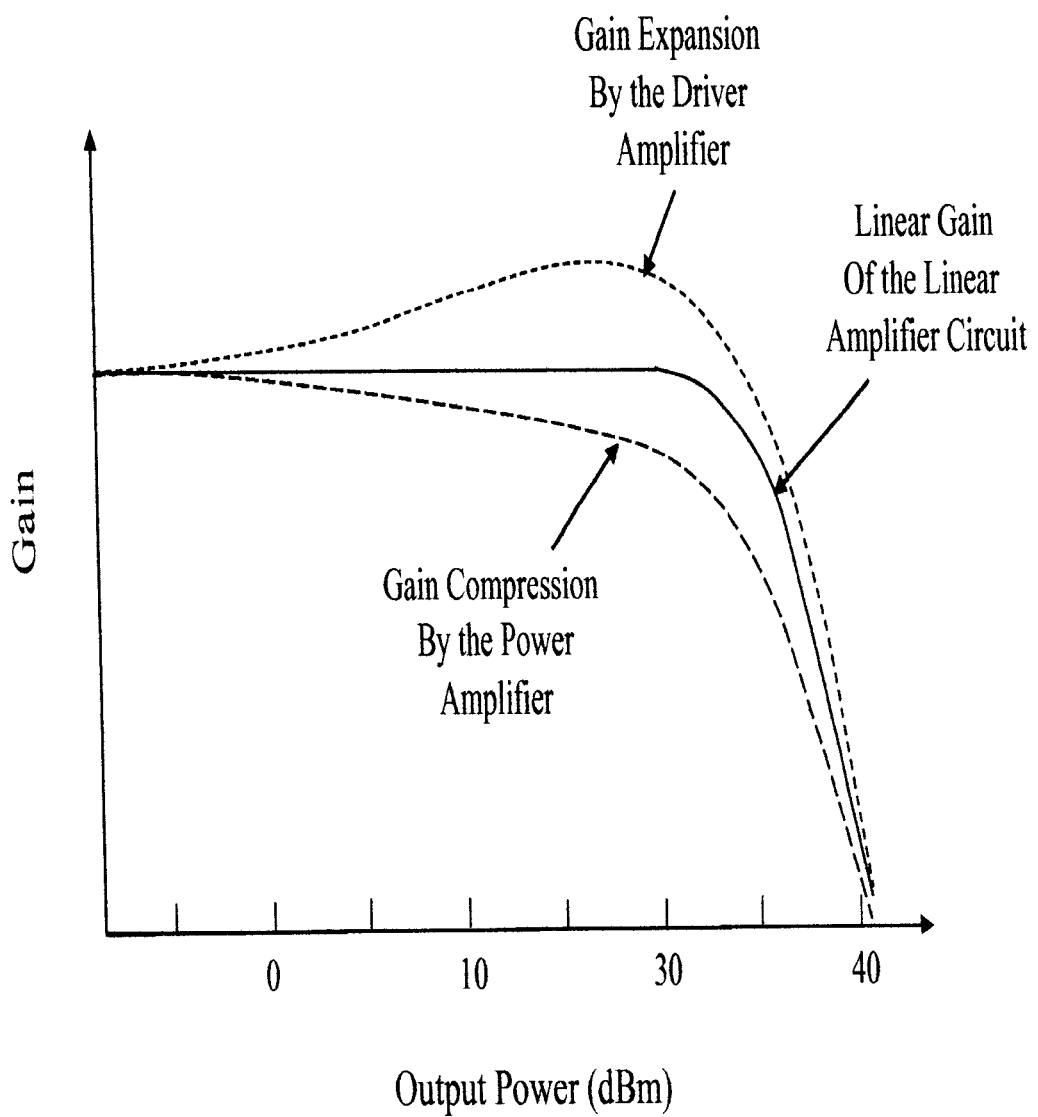
FIG. 5A illustrates an implementation of achieving linear gain using gain compensation in the linear amplifier circuit of FIGS. 1A-3.
Figure 5B:
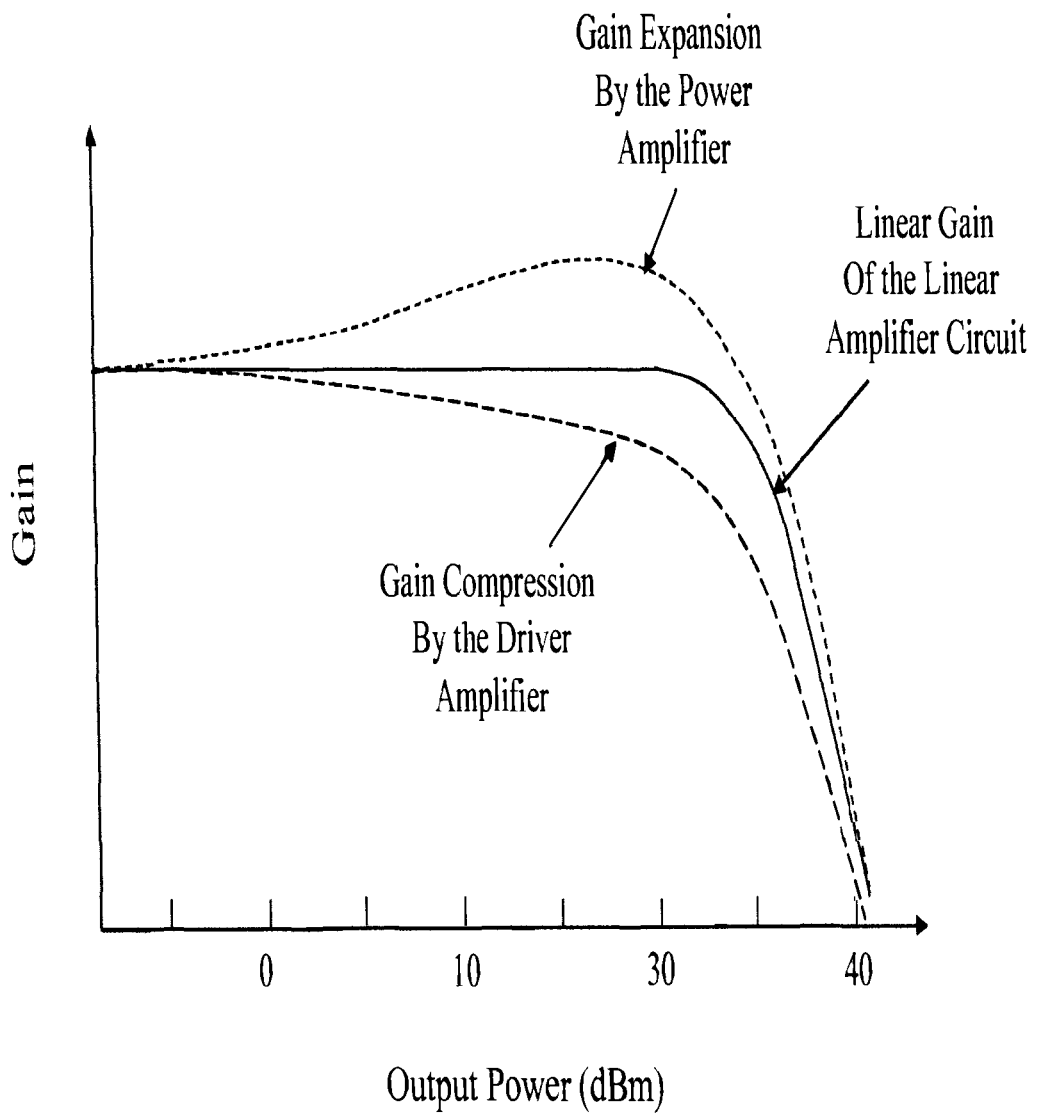
FIG. 5B illustrates another implementation of achieving linear gain using gain compensation in the linear amplifier circuit of FIGS. 1A-3.
Figure 6A:
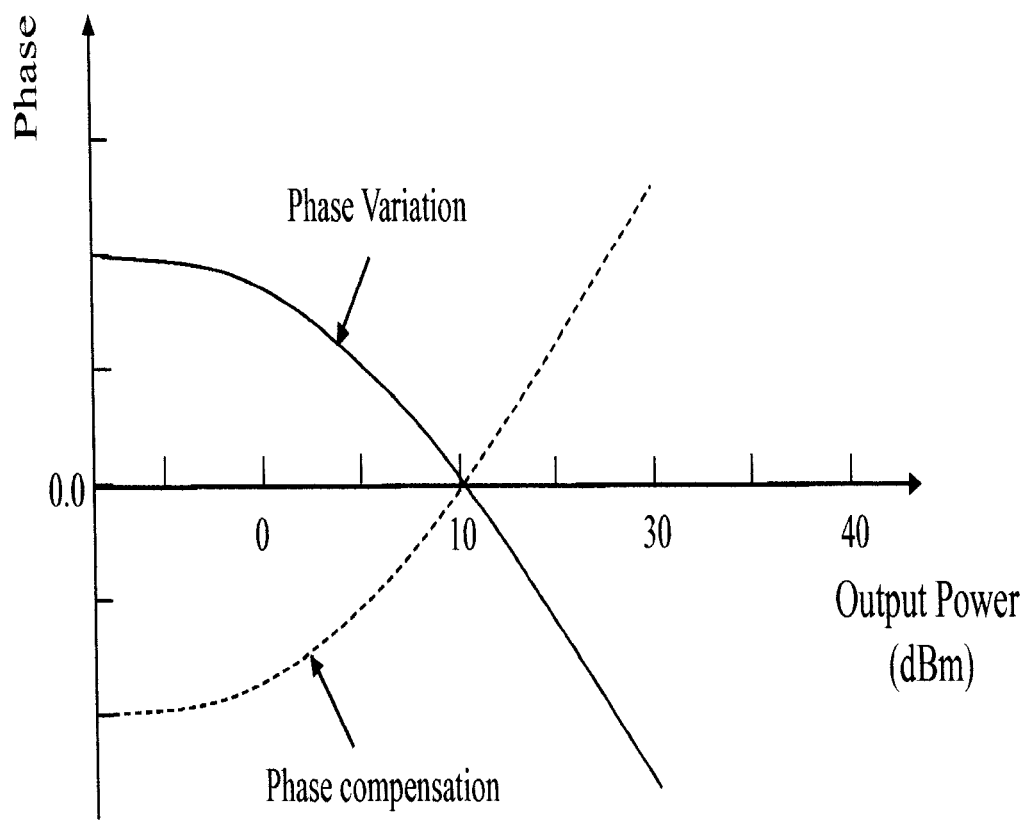
FIG. 6A illustrates an implementation of achieving linearity using phase compensation in the linear amplifier circuit of FIGS. 1A-3.
Figure 6B:
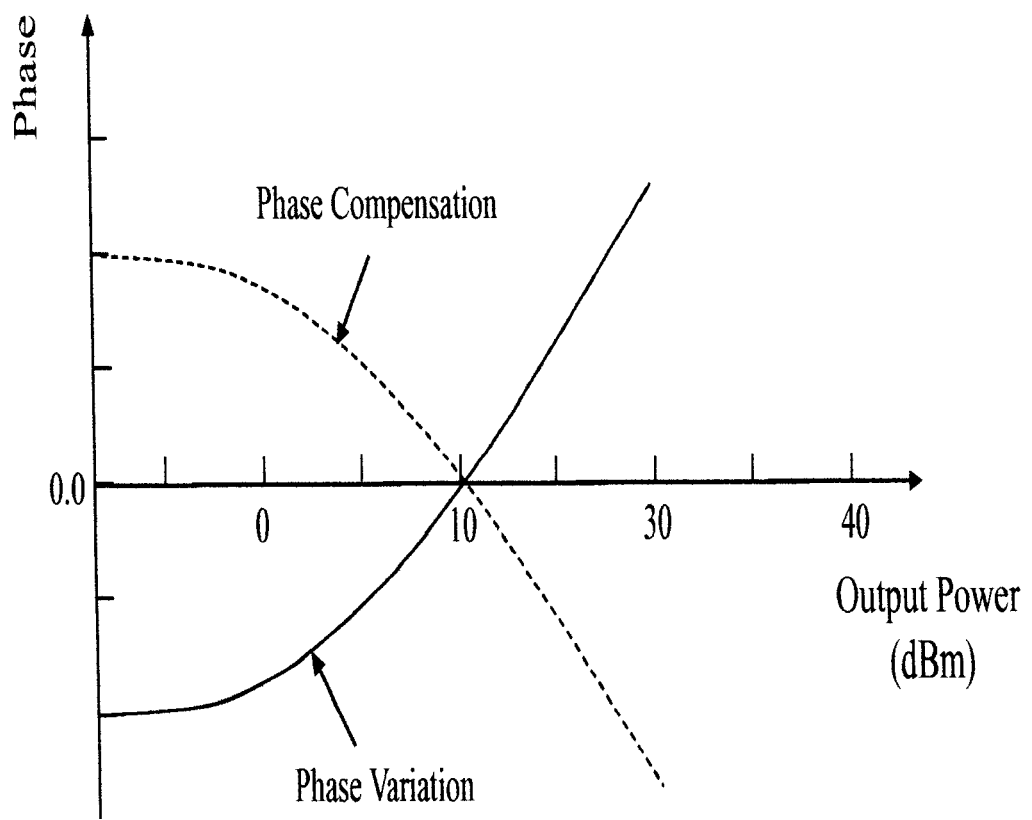
FIG. 6B illustrates another implementation of achieving linearity using phase compensation in the linear amplifier circuit of FIGS. 1A-3.

A power amplifier circuit 100A, referring to FIG. 1A, includes a matching circuit 110 and a power driving stage 115 that includes a driver amplifier (DA) 120, a gain control circuit 125, and a phase control circuit 127. The gain control circuit 125 and the phase control circuit 127 can respectively provide gain and phase controls to the driver amplifier 120. The gain control circuit 125 and the phase control circuit 127 receive control signals from a linearity controller that can be a base band processor (520 in FIG. 7 below) or a dedicated linearity control circuit. The power amplifier circuit 100A also includes a matching circuit 130, a power amplifier 140, and a matching circuit 160. The bias of the power amplifier 140 is under the control of a biasing circuit 150. The matching circuit 110 can receive an input RF signal. The matching circuit 110 can match the input impedance to the impedance of the device that provides the input signal and send an impedance matched signal to the driver amplifier 120. The driver amplifier 120 is biased by a biasing circuit 129 that can be internal in the driver amplifier 120. The driver amplifier 120 can amplify the signal from the matching circuit 110 and send a first amplified signal to the matching circuit 130. The matching circuit 130 can match the impedance of the first amplified signal and send an impedance matched signal to the power amplifier 140 that can generate a second amplified signal. The matching circuit 160 can match the impedance of the second amplified signal and produce an output signal. The driver amplifier 120, the matching circuit 130, and the power amplifier 140 together can be called a multi-stage power amplifier. As discussed below in relation to FIG. 7 and a wireless communication device 500, a sensing circuit 516 that can detect the power, the gain, and the phase of the output signal from the matching circuit 160 to produce a sensing signal. As discussed below in relation with FIGS. 5A and 5B, the gain control circuit 125 can improve gain linearity by compensating the gain expansion and compression between the driver amplifier 120 and the subsequent power amplifier 140. As shown in FIGS. 6A and 6B, the phase control circuit 127 can correct or compensate for phase variations over a range of the output power.

Figure 1B:
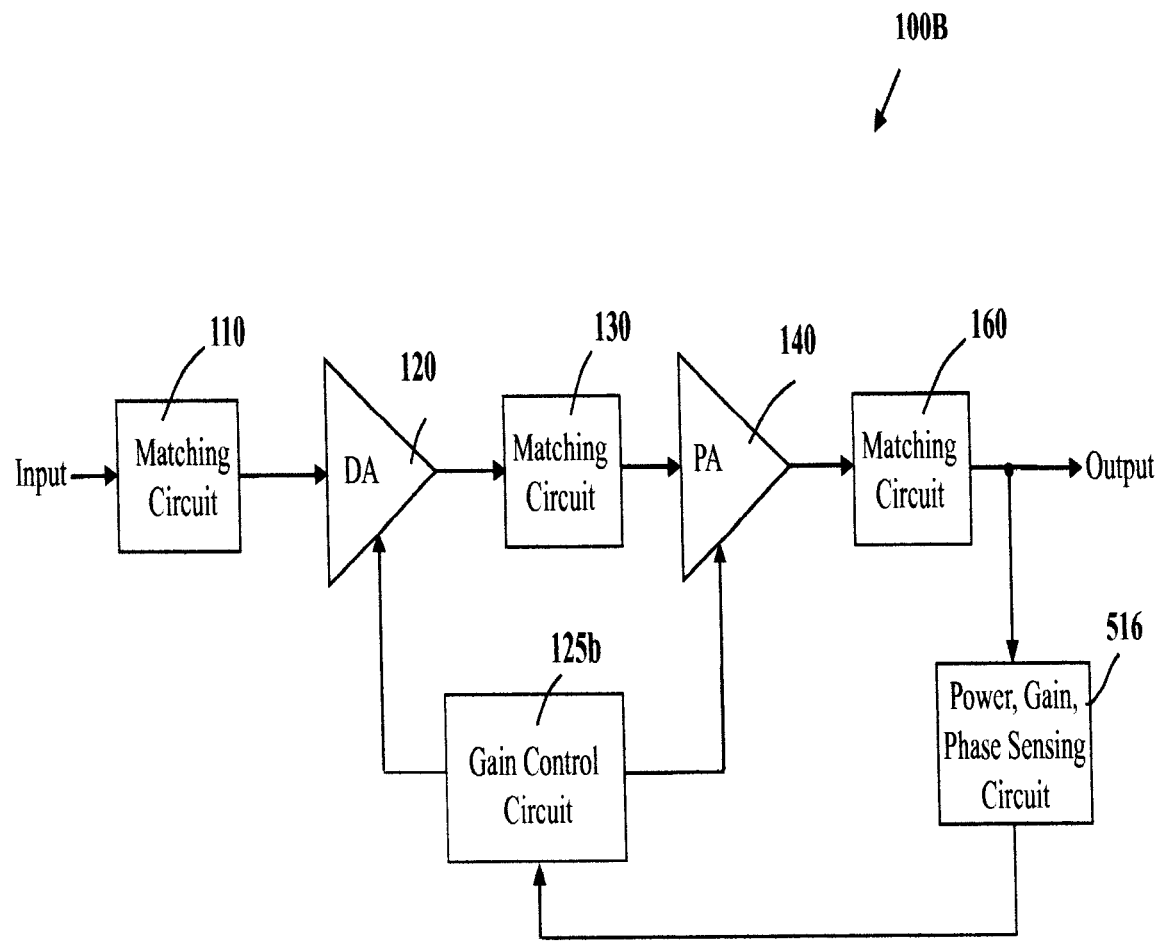

In some embodiments, referring to FIG. 1B, a power amplifier circuit 100B includes a matching circuit 110, a driver amplifier 120, a gain control circuit 125*b*, a power amplifier 140, a matching circuit 160, and a sensing circuit 516. The driver amplifier 120, the matching circuit 130, and the power amplifier 140 together can be called a multi-stage power amplifier. The sensing circuit 516 can detect the power, the gain, and the phase of the output signal from the matching circuit 160 to produce a sensing signal. The gain control circuit 125*b* can control the linearity of the power diver 120 and the power amplifier 140 in response to the sensing signal. As discussed below in relation with FIGS. 5A and 5B, the gain control circuit 125*b* can improve gain linearity by compensating the gain expansion and compression between the driver amplifier 120 and the power amplifier 140.

Figure 1C:
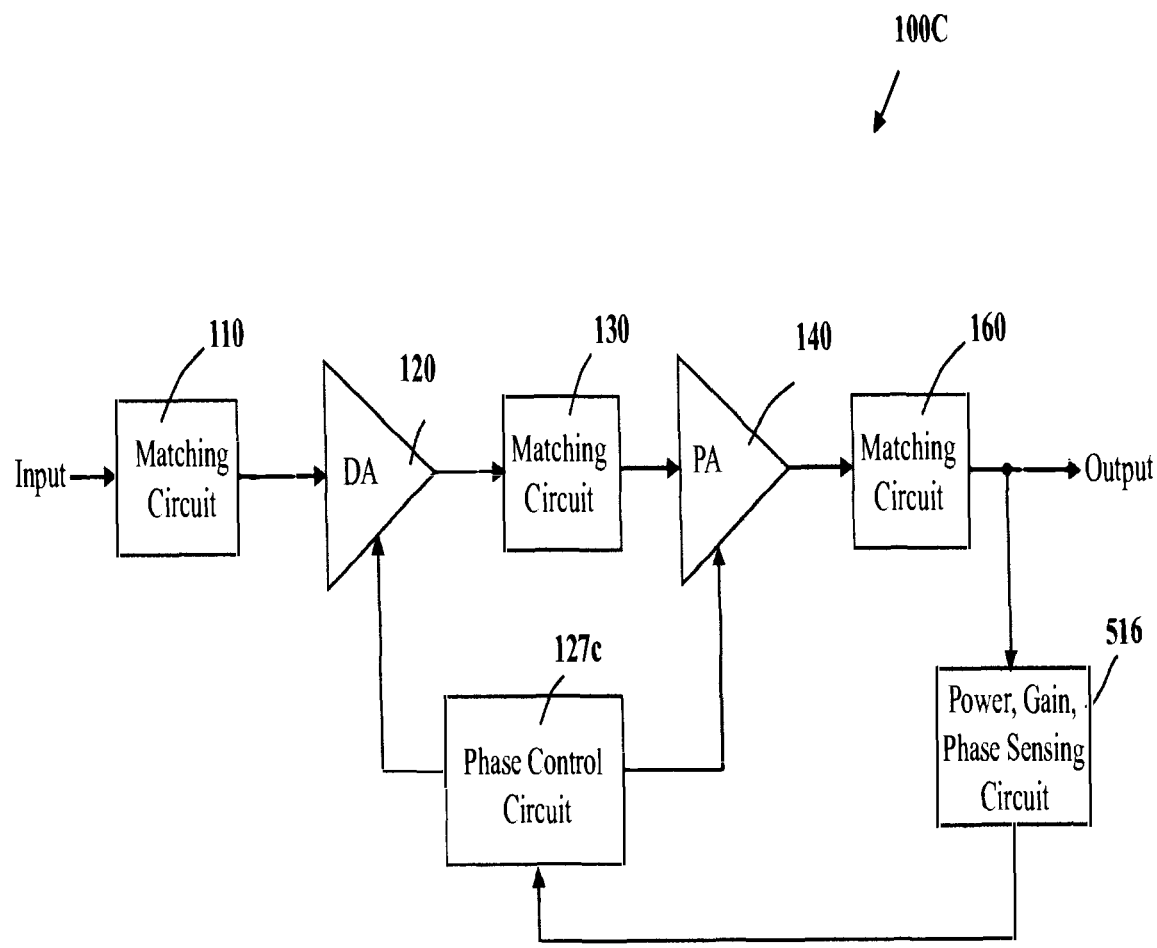

In some embodiments, referring to FIG. 1C, a power amplifier circuit 100C includes a matching circuit 110, a driver amplifier 120, a phase control circuit 127c, a power amplifier 140, a matching circuit 160, and a sensing circuit 516. The driver amplifier 120, the matching circuit 130, and the power amplifier 140 together can be called a multi-stage power amplifier. The sensing circuit 516 can detect the power, the gain, and the phase of the output signal from the matching circuit 160 to produce a sensing signal. The phase control circuit 127c can control the linearity of the power diver 120 and the power amplifier 140 in response to the sensing signal. As discussed below in relation with FIGS. 6A and 6B, the phase control circuit 127c can improve phase uniformity and linearity in the output signal by compensating the relative phase variations between the driver amplifier 120 and the power amplifier 140.

Figure 1D:
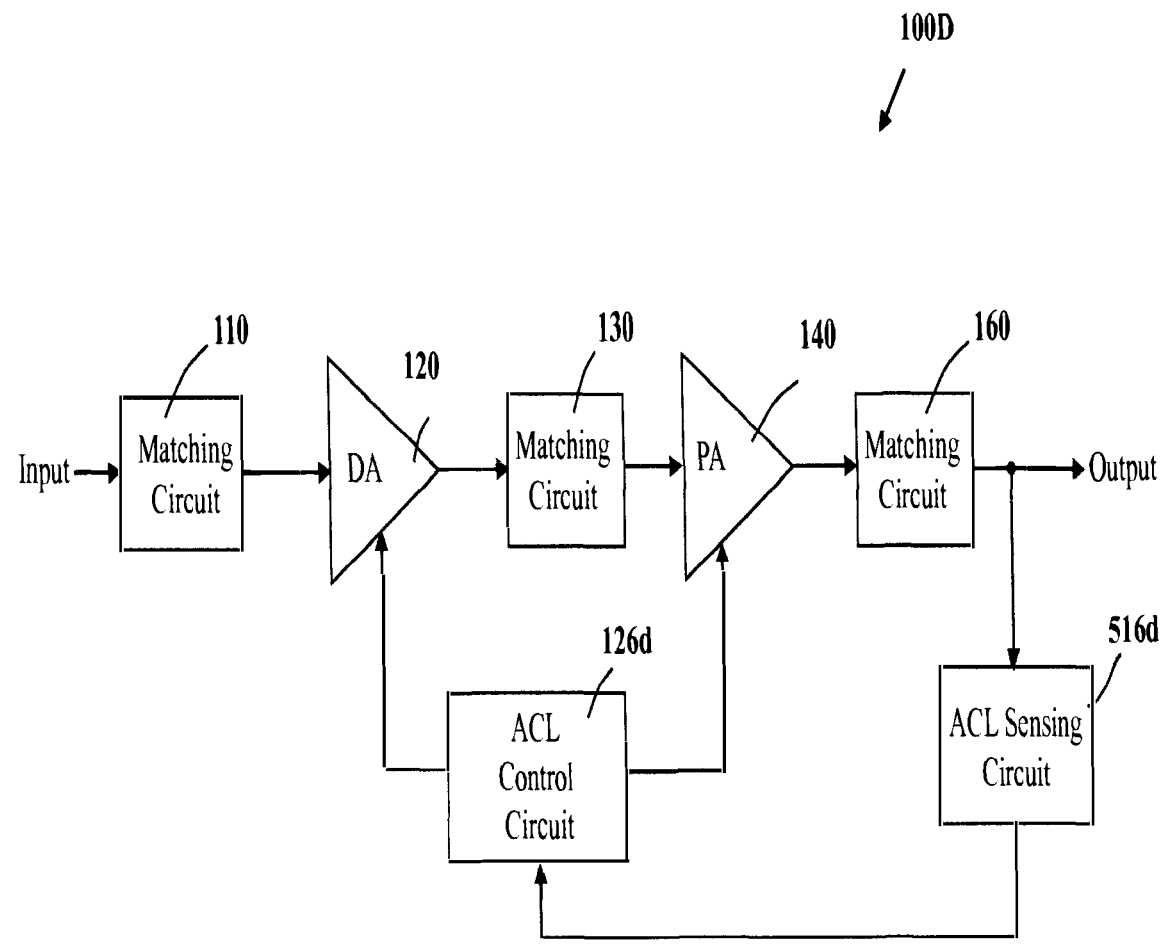
Figure 1E:
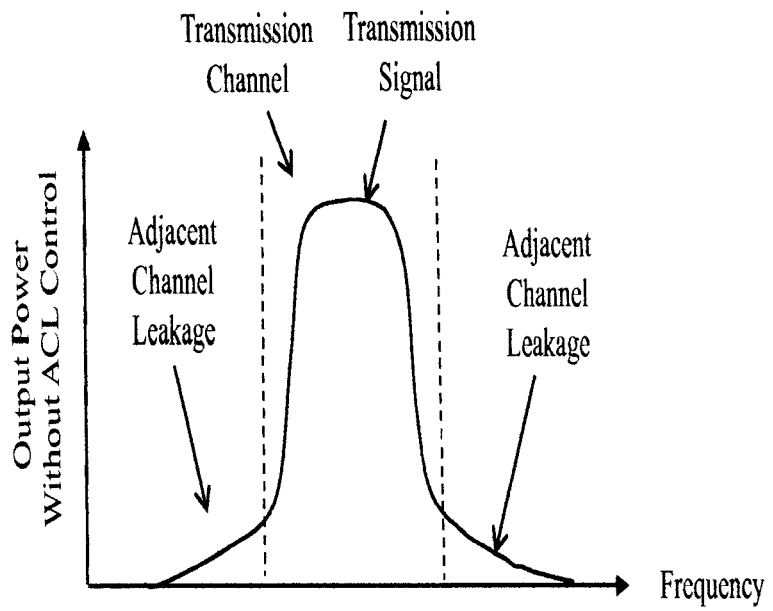
FIG. 1E illustrates the adjacent-channel leakage in an output power spectrum without ACL control.
Figure 1F:
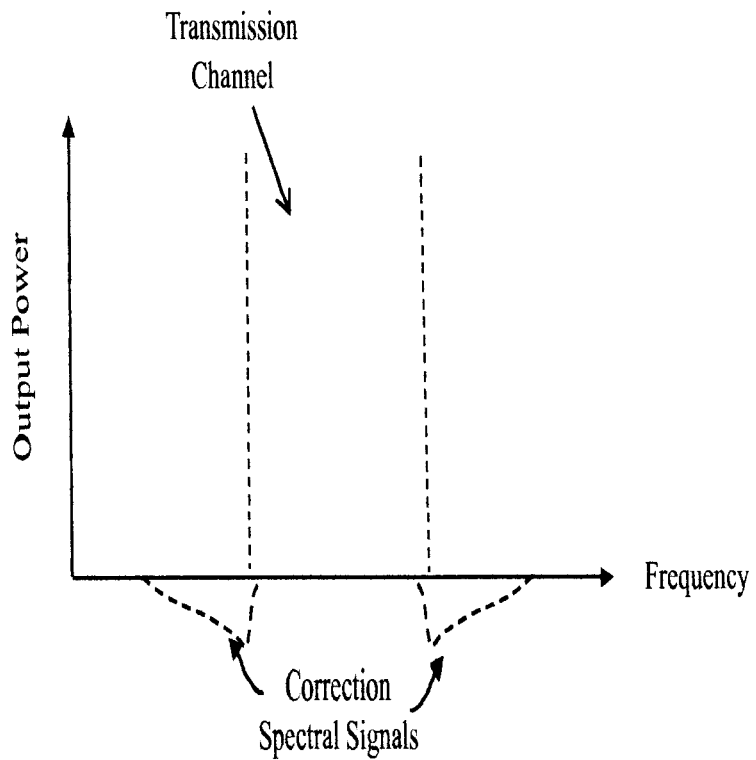
FIG. 1F illustrates correction spectral signals in an output power spectrum in accordance to the present invention.

In some embodiments, referring to FIG. 1D, a power amplifier circuit 100D includes a matching circuit 110, a driver amplifier 120, an ACL control circuit 126d, a power amplifier 140, a matching circuit 160, and a sensing circuit 516. The driver amplifier 120, the matching circuit 130, and the power amplifier 140 together can be called a multi-stage power amplifier. The ACL sensing circuit 516d can detect ACL in the output signal from the matching circuit 160 to produce a sensing signal. Without the ACL control, the output signal from the power amplifier 140, shown in FIG. 1E, includes a transmission signal in a main transmission channel, accompanied by adjacent-channel leakage next to the main transmission channel. The adjacent-channel leakage is caused by non-linear modulations by the power amplifier on the transmission signals (i.e. intermodulation). The adjacent-channel leakage can cause undesirable interferences in wireless communication. The amount of adjacent-channel leakage can be measured by the ratio between the total power of the adjacent-channel leakage to the power of the transmission signals, which is called ACLR (adjacent channel leakage ratio). The ACL control circuit 126d can control the power diver 120 and the power amplifier 140 in response to the sensing signal. As a result, as shown in FIG. 1H, the adjacent-channel leakage is significantly reduced in the output signals over a wide power range with linearity control. The reduction or elimination of non-linear adjacent signals can improve the linearity performance of the output signal.

Figure 1G:
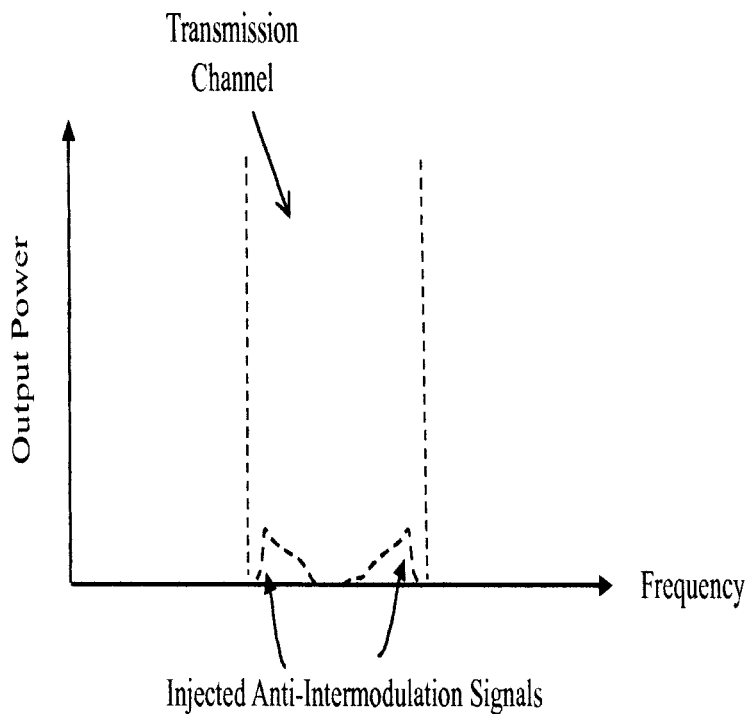
FIG. 1G illustrates injected anti-intermodulation signals within the transmission channel in accordance to the present invention.
Figure 1H:
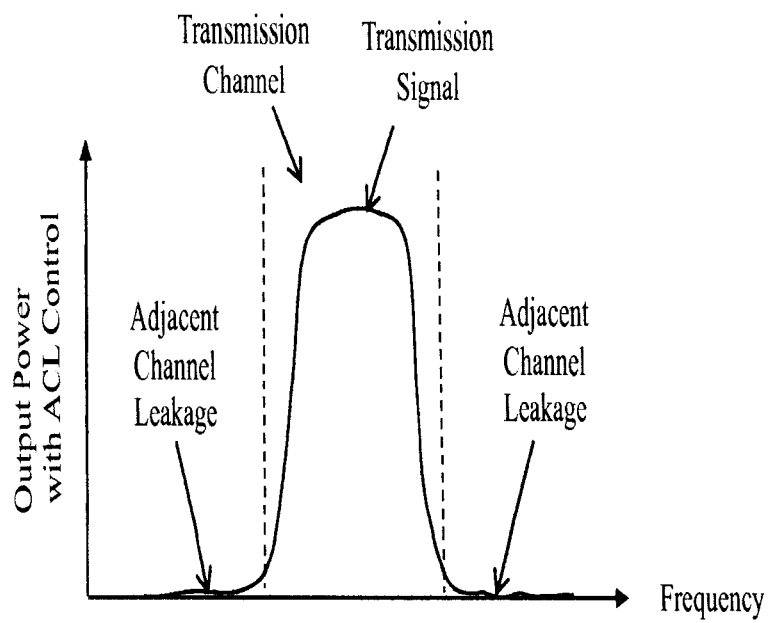
FIG. 1H illustrates reduced adjacent-channel leakage in an output power spectrum with ACL control in accordance to the present invention.
Figure 1I:
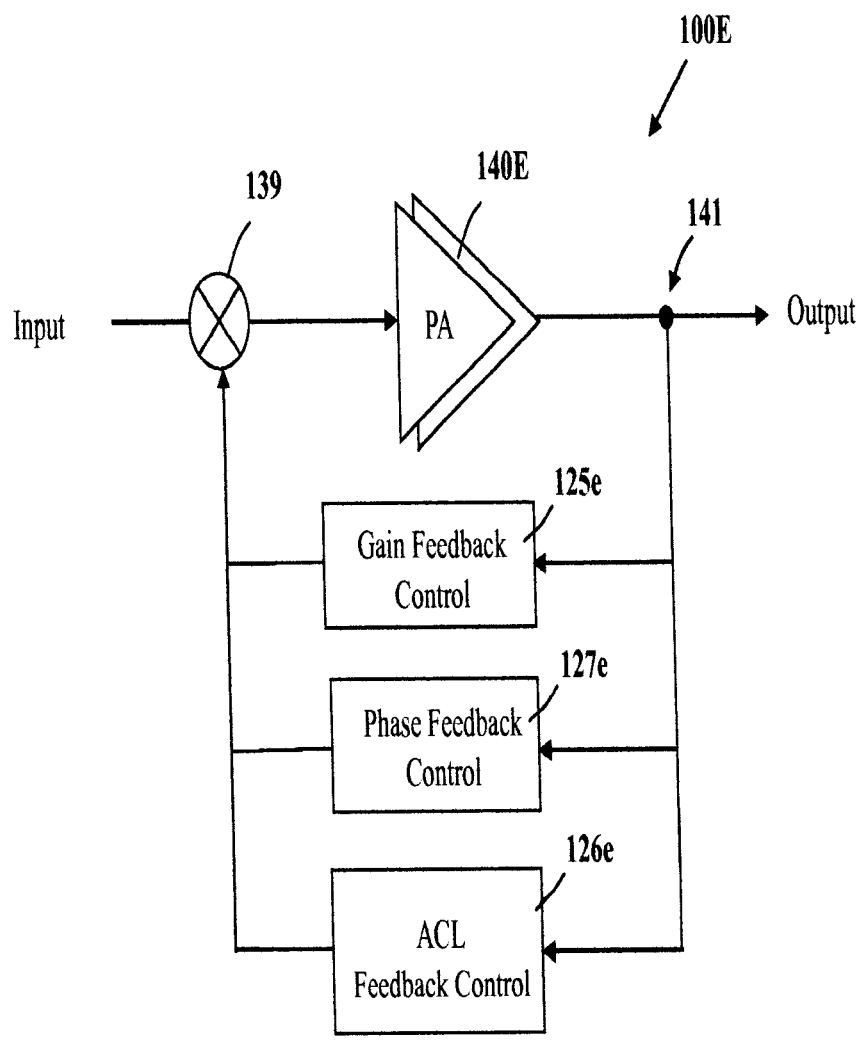
FIG. 1I is a detailed schematic diagram showing feedback controls for a power amplifier compatible with the power amplifier circuits with linearity controls in accordance to the present invention.

In some embodiments, referring to FIG. 1I, a detailed schematic diagram shows a circuit 100E that includes feedback controls for a multistage power amplifier 140E. The multistage power amplifier 140E can include two or more serially connected power amplifiers coupled in between with an inter-stage matching circuit. The circuit 100E is compatible with the power amplifier circuits 100A-100D, 200, and 300 for linearity controls. The circuit 100E can include one or more of a gain feedback control circuit 125e, a phase feedback control circuit 127e, and an ACL feedback control circuit 126e. The gain feedback control circuit 125e can detect the output of the multistage power amplifier 140E at an output 30 node 141, and send a gain feedback signal to an input node 139, which improves the gain linearity of the multistage power amplifier 140E. The phase feedback control circuit 127e can detect the output of the multistage power amplifier 140E at the output node 141, and send a phase feedback signal to the input node 139, which improves the phase linearity of the multistage power amplifier 140E. The ACL feedback control circuit 126e can detect the output of the multistage power amplifier 140E at the output node 141, and send an ACL feedback signal to the input node 139, which reduces adjacent-channel leakage in the output of the multistage power amplifier 140E, as illustrated in FIGS. 1E-1H. The reduction or elimination of non-linear adjacent-channel leakage can improve the linearity performance of the output signal.

In the present invention, the gain feedback control circuits 125, 125b, 125e (225, 325), the phase feedback control circuit 127, 127c, 127e (and 227 and 327), and the ACL control circuit 126d, 126e can be referred to as "linearity control circuits". The linearity control circuits can receive sensing signals produced by a sensing circuit in response to the output signal as feedback. The linearity control circuits can control a power amplifier, a driver amplifier in different amplification stages (and other power amplifiers in parallel) to improve linearity, and reduce variations in gain, phase, and power of the output signals over a wide power range.

Figure 1J:
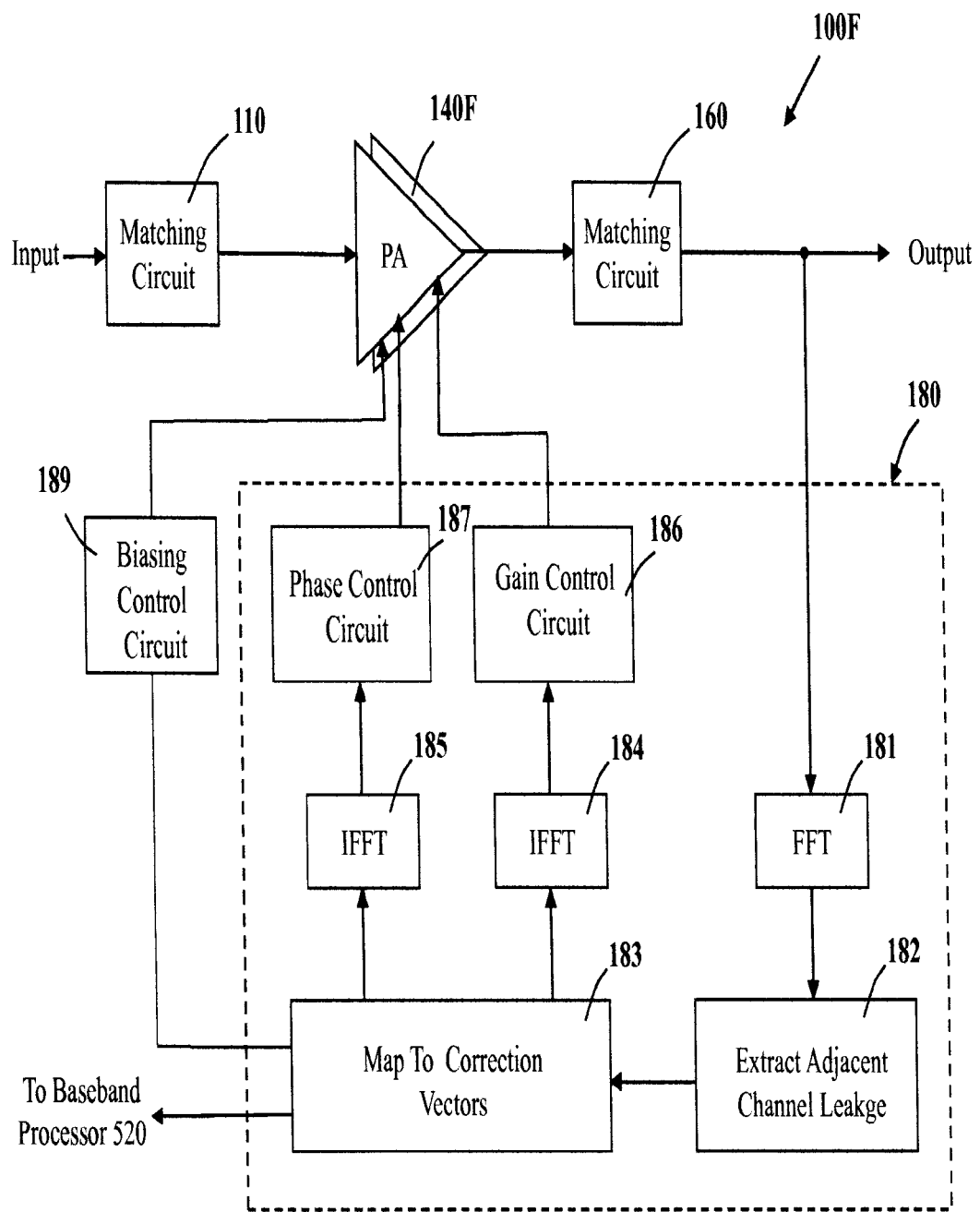
FIG. 1J is a detailed schematic diagram showing feedback controls for a power amplifier compatible with the power amplifier circuits with linearity controls in accordance to the present invention.

Referring to FIG. 1J, a power amplifier circuit 100F includes a matching circuit 110, a multistage power amplifier 140F, a matching circuit 160, and a linearity control circuit 180. The multistage power amplifier 140F can include two or more serially connected power amplifiers coupled in between with an inter-stage matching circuit. The linearity control circuit 180 includes circuits 181-187 configured to reduce adjacent-channel leakage in the output signal over a wide power range using a feedback mechanism.

The circuit 181 is configured to apply fast Fourier transform (FFT) to the output signal and to produce a spectral signal, which includes a transmission signal and undesirable adjacent-channel leakage due to the intermodulation of the transmission signal. The circuit 182 is configured to extract adjacent-channel leakage besides the transmission signal in the FFT signal. The circuit 183 is configured to map the adjacent-channel leakage to produce correction spectral signals for purpose of reducing ACL. The circuit 184 is configured to conduct an inverse fast Fourier transform (IFFT) of the correction spectral signal to produce a gain correction signal. The gain control circuit 186 is configured to produce a gain control signal to correct the adjacent-channel leakage in response the output of the circuit 184. The circuit 185 is also configured to conduct an inverse fast Fourier transform (IFFT) of the correction spectral signal to produce a phase correction signal. The phase control circuit 187 is configured to produce a phase control signal to correct the adjacent-channel leakage in response the output of the circuit. As a result, adjacent-channel leakage (as shown in FIG. 1H) is reduced in the output signal.

In some embodiments, the correction vectors produced by the circuit 183 can be sent to the baseband processor 520 (FIG. 7) to produce correction spectral signal in the input signal, which reduces adjacent-channel leakage. The reduction or elimination of non-linear adjacent signals can improve the linearity performance of the output signal.

In some embodiments, the correction vector produced by the circuit 183 can be sent to a biasing control circuit 189 which can control the biasing of the multistage power amplifier 140F to reduce adjacent-channel leakage. In according to the present invention, ACL can be controlled in different approaches. In some embodiments, the ACL control circuit 126d, the ACL feedback control 126e, and the circuit 183 (in FIGS. 1D-1J) can produce correction spectral signal, as shown in FIG. 1F, to directly cancel out the ACL in the adjacent channels.

In some embodiments, the ACL control circuit 126d, the ACL feedback control 126e, and the circuit 183 (in FIGS.

1D-1J) can inject anti-intermodulation signals (AIS) in the transmission channel, as shown in FIG. 1G. The purpose of AIS is to compensate the undesirable ACL. The intermodulation of the AIS with the transmission signals can produce adjacent-channel signals that are anti-phase to ACL, and thus reducing or eliminating ACL.

In according to the present invention, ACL control can be implemented using feedback from the output signal, as shown in FIGS. 1D, 1I, and 1J. The correction signals can be dynamically computed to produce correction vector and correction signals. In some embodiments, correction signals can be pre-computed and pre-stored. The pre-stored correction signals can be applied to the power amplifiers without using closed-loop feedback from the PA output.

Figure 2:
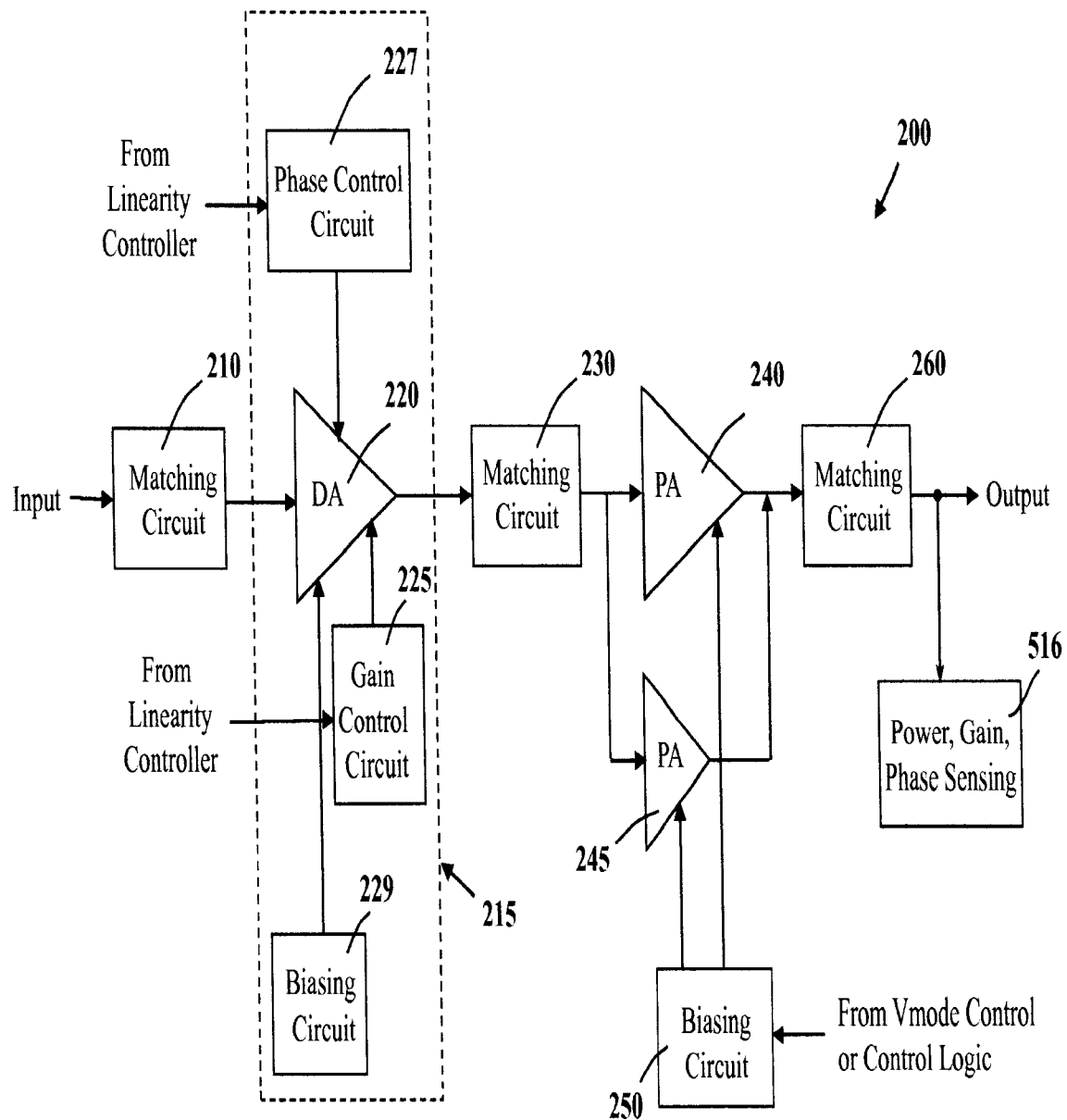
FIG. 2 is a schematic diagram for a linear amplifier circuit in accordance with the present specification.

In some embodiments, referring to FIG. 2, a linear amplifier circuit 200 includes a matching circuit 210 for the input signal and a power driving stage 215 that includes a driver amplifier 220, a gain control circuit 225, and a phase control circuit 227. The gain control circuit 225 and the phase control circuit 227 receive control signals from a linearity controller that can be a base band processor (520 in FIG. 7 below) or a dedicated linearity control circuit. The gain control circuit 225 and the phase control circuit 227 can respectively provide gain and phase controls to the driver amplifier 220. The driver amplifier 220 is controlled by a biasing circuit 229 that can be internal to the driver amplifier 220. The linear amplifier circuit 200 also includes a matching circuit 230 for a first amplified signal from the driver amplifier 220, and a matching circuit 260 for the output signal. As discussed below in relation to FIG. 7 and a wireless communication device 500, a sensing circuit 516 can receive the output signal from the matching circuit 260, which can detect the power, the gain, and the phase of the output signal for linearity control.

The linear amplifier circuit 200 also includes a main power amplifier 240 and an auxiliary power amplifier 245 which can be arranged in a parallel circuit. As discussed below in relation with FIGS. 5A and 5B, the gain control circuit 225 can improve gain linearity by compensating the gain expansion and compression between the driver amplifier 220 and the main power amplifier 240 and the auxiliary power amplifier 245. The phase control circuit 227, as shown in FIGS. 6A and 6B, can correct or compensate for phase variations over a range of the output power.

A biasing circuit 250 can provide bias voltages the main power amplifier 240 and the auxiliary power amplifier 245. The biasing circuit 250 can produce a first bias signal for the main power amplifier 240 and a second bias signal for the auxiliary power amplifier 245. The main power amplifier 240 and the auxiliary power amplifier 245 can thus be activated separately to optimize the performances (power consumption, gain linearity, noise reduction, etc.) of the wireless communication device. The biasing circuit 250 can activate the main power amplifier 240 when the power of the output signal is to exceed a first threshold value. The biasing circuit 250 can deactivate the main power amplifier 240 when the power of the output signal is to be below a first threshold value. The auxiliary power amplifier 245 can be activated by the biasing circuit 250 at least when the power of the output signal is below a second threshold value. Optionally, the auxiliary power amplifier 245 can be activated by the biasing circuit 250 when the power of the output signal is to exceed the second threshold value. The first threshold value can be the substantially the same or below the second threshold value. As described below in more detail in relation to FIG. 7, the biasing circuit 250 can be controlled by a control logic circuit and/or a Vmode control circuit. The controls can be based on the power of the output RF signal as measured by a power sensing circuit. The controls can also be determined by a base band processor 520.

The matching circuit 210 can match the impedance of the input RF signal and send an impedance matched signal to the first-stage driver amplifier 220. The driver amplifier 220 can amplify the signal from the matching circuit 210 and send a first amplified signal to the matching circuit 230. The matching circuit 230 can match the impedance of the first amplified signal and send impedance matched signals to the main power amplifier 240 and the auxiliary power amplifier 245. The main power amplifier 240 and the auxiliary power amplifier 245, as described below, can coordinate the amplification tasks to produce amplified signals to be sent to the matching circuit 260. The matching circuit 260 can match the impedance of the amplified signals from the main power amplifier 240 and the auxiliary power amplifier 245 and produce an output signal. The impedance matching of the input and output signals is preferably based on the 50-ohm standard of the RF industry. Other details of impedance matching circuits are described commonly assigned U.S. patent application Ser. No. 10/041,863, filed on Oct. 22, 2001, titled "Multilayer RF Amplifier Module", by Wang, et al., the content of which is incorporated by reference.

An advantage of the improved and efficient linear amplifier circuit 200 is that the intermediate amplified RF signal from the first-stage driver amplifier 220 is impedance matched by the matching circuit 230 before it is received by the main power amplifier 240 and the auxiliary power amplifier 245. Since the main power amplifier 240 and the auxiliary power amplifier 245 can operate with high current flowing, non-zero impedance can induce can inject unwanted voltage noise during the intermediate amplification steps in the linear amplifier circuit. The impedance matching for the intermediate signals can therefore significantly minimize noise and unwanted signal oscillations.

It should be noted that the main power amplifier 240 or the auxiliary power amplifier 245 can include multiple stages of amplifiers. Moreover, the power amplifier module 200 can include more than one auxiliary power amplifiers 245. For example, the power amplifier module 200 can include two or three auxiliary power amplifiers that are connected in parallel with the main power amplifier. The different auxiliary power amplifiers can be activated at and below different threshold power levels of the output signal. For example, the power of the output signals may include three contiguous ranges that the main power amplifier and two auxiliary power amplifiers are responsible for amplifying from the high power rage to the low power range. In some embodiments, the power amplifier module 200 is fabricated on an integrated circuit module that can be implemented on a single semiconductor chip.

Figure 3:
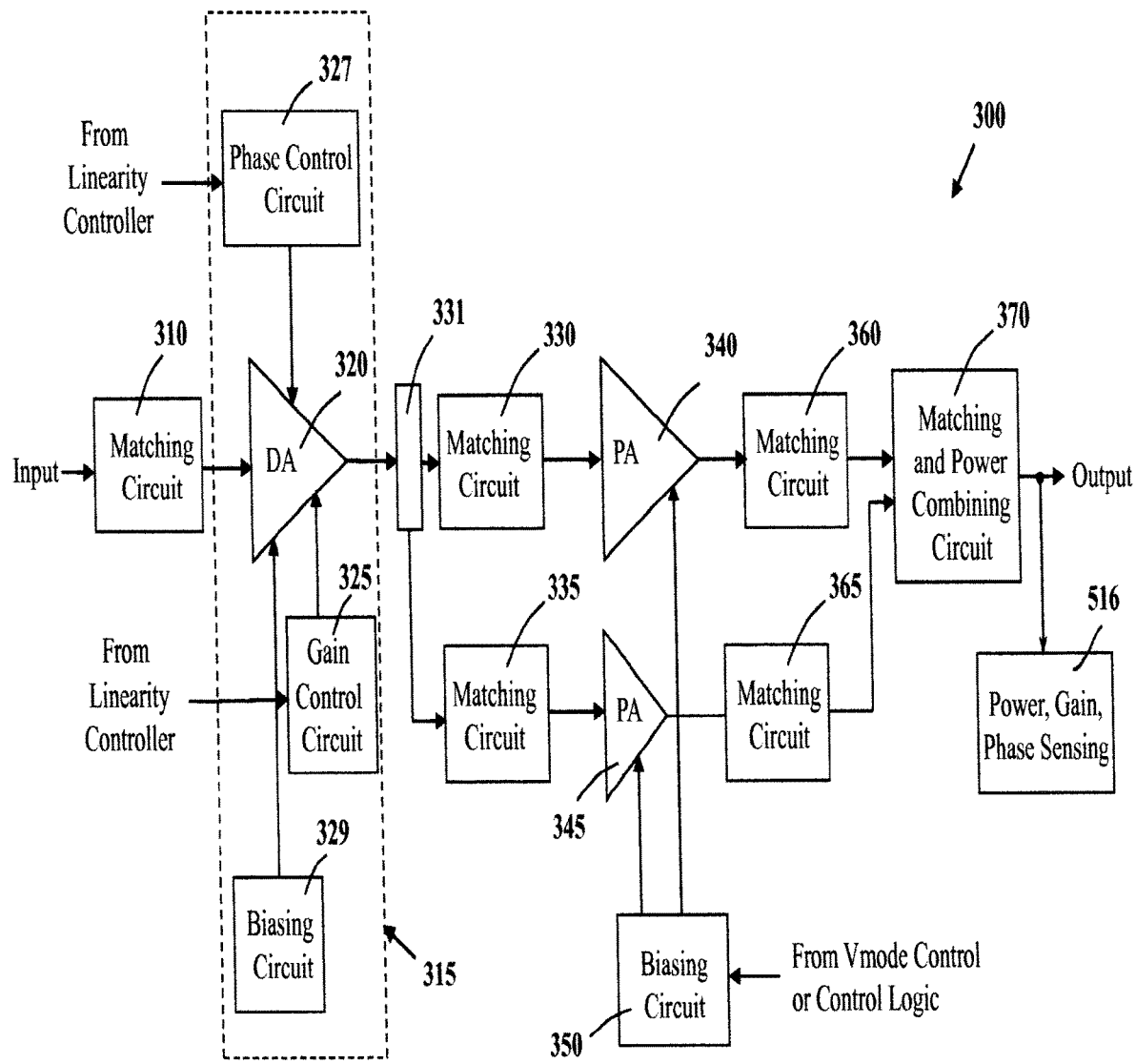
FIG. 3 is a schematic diagram for another linear amplifier circuit in accordance with the present specification.
Figure 4:
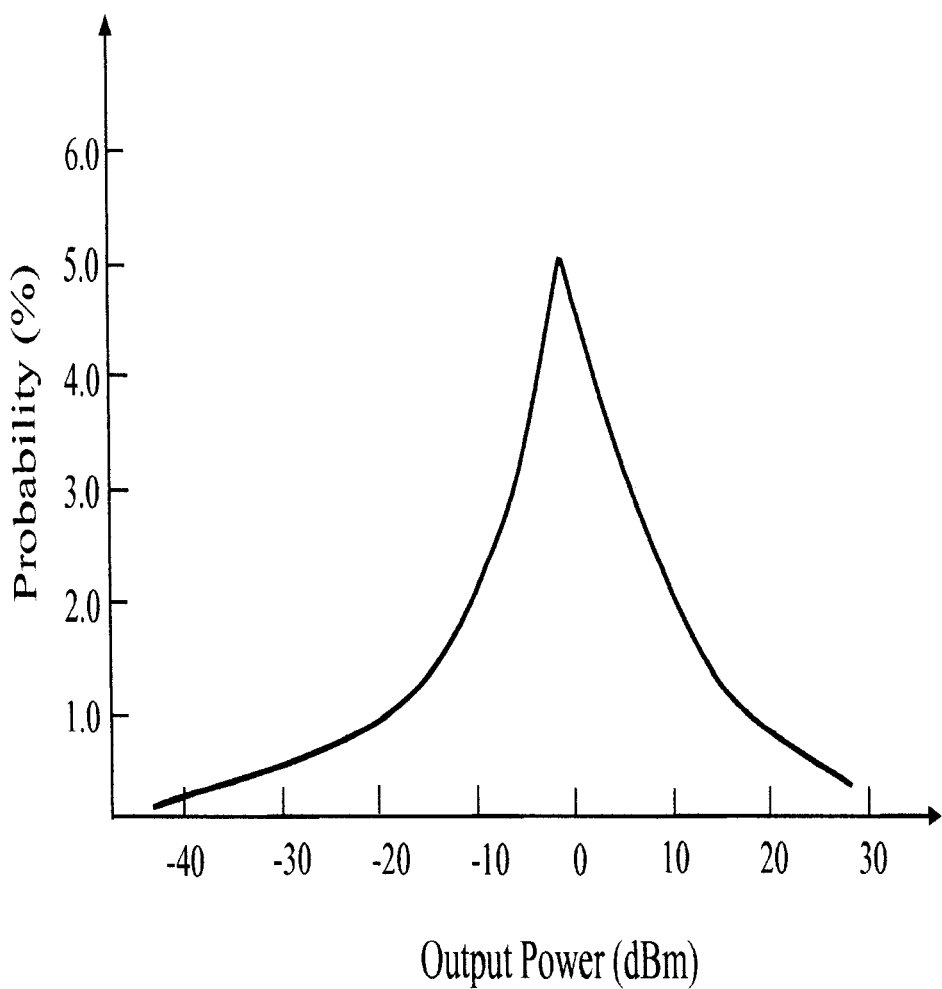
FIG. 4 shows an exemplified probability distribution for output power of a wireless communication protocol in a geographic environment.

In another implementation, an improved and efficient linear amplifier circuit 300, referring to FIG. 3, includes a matching circuit 310 for the input signal and a power driving stage 315 that includes a driver amplifier 320, a gain control circuit 325, and a phase control circuit 327. The gain control circuit 325 and the phase control circuit 327 receive control signals from a linearity controller that can be a base band processor (520 in FIG. 7 below) or a dedicated linearity control circuit. The gain control circuit 325 and the phase control circuit 327 can respectively provide gain and phase controls to the driver amplifier 320. The driver amplifier 320 is biased by a biasing circuit 329 that can be internal in the driver amplifier 320. The linear amplifier circuit 300 also includes a power divider 331, a matching circuit 330 for matching the impedance of a first power divided signal from the power divider 331, and a matching circuit 335 for matching the impedance of a second power divided signal from the power divider 331. The linear amplifier circuit 300 also includes a main power amplifier 340 and an auxiliary power amplifier 345 which can be arranged in a parallel circuit, matching circuits 360, 365 respectively for matching the amplified signals from the main power amplifier 340 and the auxiliary power amplifier 345. The main power amplifier 340 and the auxiliary power amplifier 345, as described below, can coordinate the amplification tasks. The main power amplifier 340 can amplify the output from the matching circuit 330 to produce a first amplified signal. The auxiliary power amplifier 345 can amplify the output from the matching circuit 335 to produce a second amplified signal. The matching circuit 360, 365 can respectively match the impedances of the first amplified signal and the second amplified signal. A matching and power combining circuit 370 can combine the powers and further match the impedances of the output signals from the matching circuits 360, 365. As discussed below in relation to FIG. 7 and a wireless communication device 500, a sensing circuit 516 can receive the output signal from the matching circuit 370, which can detect the power, the gain, and the phase of the output signal for linearity control.

As discussed below in relation with FIGS. 5A and 5B, the gain control circuit 325 can improve gain linearity by compensating the gain expansion and compression between the driver amplifier 320 and the main power amplifier 340 and the auxiliary power amplifier 345. The gain control circuit 325 can correct or compensate for phase variations over a range of the output power. The impedance matching of the input and output signals is preferably based on the 50-ohm standard of the RF industry. Other details of impedance matching circuits are described commonly assigned U.S. patent application Ser. No. 10/041,863, filed on Oct. 22, 2001, titled "Multilayer RF Amplifier Module", by Wang, et al., the content of which is incorporated by reference.

A biasing circuit 350 can provide bias voltages the main power amplifier 340 and the auxiliary power amplifier 345. As described below in more detail in relation to FIG. 7, the biasing circuit 350 can be controlled by a control logic circuit and/or a Vmode control circuit. The controls can be determined by the power of the output RF signal as sensed by a power sensing circuit, or by a base band processor.

An advantage of the improved and efficient linear amplifier circuit 300 is that it includes separate impedance matching for the intermediate signals before and after the main power amplifier 340 and the auxiliary power amplifier 345. A separate matching circuit is provided to match the impedance of the output RF signal. A power divider is provided to properly distribute power to the main power amplifier 340 and the auxiliary power amplifier 345. Since the main power amplifier 340 and the auxiliary power amplifier 345 can operate with high current flowing, non-zero impedance can induce can inject unwanted voltage noise during the intermediate amplification steps in the linear amplifier circuit. The impedance matching for the intermediate signals can therefore significantly minimize noise and unwanted signal oscillations.

It should be noted that the main power amplifier 340 and the auxiliary power amplifier 345 can include multiple stages of amplifiers. Moreover, the power amplifier module 300 can include more than one auxiliary power amplifiers 345. For example, the power amplifier module 300 can include two or three auxiliary power amplifiers that are connected in parallel with the main power amplifier. The different auxiliary power amplifiers can be activated at and below different threshold power levels of the output signal. In some embodiments, the power amplifier module 300 is fabricated on an integrated circuit module that can be implemented on a single semiconductor chip. In some embodiments, the power amplifier module 300 is fabricated on an integrated circuit module that can be implemented on a single semiconductor chip.

In accordance with the present specification, the main power amplifier (e.g. 240 or 340) and the auxiliary power amplifier (e.g. 245 or 345) can be fabricated and controlled in accordance to the probability distribution of the output power in wireless communication devices that incorporates the linear amplifier circuit (e.g. 200 or 300). FIG. 3 illustrates an exemplified probability distribution for output power of a wireless communication protocol in a geographic environment. The probability for output power is peaked at a certain output power value and falls off above and below the peak output power. The exact value of the peak output power and the shape of the fall-off curves depend on the wireless communication protocol as well as the geographic environment such as an urban area or a rural area.

The main power amplifier (e.g. 240 or 340) can be fabricated in large dimensions such that it can handle the amplification of high power output. The auxiliary power amplifier (e.g. 245 or 345) on the other hand can be fabricated in smaller dimensions to allow it to handle the amplification of low power signals. The main power amplifier (e.g. 240 or 340) can be activated by the biasing circuit (e.g. 250 or 350) when the output signal is at high power. The auxiliary power amplifier (e.g. 245 or 345) can be activated by the biasing circuit (e.g. 250 or 350) when the output signal is at low power. The output power, as described above and more in detail below, can be measured by a power sensing circuit. The power sensing signal produced by the power sensing circuit can be directly fed to control the biasing circuit, or to a base band processor that can determine the proper control to biasing circuit based on the calculation of the power level and other quality factors of the output RF signal.

The auxiliary power amplifier (e.g. 245 or 345) generally consumes much less power than the main power amplifier (e.g. 240 or 340). Because the main power amplifier (e.g. 240 or 340) can be turned off when the output power is at low level, the power consumption can be significantly decreased for the wireless communication device. In accordance with the present specification, the main power amplifier (e.g. 240 or 340) and the auxiliary power amplifier (e.g. 245 or 345) can be fabricated to optimize power management performance specific to the geographic environment. For example, if a wireless communication device such as a cellular phone is to be used in the Asian market, the functionalities of the main power amplifier (e.g. 240 or 340) and the auxiliary power amplifier (e.g. 245 or 345) can be tailored to the specific probability distribution for output power in the Asian market. For example, if a geographic market includes higher density of wireless transmission base stations which requires of lower output power, the main power amplifier can be tailored to smaller dimensions. The geographic markets can also include suburban versus urban applications. For example, the main power amplifier and the auxiliary power amplifier can be fabricated with a size ratio in a range between 1:1 and 100:1, such as approximately 7:1, which can cover power ranges differing by about 5 dB.

In some embodiments, the disclosed linear power amplifying circuits 100A-100E, 200, and 300 can improve gain linearity using gain compensation. Referring to FIGS. 1-3 and 5A, the driver amplifier 120, 220, or 320 can perform gain expansion. The power amplifier 140, or the main power amplifier 240 or 340 and the auxiliary power amplifier 245 (or 345) can perform gain compression. The combined effects of the gain expansion and gain compression allow the linear amplifier circuit 100A-100E, 200, or 300 to achieve gain linearity over a wide range of output power. Alternately, referring to FIGS. 1-3 and 5B, the driver amplifier 120, 220 or 320 can perform gain compression. The power amplifier 140, or the main power amplifier 240 or 340 and the auxiliary power amplifier 245 or 345 can perform gain expansion. The combined effects of the gain expansion and gain compression allow the linear amplifier circuit 100A-100E, 200 or 300 to achieve gain linearity over a wide range of output power.

In some embodiments, the disclosed linear power amplifying circuit 100A-100E, 200, and 300 can improve gain linearity using phase compensation or correction. Referring to FIGS. 1-3 and 6A, the phase of the amplified signal of the power amplifying circuit 100A-100E, 200, and 300 can vary over a range of the output power. Specifically the phase is shown to decrease with an increase in the output power. The phase control circuits 127, 127c, 127e, 227, and 327 can produce phase-compensation signals that increase with the output power. The phase-compensation signals are respectively sent to the driver amplifier 120, 220, or 320 to compensate the phase variations. Similarly, referring to FIG. 6B, the phase of the amplified signal of the power amplifying circuit 100A-100E, 200, and 300 can increase with an increase in the output power. The phase control circuits 127, 127c, 127e, 227, and 327 can produce phase compensation signals that decrease with the output power. The phase compensation signals are respectively sent to the driver amplifier 120, 220, or 320 to compensate the phase variations.

In some embodiments, the phase of the amplified signal from the power amplifying circuits 100A-100E, 200, and 300 can both increase and decrease as a function of the output power. Phase compensation can be generated to dynamically compensate over each segment of the output power. The phase compensation can be dependent on the magnitude, the polarity, and the rate of change in the phase variations.

The power amplifier 140, or the main power amplifier 240 or 340 and the auxiliary power amplifier 245 (or 345) can perform gain compression. The combined effects of the gain expansion and gain compression allow the linear amplifier circuit 100A-100E, 200, or 300 to achieve gain linearity over a wide range of output power. Alternately, referring to FIGS. 1-3, and 5B, the driver amplifier 120, 220 or 320 can perform gain compression. The power amplifier 140, or the main power amplifier 240 or 340 and the auxiliary power amplifier 245 or 345 can perform gain expansion. The combined effects of the gain expansion and gain compression allow the linear amplifier circuit 100A-100E, 200 or 300 to achieve gain linearity over a wide range of output power.

Figure 7:
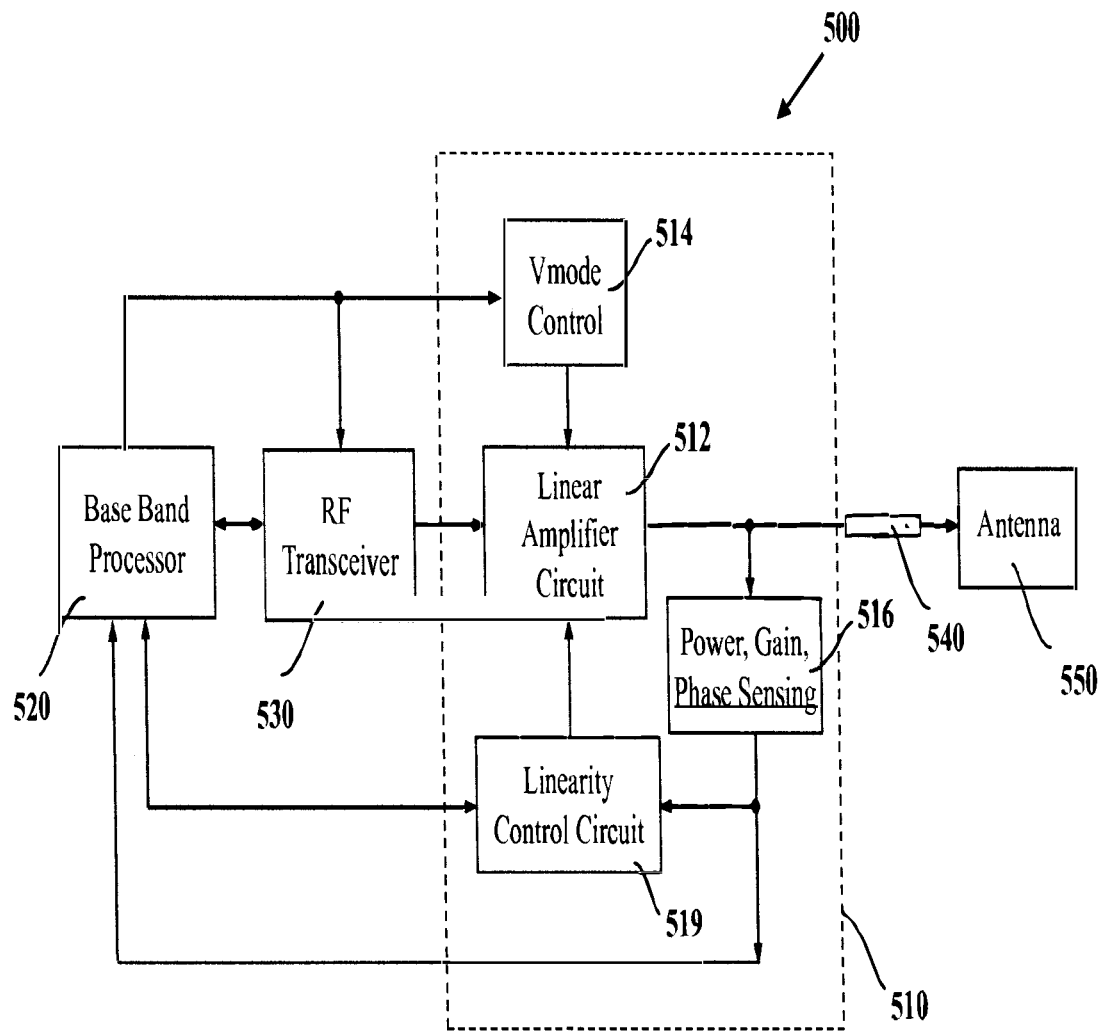
FIG. 7 illustrates an exemplified implementation of the efficient linear amplifier circuit in a wireless communication device in accordance with the present specification.

FIG. 7 illustrates an exemplary application of a linear amplifier circuit 512 in a wireless communication device 500. The wireless communication device 500 can for example be a PDA, a WLAN adaptor, or a cellular phone. The linear amplifier circuit 512 can be implemented by the linear amplifier circuit 200 or 300 as previously described. The wireless communication device 500 can include a base band processor core 520, an RF transceivers 530, a power amplifier module 510, and a 50-ohm impedance transmission line or micro strip 540 and an antenna 550. The power amplifier module 510 can include the linear amplifier circuit 512, a Vmode control circuit 514, a sensing circuit 516 for detecting the power, the gain, and the phase of the output signal, and a linearity control circuit 519. The power amplifier module 510 can therefore amplify input RF signals by via close-loop control. In some embodiments, the power amplifier module 510 is fabricated on an integrated circuit module that can be implemented on a single semiconductor chip. The base band processor 520 can generates digitally modulated signals. The frequency is up-converted by the RF transceiver 530 to a RF signal suitable for transmission. The RF signal is amplified by the PA module 510 that produces amplified RF signal for transmission by the antenna 550. The linearity amplifier circuit 512 can be controlled by the linearity control circuit 519 to improve gain and phase linearity and to reduce adjacent-channel leakage.

In some embodiments, the linear amplifier circuit 512 can be controlled by an open loop by the base band processor 520 via Vmode control circuit 514. The Vmode control circuit 514 can produce a Vmode control signal to control and internal settings of the biasing circuits (e.g. 250 or 350) under the control of the base band processor 520. The base band processor 520 has the knowledge of the digital signal modulation type and the linear output requirement. For example, when the device is transmitting at high power, the Vmode control signal can control the biasing circuit to activate the main power amplifier. When the device is transmitting at low power, the Vmode control signal can control the biasing circuit to activate the auxiliary power amplifier. As a result, power consumption and output distortion can be minimized.

To provide excellent output linearity, a power amplifier must maintain a constant gain (which is defined as the ratio of the output signal power level to the input signal power level) over a wide output range. However, the power amplifier can be driven close to saturation at high output power level, which makes it difficult to maintain a constant gain. The quality of digital communication, especially the quality degrades at high output power level, can commonly be measured by Error Vector Magnitude (EVM), Bit Error Rate (BER), Packet Error Rate (PER), and ACLR.

In some embodiments, the linear amplifier circuit 512 can be controlled by a close loop by the power sensing circuit 516. The output linearity can be improved by a feedback control based on the sensing of the output power level. The power sensing circuit 516 can measure the power of the output RF signal and send a power sensing signal to the base band processor 520. The base band processor 520 can set the power level of the input signal to the RF transceiver 530 in accordance to the power sensing signal, wherein the dynamically adjusted input signal is in turn input to the PA module 510. The linearity control circuit 519 can process the power-sensing signal from the power sensing circuit 516 and compute a quality or a magnitude of the output signal. The linear amplifier circuit 512 is then controlled in response to the quality, or the magnitude, or a combination thereof, of the output signal.

The linearity control circuit 519 can receive and process the power-sensing control signal, and output a processed power-sensing control signal to control the linear amplifier circuit 512. The processed power-sensing control signal can be a function of the quality and/or the magnitude of the amplified radio frequency signals from the linear amplifier circuit 512. The linearity control circuit 519 can improve output linearity of the linear amplifier circuit 512 by adjusting the bias of the biasing circuits (e.g. 250 or 350) in accordance to the actual output power measured by the power sensing circuit 516. It can reduce gain saturation and maintain a more constant gain, which can improve the output linearity over a wide power range. Furthermore, the quality of digital communication can also be improved by an external controller that can adjust the amplitude of the input RF signal based the known relationship between digital communication quality and output power level.

In some embodiments, as mentioned in the discussion above in relation to FIG. 1J, the base band processor can receive a correction vector signal from the linear amplifier circuit 512. The base band processor 520 can digitally process the input signal in response to the correction vector signal to ultimately reduce adjacent-channel leakage in the output amplified signal. Similarly, the base band processor 520 can digitally process the input signal using input from the linearity control circuit 519 to improve reduce gain and phase variations in the output signals.

The PA module 510 can be implemented as an integrated circuit on a common semiconductor substrate which can be a multiplayer printed circuit board, lead frame, lower-temperature co-fired ceramics (LTCC), or other suitable electronic materials. The substrate includes metal pins adapted to receive connecting terminals of integrated circuits including the first stage power amplifier, the main and the auxiliary power amplifiers, the biasing circuit, power sensing circuit, Vmode control circuit, and optional control logic circuit. The amplifier IC chip can include electrically conductive layers and patches for proper grounding and cooling of the PA module 510.

The PA module provides a unitary or common component which may be conveniently assembled in a RF transmission device, with correspondingly simplified assembly, compact 3D size, and enhanced RF amplification performance. In accordance with the present invention, the term "module" refers to such a unitary device for wireless communications, comprising integrated power amplifiers and other circuitry and auxiliary electronic components. The disclosed PA module can be applied to a wide range wireless communication devices such as cellular phone, mobile computers, and handheld wireless digital devices. The PA module has a miniature size of a few millimeters.

It is understood the disclosed linear amplifier circuits can be compatible with other variations without deviating from the spirit of the present application. For example, each power amplifier in the linear amplifier circuit can include more than three or more power amplifiers having different gain factors for amplifying RF signals in different output power ranges. Three or more power amplifiers can be arranged in a parallel circuit after a first-stage power amplifier. The linear amplifier circuit can include one, or two, or more stages of power amplification. The gain and phase response curves and the output power ranges shown in disclosed figures are meant to be illustration purposes. The disclosed systems and methods are suitable to other gain and phase response characteristics in different power ranges. The disclosed linear amplifier circuits are suitable to applications in various wireless data and voice communications standards and protocols, including Orthogonal Frequency-Division Multiplexing (OFDM), Orthogonal Frequency-Division Multiplexing Access (OFDMA), Code Division Multiple Access (CDMA), Wideband Code Division Multiple Access (WCDMA), High-Speed Downlink Packet Access (HSDPA), High-Speed Packet Access (HSPA), Ultra Mobile Broadband (UMB), Long Term Evolution (LTE), WiMax, WiBro, WiFi, WLAN, 802.16, and others. The disclosed linear amplifier circuits are also suitable for high frequency operations by utilizing Gallium Arsenide Heterojunction Bipolar Transistors (GaAs HBT).

Figure 8:
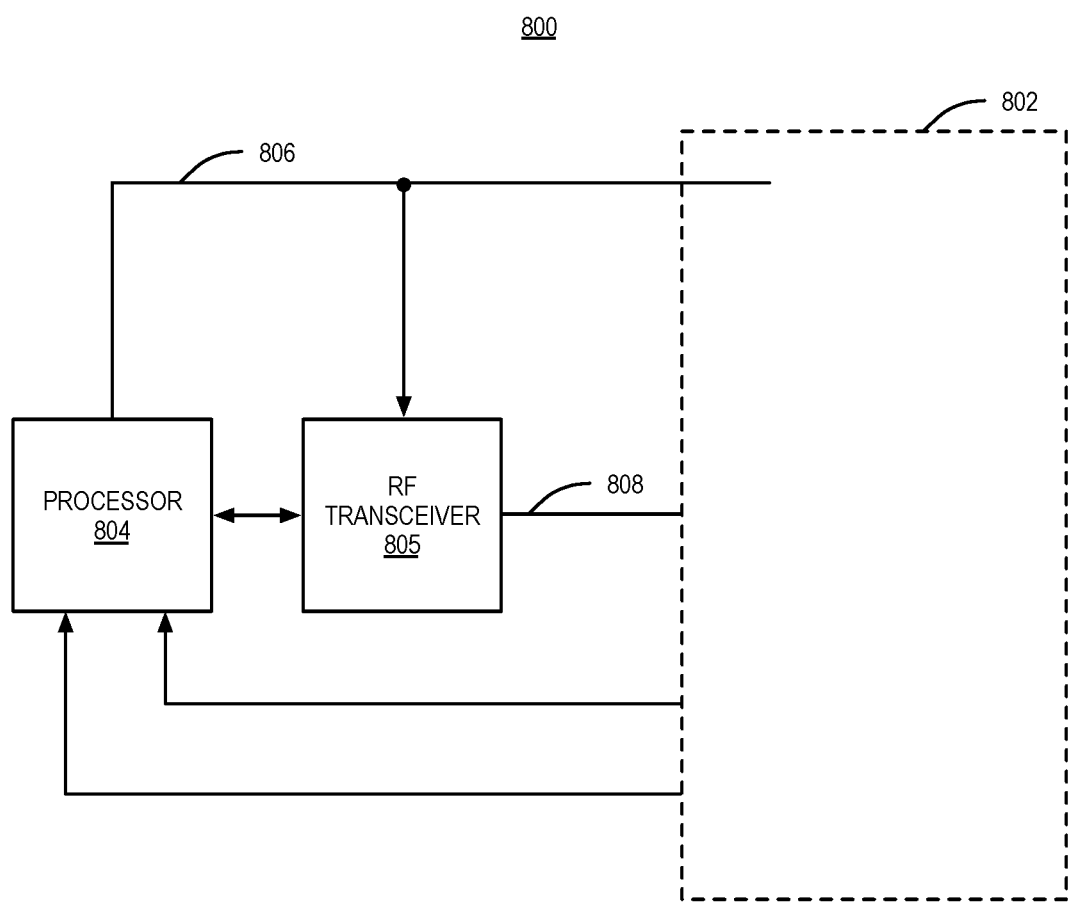
FIG. 8 illustrates another implementation of an amplifier circuit in a wireless communication device.

FIG. 8 illustrates an exemplary application of a RF system and method 802 in a wireless communication device 800. The wireless communication device 800 can for example be a PDA, a WLAN adaptor, wireless tablet, wireless phablet, cellular phone or some other wireless device. The wireless communication device 800 can support 3rd generation (3G), 4th generation (4G), fifth generation (5G), 802.11 ac/ad, and other wireless communication standards. The wireless communication device 800 can include a processor 804 and RF transceivers (or transmit module) 805.

As described in connection with FIGS. 9-18e and similar to the power amplifier circuits described above in this disclosure, the radio frequency system and method 802 may contain (or utilize) power amplifiers, gain controllers, phase shifters, input/output controllers, antennas and additional circuitry and components. The radio frequency system 802 is shown in a variety of different configurations in FIGS. 9-18e with the functionality divided up over several single chip circuits and/or among several different packages. The thick, bolded lines in FIGS. 9-18C indicate that the elements inside are all located in a single chip circuit. The single chip circuit can be implemented on a single semiconductor chip (e.g., GaAs, GaN, CMOS, SiGe, InP, . . . ). In addition, multiple single chip circuits may be encased in a housing (such as plastic, ceramic, metal shield, or similar package). Using the single chip circuit(s) simplifies assembly, reduces size, and allows for high speed RF performance demanded by fixed and mobile wireless standards (such as 4.5G, 5G, 802.11ad, . . . ). As the need for higher bandwith and higher speed increases the RF complexity and the cost, the single chip circuit allows RF engineers to overcome these difficulties by combining amplifiers, phase shifters, gain control, antenna and other RF front end elements in a single transmit or receive unit. The size of the single chip circuit may vary depending on the frequency and the needs of RF engineer (e.g. how many antennas, how many amplifiers, . . . ). The size of the single chip circuits described herein could be in the range of (and including) 16 square millimeters (mm$^2$) to 36 mm$^2$ (e.g., 16 mm$^2$, 25 mm$^2$, 36 mm$^2$) with multiple inputs and outputs.

Processor 804 uses control signals 806 connected to a bus 807 in the RF system 802 to control its operations. The RF system 802 can amplify and/or phase shift the input RF signals 808. The frequency of RF input signals 808 can be in microwave or millimeter wave range. For example, the RF input signals may be lower than 6 GHz (e.g., 2.5 GHz, 3.5 GHz, 5.1 GHz, 5.8 GHz, . . . ) and/or higher than 6 GHz such as 14 GHz, 17 GHz, 28 GHz, 37 GHz, 38 GHz, 39 GHz, 60 GHz, or 70 GHz and others. The RF input signal 808 may be, but is not limited to, the following communication standards and protocols: Discrete Fourier Transform (DTF)-Spread-OFDM, OFDM, OFDMA, Generalized Frequency Division Multiplexing (GFDM), Unique Word (UW)-OFDM, Cyclical Prefix (CP)-OFDM or single carrier OFDMA (SC-OFDMA), Code Division Multiple Access (CDMA), Wideband Code Division Multiple Access (WCDMA), High-Speed Downlink Packet Access (HSDPA), High-Speed Packet Access (HSPA), Ultra Mobile Broadband (UMB), Long Term Evolution (LTE), WiMax, WiBro, WiFi, WLAN, 802.16, and others. The single chip circuits of the disclosed RF systems and methods can be realized/made using Gallium Arsenide Heterojunction Bipolar Transistors (GaAs HBT), Gallium Nitride (GaN), Indium Phosphide (InP), Complementary Metal-Oxide-Semiconductor (CMOS), Silicon Germanium (SiGe), and other semiconductor material.

The processor 804 generates digitally modulated signals. The frequency is up-converted by the RF transceiver(s) 805 to a RF signal suitable for transmission. The processor 804 (e.g., central processing unit (CPU), baseband, Application Specific Integrated Circuit (ASIC)) is coupled serially or in parallel to an input/output controller or a plurality of I/O controllers in RF system 802 through the bus 807 (shown in FIGS. 9-17). Processor 804 provides control for the RF front end of the wireless device 800 such as phase adjustment of signal information, gain adjustment, on/off, duty cycle. The plurality of I/O controllers in system 802 receive information from the processor 804 and performs functions such as turning on the phase shifter, how much signal will be shifted, what to with gain, programming, adjusting. The single chip circuits in RF system 802 may also each have their own I/O controllers which function to provide voltage to the PA amplifiers in system 802.

Figure 9:
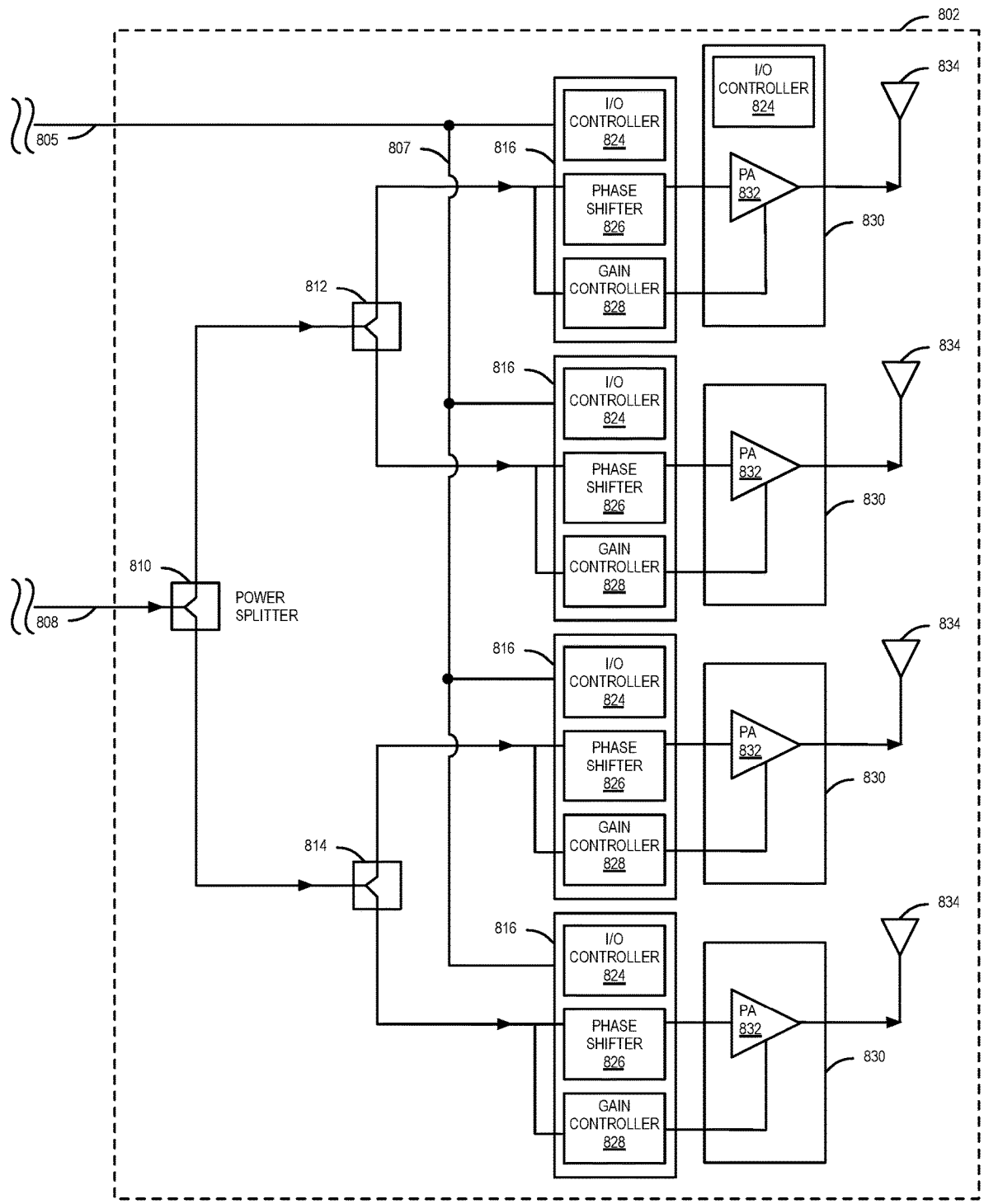
FIG. 9 discloses a four power amplifier embodiment of power amplifier circuit system 802.

FIG. 9 discloses a four power amplifier embodiment of RF system 802. (Note: in the discussion of FIGS. 10-18*e* below like referenced elements will perform the same function as those described in relation to FIG. 9). A first power splitter 810 divides an input RF signal into two middle RF signals which are then divided by second and third power splitters 812, 814 to create a plurality of signals (e.g., four signals). Each of these RF signals is fed into a plurality of single chip circuits 816 each made up of an input/output (I/O) controller 824, phase shifter 826, and gain controller 828. The processor 804 sends signals to I/O controllers 824 to control phase shifters 826 and gain controllers 828. The I/O controllers can be programmable for phase/gain control. Phase shifters 826 and gain controllers 828 may be used to change the phase and amplitude of the RF signal. This would increase the aperture size and/or directivity/direction of combined RF wave transmitting from the antennas 834. These phase shifters 826 can be arranged in an array. Single chip circuits 816 can be manufactured in semiconductors such as GaAs, GaN, InP, CMOS, and others.

In radio communication, phase shifters 826 may be used for electronic beam steering of transmitted RF waves. Phase shifter 826 shifts the phase of the signal passing through it by certain desired degrees. Gain controllers 828 control the amplitude of the signal passing through it. The single chip circuits 816 are each connected to other single chip circuits 830 each containing a power amplifier 832. The RF power amplifiers 832 can be made out of GaAs, GaN, InP, CMOS, SiGe and other semiconductor technologies. The power amplifiers 832 amplify phase and gain controlled RF input signals to have the signal power suitable for respective application needs and sends them to antennas 834. Antennas 834 can be an array of antennas. They can be printed on the printed circuit board (PCB), the antennas can be on-chip and/or on-package antennas based on thin-film, LTC, silicon-base. The antennas 834 are at the end stage of the RF transmission chain and they radiate the RF signal for transmission.

In high frequency radio applications (such as millimeter wave or 2.3-2.7 GHz, 3.3-3.8 GHz, or 5.0-6.0 GHz), there is a need to control the direction of signal radiation. This direction controlled signal radiation is called beam steering. Beam steering is needed to improve the signal reception in a particular direction. Beam steering can be done using two techniques namely mechanical method and digital method. In mechanical method, the radiating antenna is turned physically to a particular direction, to focus the signal radiation towards that direction. In a digital method as used herein, phase shifters are utilized along with an array antenna setup to focus the signal radiation in a particular direction without the need to turn the antenna physically. The digital beam steering method depends on the constructive and destructive interaction of signals radiated from each antenna in the array antenna setup. The signal interaction depends on the phase of the radiated signal which is being controlled by the phase shifter in the transmitter. FIG. 9 shows that there are 4 antennas which are radiating signals generated by a signal generator. The main beam of the radiated signal may be steered towards a particular direction based on the phase of each signal being radiated from the array antenna system of antennas 834. The main blocks in the transmission chain which steers the transmitted beam are the phase shifter 826 and the gain controller 828. The phase shifter circuits introduce a certain amount of time delay (or phase at a certain frequency) in the signal passing through it. The amplitude of the radiated signal in each lobe is being controlled by the gain controller. The radiated waves interact with each other either destructively or constructively. The phase and the amplitude relation between the transmitted signals can be adjusted to reduce the radiation in all unwanted direction by destructive interaction and can have high signal radiation in a particular direction by constructive interaction. This will result in the main beam radiated from the array antenna setup being directed towards a particular angle, with respect to the radiating antennas position. The amount of angle by which the main beam is being steered depends on the amount of delay or phase being introduced between the different signals emitted from each antenna 834.

Figure 10:
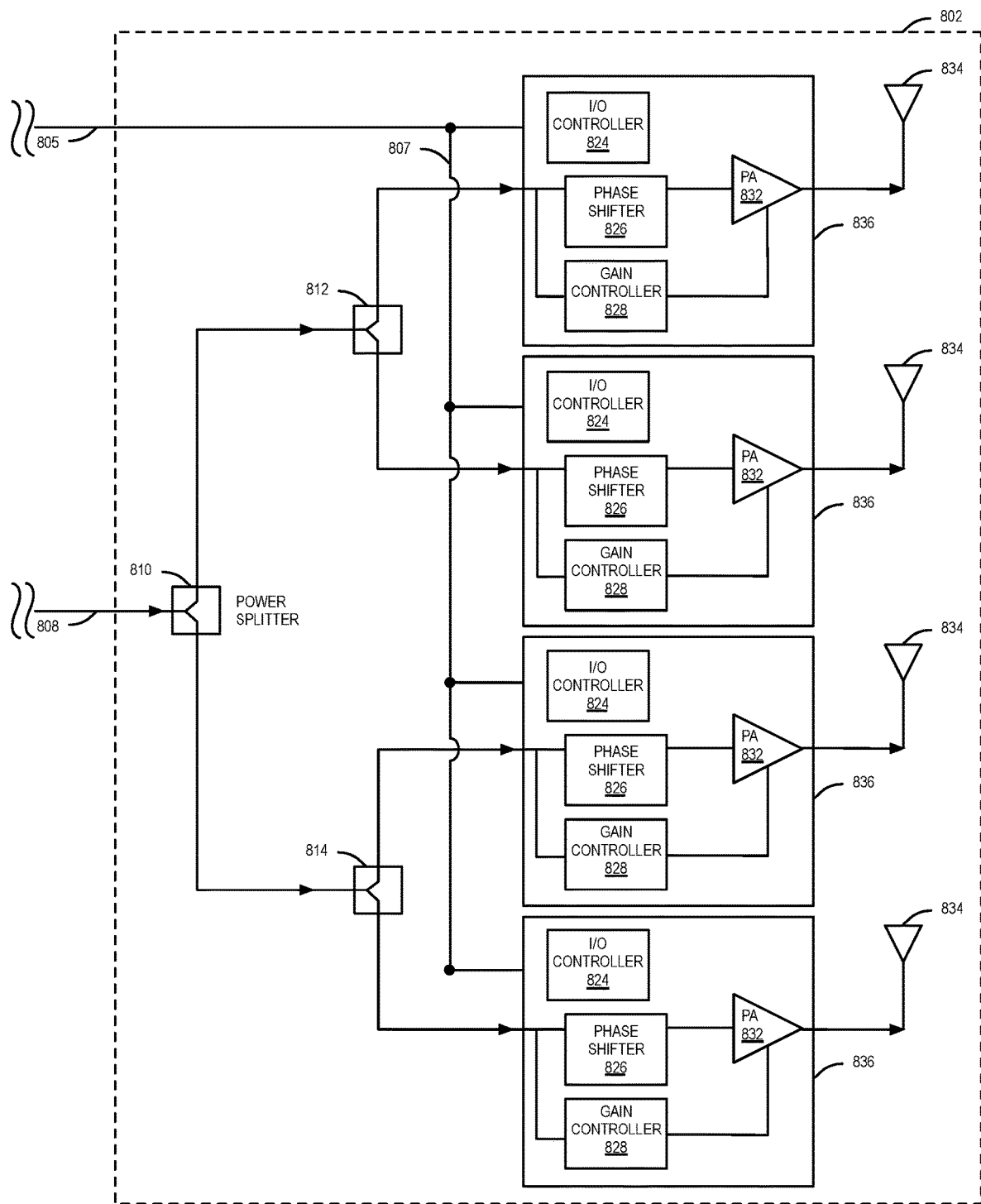
FIG. 10 discloses an alternative embodiment of the power amplifier circuit system 802.

FIG. 10 discloses an alternative embodiment of the power amplifier circuit system 802. In this embodiment, each of the power amplifiers 832 are integrated into a single chip circuit 836 which also includes the I/O controller 824, phase shifter 826, and gain controller 828.

Figure 11:
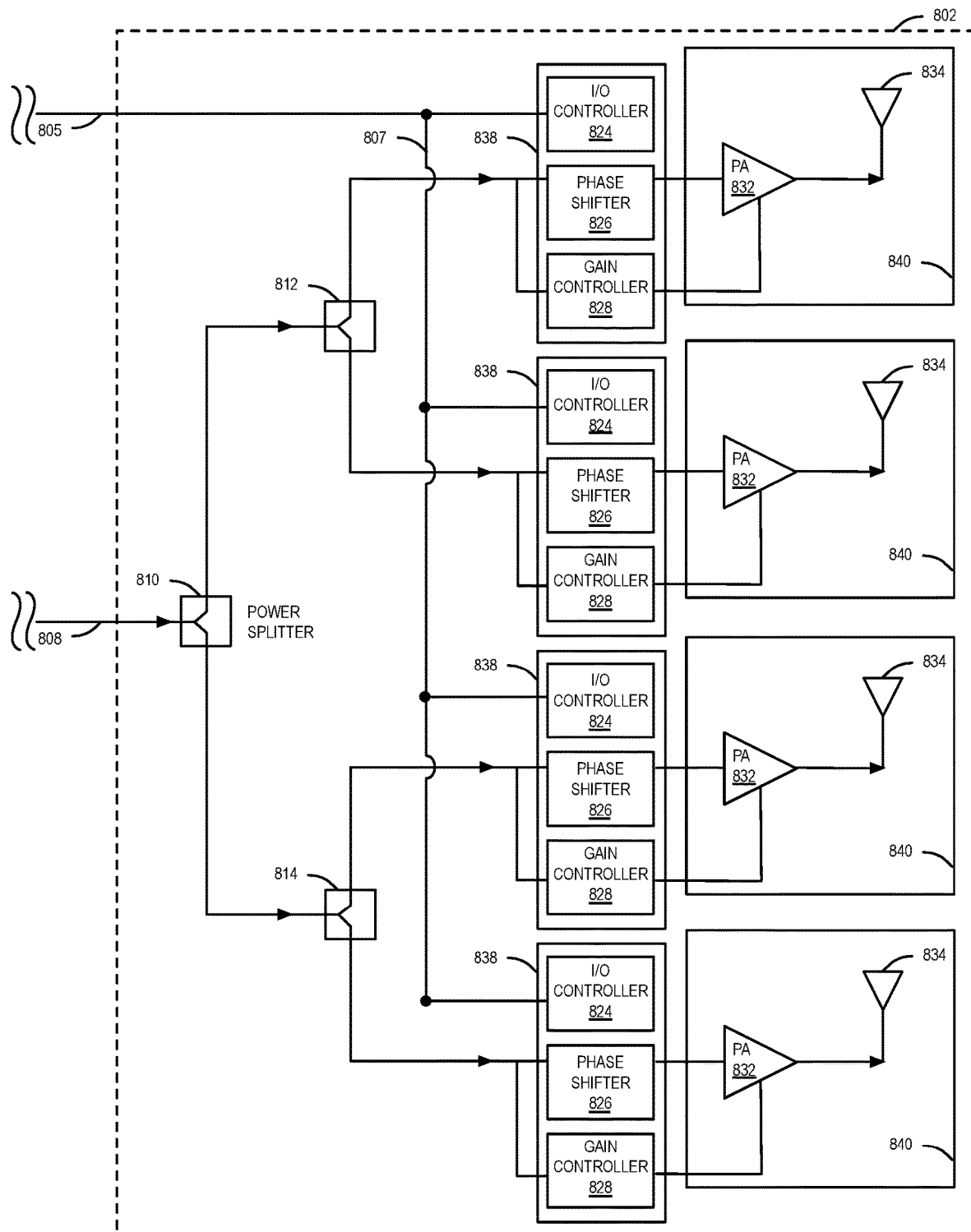
FIG. 11 discloses an embodiment of the RF system and method 802 wherein single chip circuits 838 each have an I/O controller 824, phase shifter 826, and gain controller 828 which work with separate single chip circuits 840 each of which contain a power amplifier 832 and antenna 834.

FIG. 11 discloses an embodiment of the power amplifier circuit system 802 wherein single chip circuits 838 each have an I/O controller 824, phase shifter 826, and gain controller 828 which work with separate single chip circuits 840 each of which contain a power amplifier 832 and antenna 834.

Figure 12:
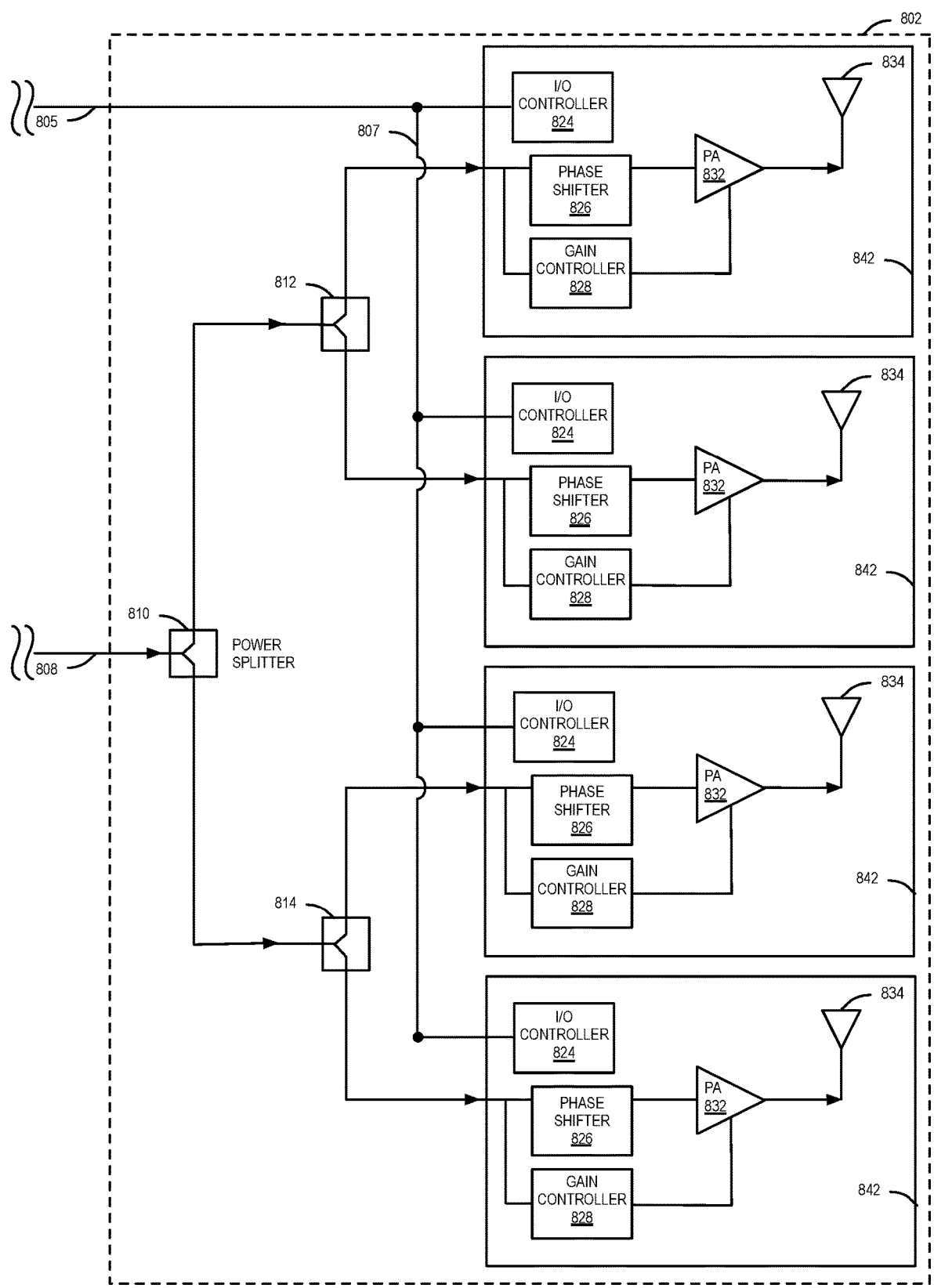
FIG. 12 discloses an embodiment of the RF system and method 802 wherein single chip circuits 842 each contain an I/O controller 824, phase shifter 826, gain controller 828, power amplifier 832 and antenna 834.

FIG. 12 discloses an embodiment of the power amplifier circuit system 802 wherein single chip circuits 842 each contain an I/O controller 824, phase shifter 826, gain controller 828, power amplifier 832 and antenna 834.

Figure 13:
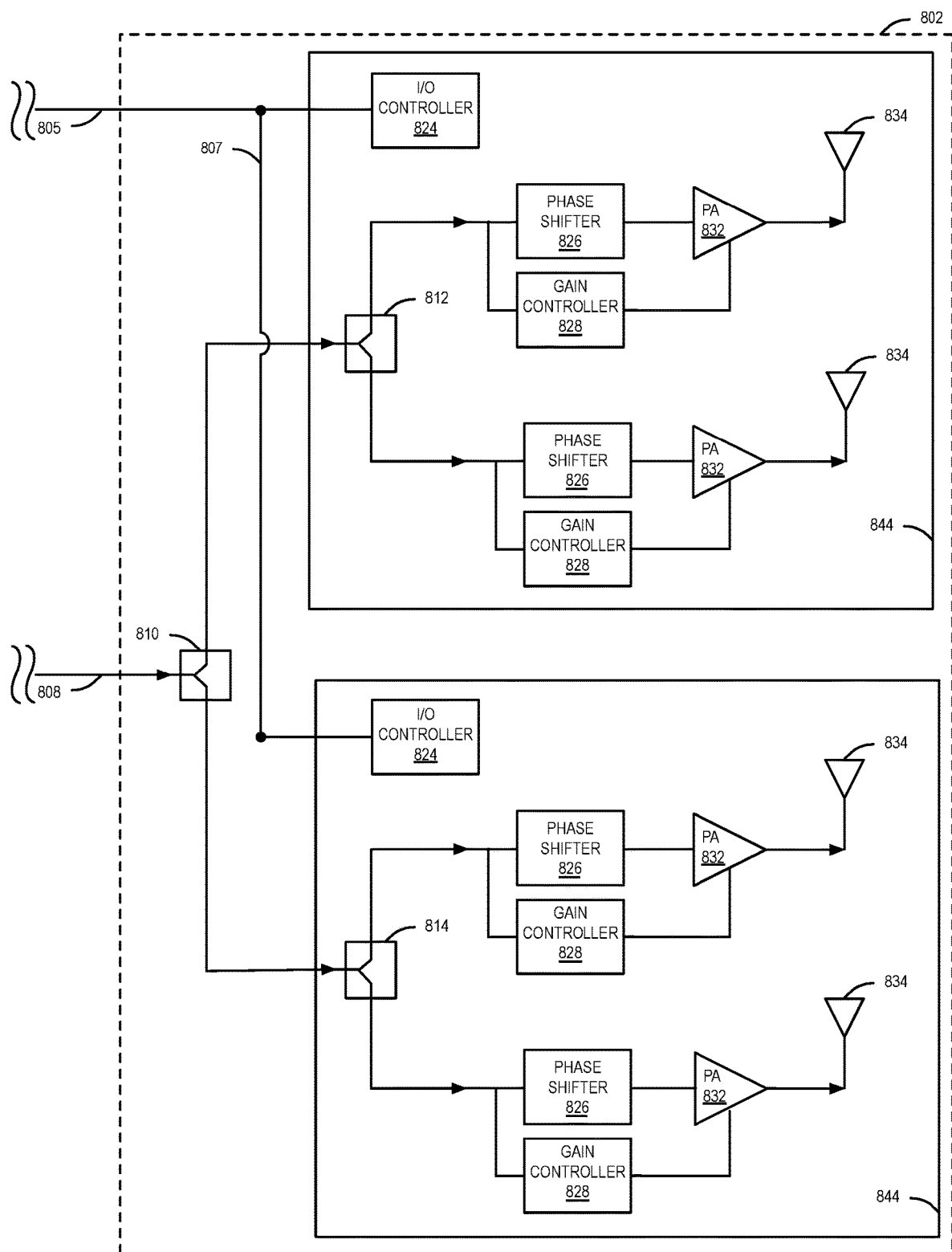
FIG. 13 discloses an embodiment of the RF system 802 wherein single chip circuits 844 each contain an I/O controller 824, 2 phase shifters 826, 2 gain controllers 828, 2 power amplifiers 832 and 2 antennas 834.

FIG. 13 discloses an embodiment of the power amplifier circuit system 802 wherein single chip circuits 844 each contain an I/O controller 824, two phase shifters 826, two gain controllers 828, two power amplifiers 832 and two antennas 834.

Figure 14:
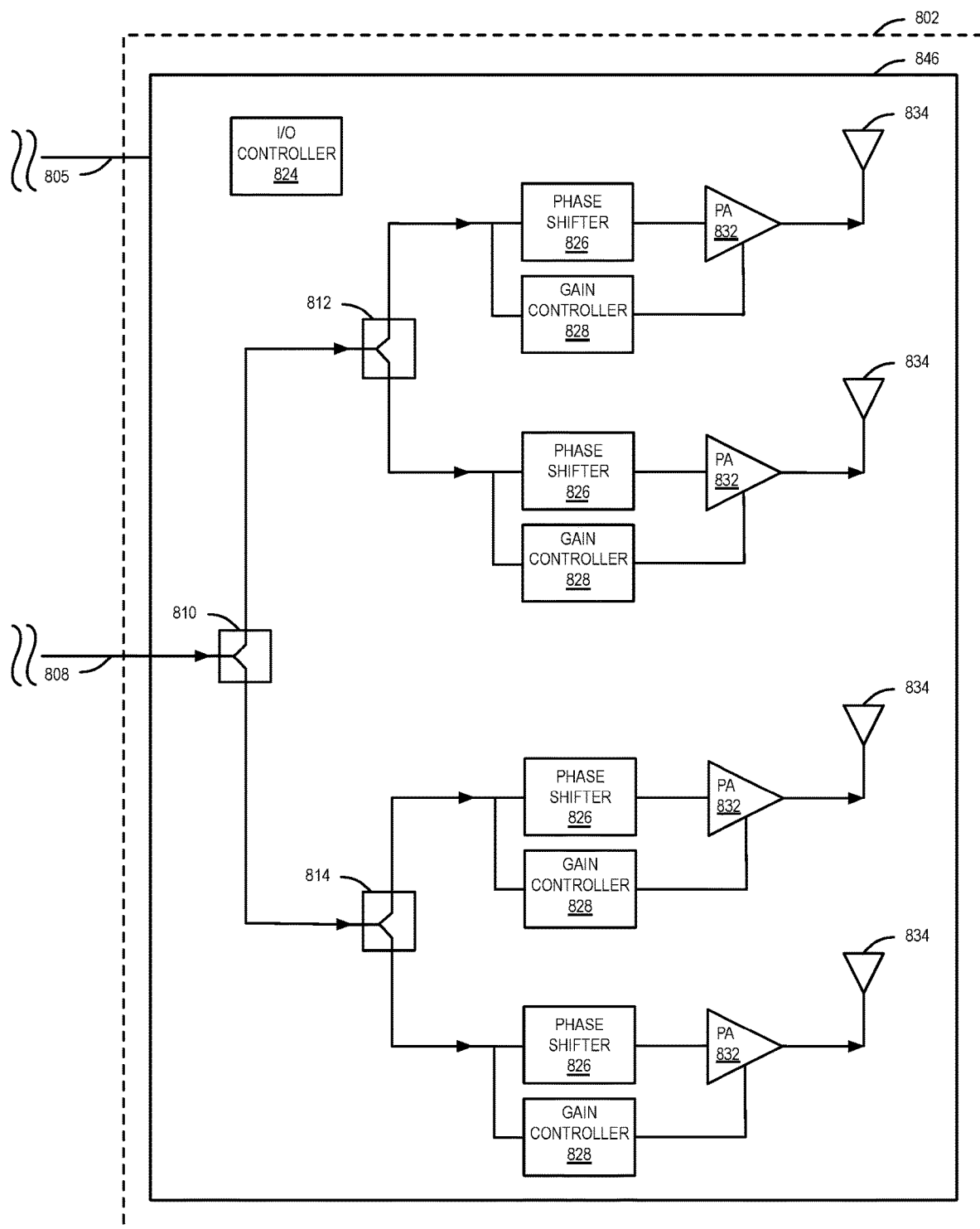
FIG. 14 discloses an embodiment of the RF system and method 802 wherein single chip circuits 846 each contain signal splitters 810-814, I/O controller 824, 4 phase shifters 826, 4 gain controllers 828, 4 power amplifiers 832 and 4 antennas 834.

FIG. 14 discloses an embodiment of the power amplifier circuit system 802 wherein single chip circuits 846 each contain signal splitters 810 to 814, I/O controller 824, four phase shifters 826, four gain controllers 828, four power amplifiers 832 and four antennas 834.

Figure 15:
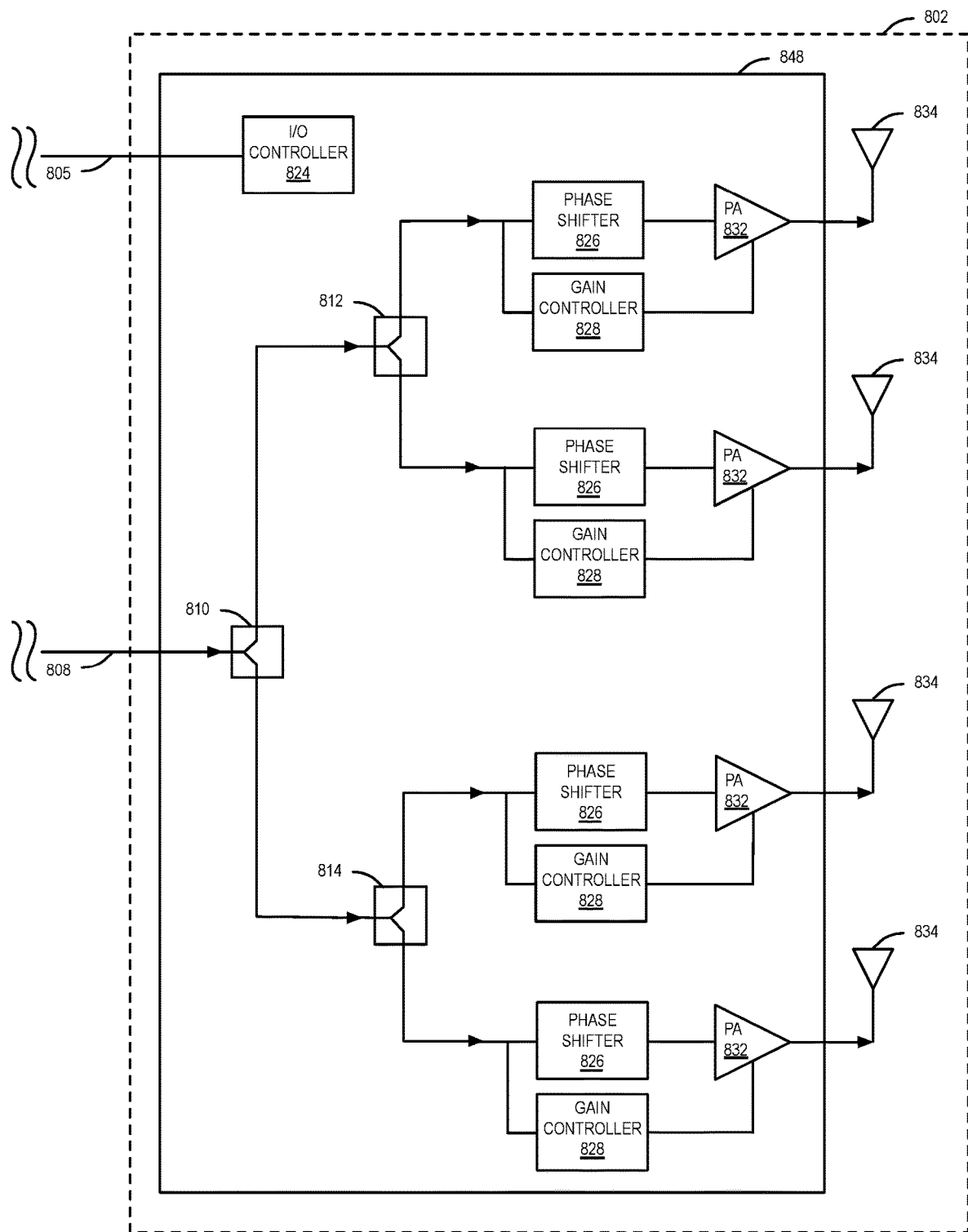
FIG. 15 discloses an embodiment of the RF system and method 802 wherein single chip circuit 848 contains signal splitters 810-814, I/O controller 824, 4 phase shifters 826, 4 gain controllers 828, and 4 power amplifiers 832. In this embodiment, the antennas 834 are located outside the single chip circuit 848.

FIG. 15 discloses an embodiment of the power amplifier circuit system 802 wherein single chip circuit 848 contains signal splitters 810 to 814, I/O controller 824, four phase shifters 826, four gain controllers 828, and four power amplifiers 832. In this embodiment, the antennas 834 are located outside the single chip circuit 848.

Figure 16:
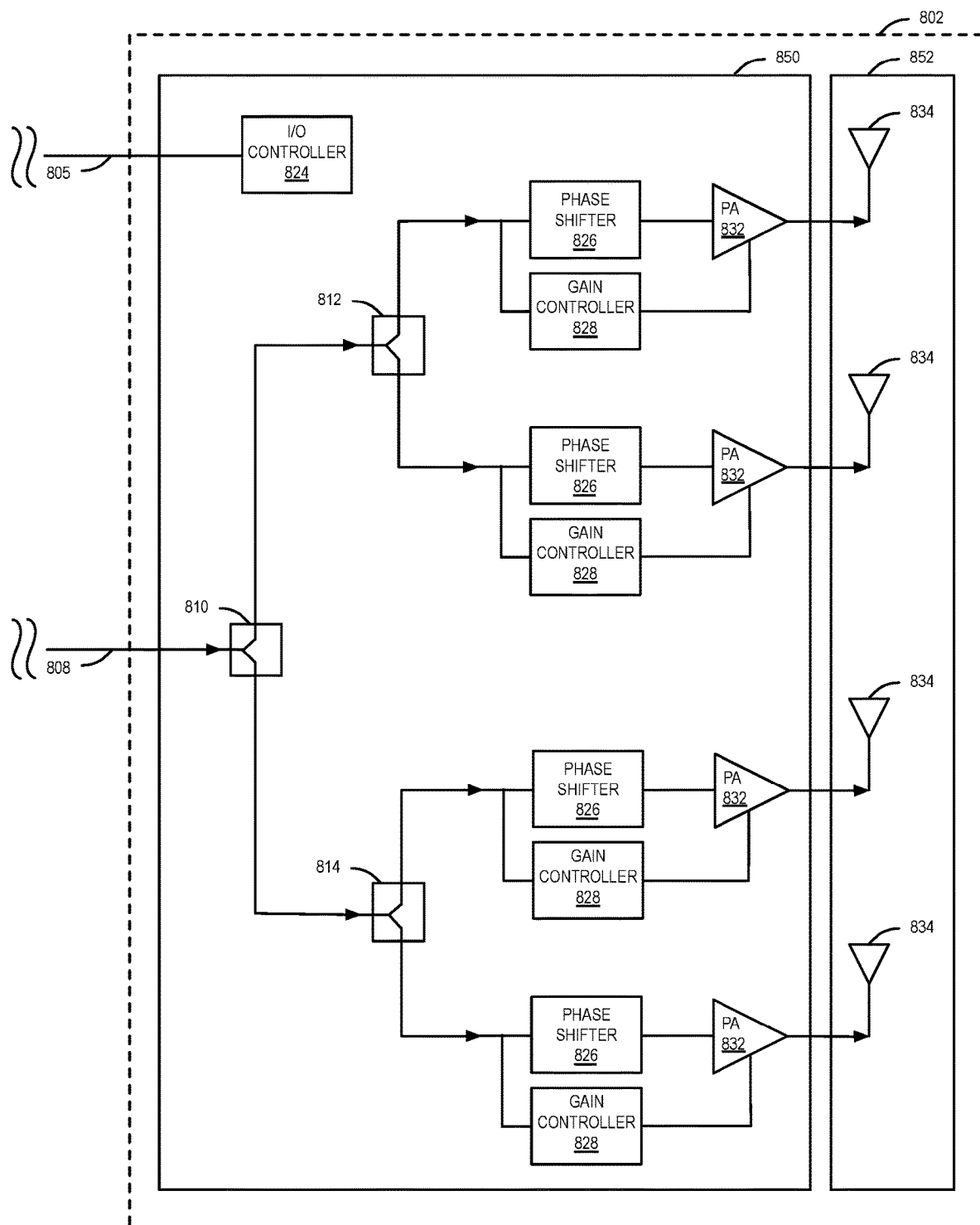
FIG. 16 discloses an embodiment of the RF system and method 802 wherein single chip circuit 850 contains signal splitters 810-814, I/O controller 824, 4 phase shifters 826, 4 gain controllers 828, and 4 power amplifiers 832. In this embodiment, 4 antennas 834 are located outside the single chip circuit 850 in a separate single chip circuit 852 containing an array of the antennas.

FIG. 16 discloses an embodiment of the power amplifier circuit system 802 wherein single chip circuit 850 contains signal splitters 810 to 814, I/O controller 824, four phase shifters 826, four gain controllers 828, and four power amplifiers 832. In this embodiment, four antennas 834 are located outside the single chip circuit 850 in a separate single chip circuit 852 containing an array of the antennas 834.

Figure 17:
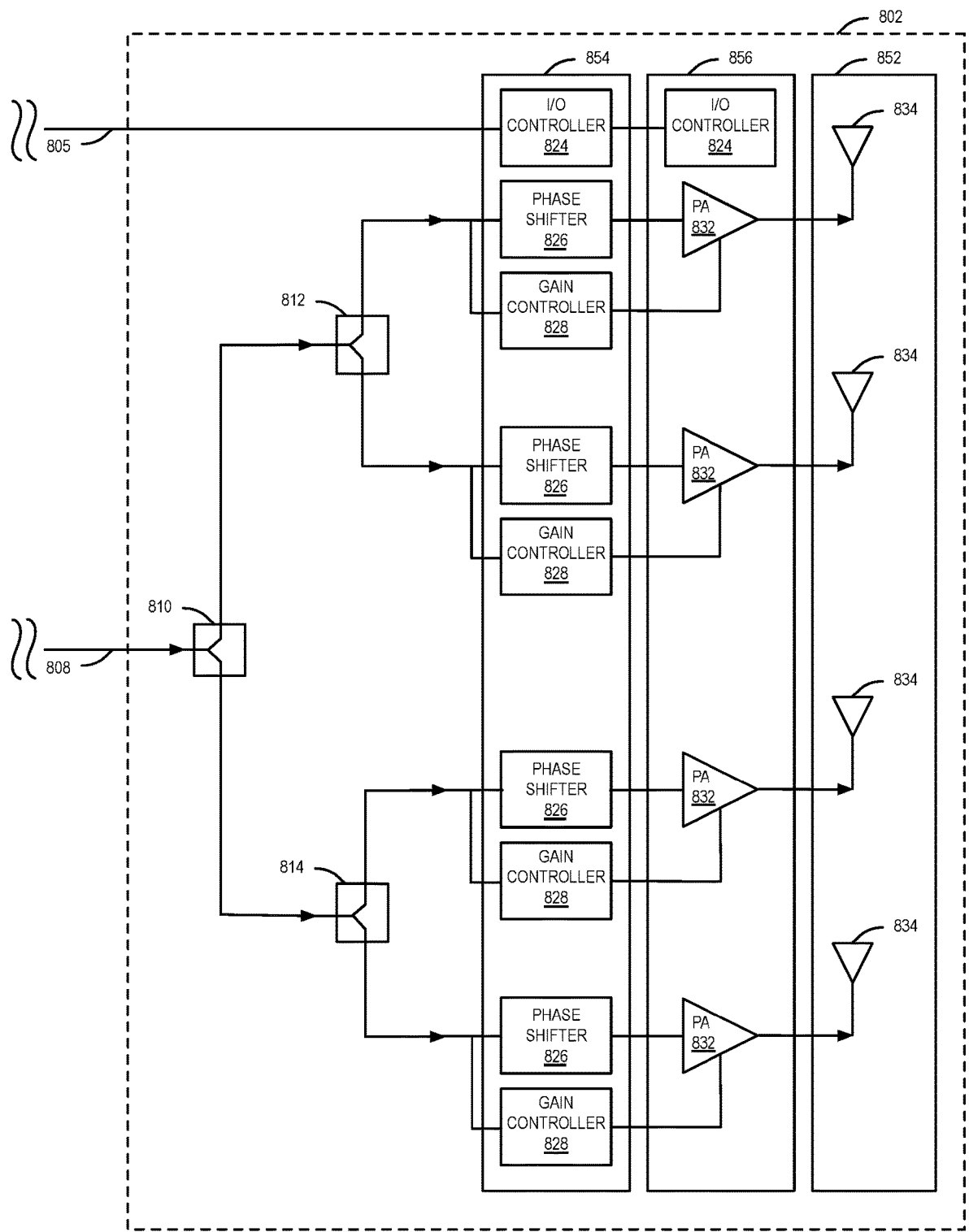
FIG. 17 discloses an embodiment of the RF system and method 802 wherein single chip circuit 854 contains a I/O controller 824, 4 phase shifters 826, and 4 gain controllers 828; single chip circuit 856 contains an I/O controller 824 with 4 power amplifiers; and single chip circuit 852 has an array of 4 antennas.

FIG. 17 discloses an embodiment of the power amplifier circuit system 802 wherein single chip circuit 854 contains a I/O controller 824, four phase shifters 826, and four gain controllers 828; single chip circuit 856 contains an I/O controller 824 with four power amplifiers; and single chip circuit 852 has an array of four antennas.

Figure 18A:
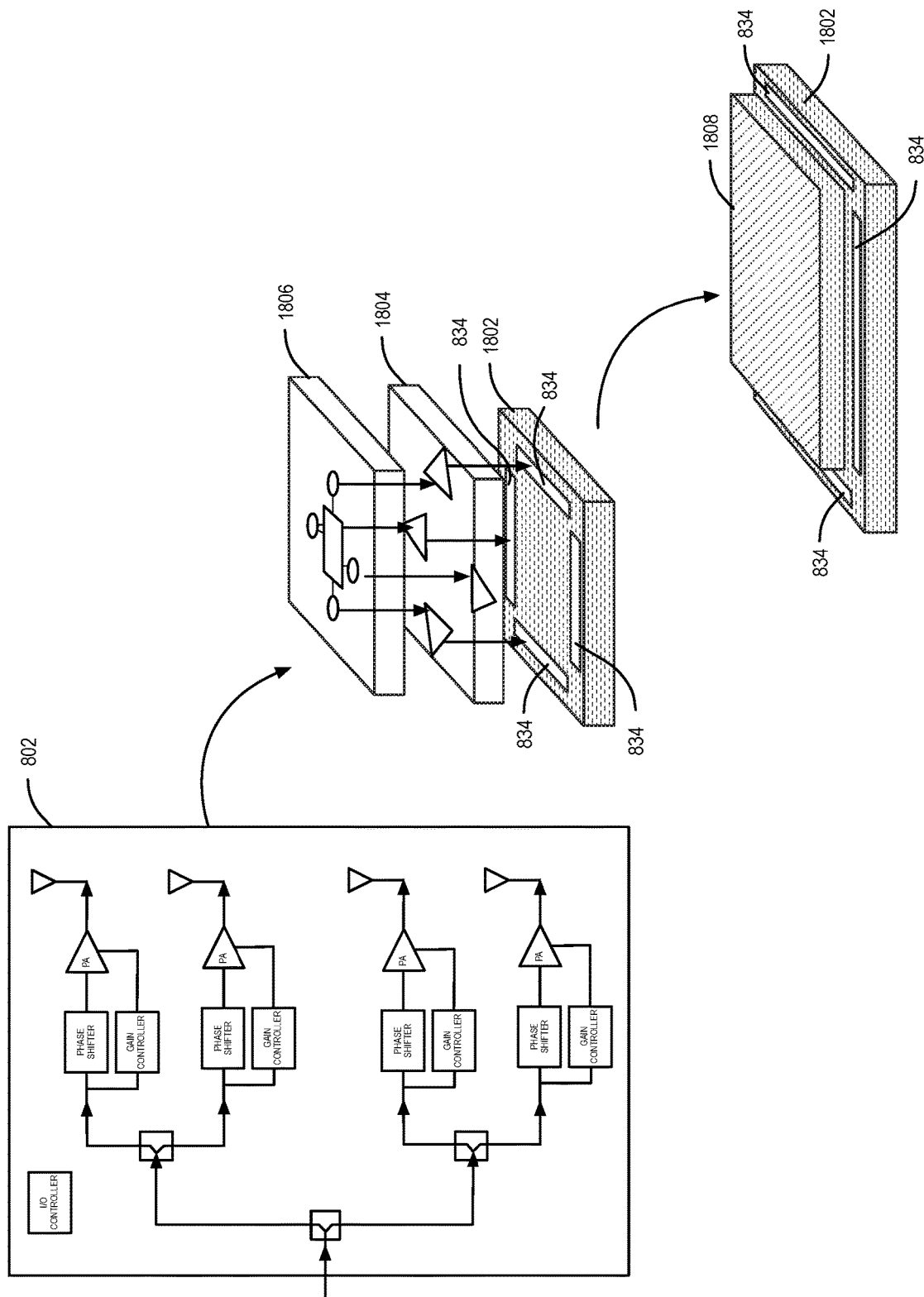
FIG. 18A shows different layers of semiconductor materials and epoxy for packaging each of the single chip circuits disclosed in FIGS. 9-17 in a package on package configuration.

FIG. 18A shows different layers of semiconductor materials and epoxy for packaging each of the single chip circuits disclosed in FIGS. 9-17. For exemplary purposes, FIG. 18A shows single chip circuits 802 assembled into a package 1800 made up of stacked single chip circuits to form a package on package configuration. Reference 1802 is a single chip circuit 802 made up of an antennas which may be a layer which is thin-film, LTC, silicon-base. Reference 1804 is a layer of power amplifiers formed in a single chip circuit 802. The power amplifiers may be GaAs, CMOS, SiGe, Silicon on Insulator (SOI), etc. In this example, reference 1806 indicates a layer including a splitter, phase/gain control, I/O layer (e.g., GaAs, CMOS, SiGe, SOI, etc.). Reference 1808 indicates a combination of layers 1804 and 1806 in a fully assembled package mounted on layer 1802 which has a plurality of antennas 834.

Figure 18C:
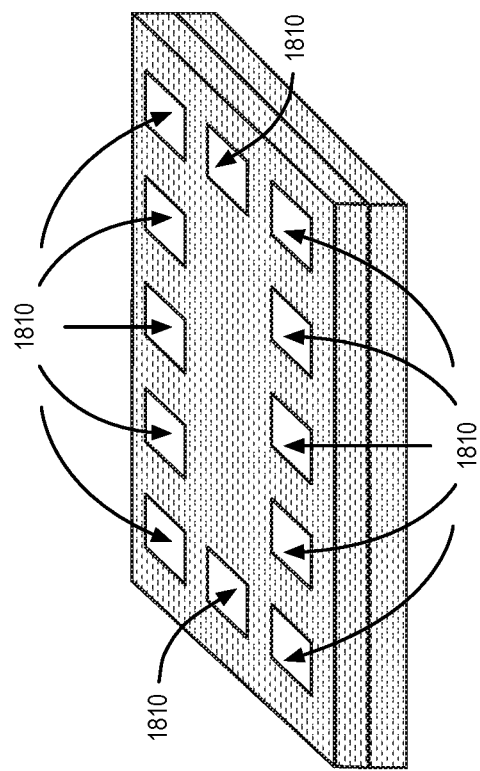
FIG. 18B is a top view of an alternative embodiment with antennas 834 in the top layer on the package and FIG. 18C is a bottom view of the same embodiment with metal pins 1810 for the I/O on the bottom substrate of the package adapted to receive connecting terminals of integrated circuits.
Figure 18B:
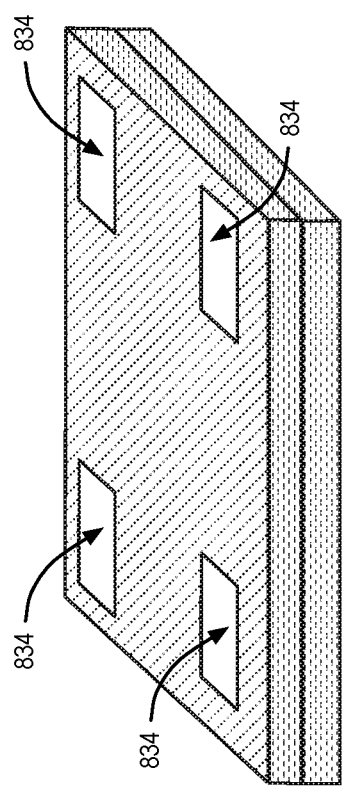
Figure 18E:
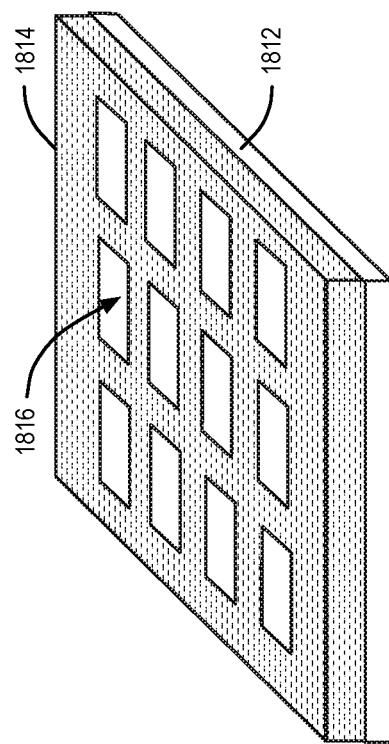
FIG. 18D is a top view of a package in package or system in package configuration and FIG. 18E is a bottom view of this configuration.

FIG. 18B is a top view of an alternative embodiment with antennas 834 in the top layer on the package and FIG. 18C is a bottom view of the same embodiment with metal pins 1810 for the I/O on the bottom substrate of the package adapted to receive connecting terminals of integrated circuits.

Figure 18D:
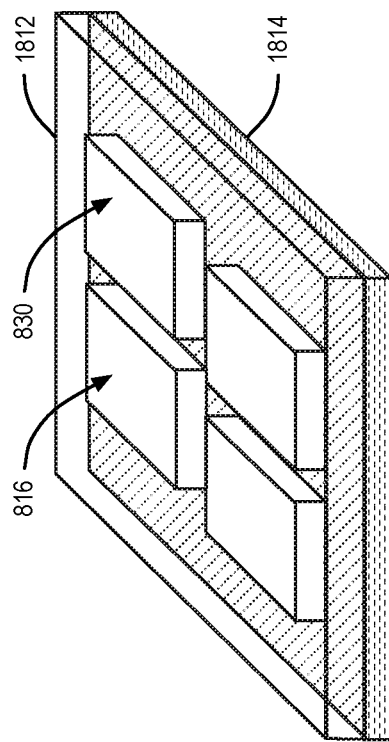

FIG. 18D is a perspective view of a package in package (PIP) or system in package (SIP). The modules shown could be single chip circuits made up of any or all of a power amplifier, splitters, phase/gain control, I/O layers. In this particular FIG. 18D, the packages correspond to FIG. 9 and element 816 is a single chip circuit with a phase shifter and gain controller and element 830 is a single chip circuit having a power amplifier. The single chip circuits are sealed in an epoxy layer 1812 and are attached to layer 1814. As shown in a bottom view of layer 1814, there is an antenna array 1816 for transmitting RF signals.

As the demand for the higher bandwidth (more data) becomes ever so great for wireless communications, the operating frequencies are being pushed higher and higher to supply the bandwidth demanded by wireless users. Today, the next generation network is looking to provide wireless users with speed and bandwidth in frequency ranges from 2 GHz to 70 GHz. These frequencies are technologically challenging to implement, especially the radio frequency front end (RF FE). Although, these frequency bands have been used in the past for satellite, radar, and other communications, they have not usually been used for broad civilian purposes. This means that the cost of such systems is quite high, and the physical size is not suitable for low power devices (e.g., customer provided equipment (CPE), phones, laptops, . . . ). Also, the RF FE at such high frequencies tends to experience significant losses.

In order to bring this kind of speed, bandwidth and technology to an everyday user, the cost and the complexity of the RF FE must be reduced. This disclose addresses that problem by using a new approach in packing, circuit design and the system size. The new miniaturized RF FE system (e.g., 16 mm$^2$, 25 mm$^2$, 36 mm$^2$) reduces the complexity and the cost by using materials such as GaAs, CMOS, SiGe, InP, and the like arranged in SiP, SoP, or PiP. The new RF FE is easy to handle, reduces the RF losses and allows user to experience the full power of RF not only in sub 6 GHz range, but also above 6 GHz such as 28 GHz, 37 GHz, and 39 GHz. This new approach takes all the critical RF FE components (e.g. PA, phase shifters, antennas, and splitters) and puts them in a single easy to use chip, making the RF engineer's job easier.

In another implementation, FIG. 19 illustrates a circuit 1900 with an output of a first linear amplifier 340 with an adjacent channel leakage correction circuit ("leakage correction circuit") 1902. An input RF signal 1903 is received at a power divider 1904 (e.g., power coupler) which divides the input RF signal power into a first power divided signal 1905 and a second power divided signal 1910. The first power divided signal 1905 of the RF signal continues to impedance matching circuit 330 which matches the impedance of a first power divided signal from the power divider 1904. This first power divided signal feeds linear power amplifier 340 which outputs an amplified signal to matching circuit 360. An output of the matching circuit 1906 is input to power combining circuit 1908. A second power divided signal 1910 feeds into leakage correction circuit 1902. In one exemplary embodiment, the power divider 1904 will split the RF input signal 1903 substantially evenly (i.e., approximately 50% and approximately 50%). In another exemplary embodiment, the power divider 1904 will split the RF input signal 1903 with a range of approximately 90% to 99.9% of the power proceeding in first power divided signal 1905 to matching circuit 330. The second power divided signal 1910 will be in the range of approximately 0.1% to 10% of the power of the input signal 1903 proceeding to leakage correction circuit 1902.

Phase shifter and attenuator circuit 1912 of leakage cancellation circuit 1902 adjusts the signal 1910 down and phase shifts the signal 1910. In an alternative embodiment, circuit 1912 could be split into two circuits arranged in series—a phase shifter circuit and an attenuator circuit. Circuit 1912 operates so that the ultimate output of the leakage circuit 1902 (i.e., signal 1916) will be opposite to that of the adjacent channel leakage signal of the output signal 1906 of the first linear amplifier 340 through impedance matching circuit 360. The settings of the circuit 1912 will be varied depending on the output of the power combining circuit (i.e., signal 1918) so as to optimize the cancellation of the adjacent channel leakage of signal 1918. The output of the phase shifter and attenuation circuit 1912 is matched in matching circuit 335 and is received at the second power amplifier 1914. Second power amplifier 1914 is arranged in parallel to the first power amplifier 340. Second power amplifier 1914 is controlled by a gain adjustment circuit 325, phase adjustment circuit 327 and biasing circuit 329. These correction parameters may be preset at the factory based on testing to correct the leakage in output signal of the first power amplifier 340. The gain adjustment circuit 325 and the phase adjustment circuit 327 can respectively provide gain and phase controls to the second amplifier 1914. The second power amplifier 1914 is further biased by biasing circuit 329 which sets the linear behavior of the second power amplifier 1914 output signal. The second amplifier 1914 is biased to produce high adjacent channel leakage signal to procure efficient cancellation of adjacent channel leakage of the output of the first amplifier 340. The output signal of the power amplifier 1914 is sent through a matching circuit 365 to the power combiner 1918 (e.g., a power coupler) to correct the leakage signal from power amplifier 340.

Power combining circuit 1908 can combine signal 1906 from the first amplifier 340 with a leakage correcting signal 1916 to produce a leakage corrected output signal 1918 with the leakage substantially reduced as it proceeds to an antenna (not shown). Through the configuration of the leakage correction circuit 1902, the adjacent channel leakage from the power combining circuit 1918 will have decibels (dBc) relative to transmission signal in the transmission channel (as illustrated in FIG. 1H) in the range of approximately −40 dBc to −70 dBc.

Figure 20:
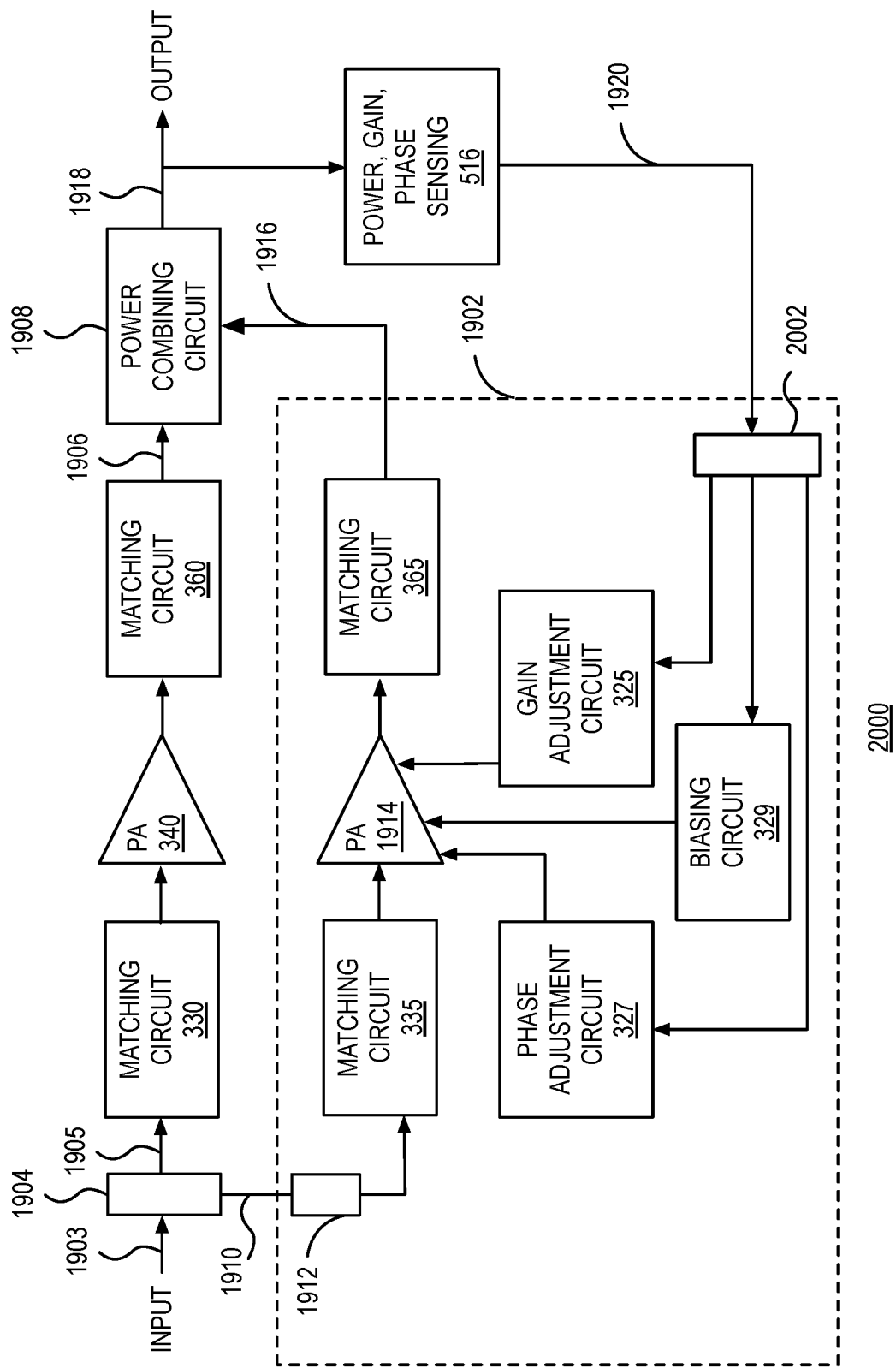
FIG. 20 is a schematic diagram for a linear amplifier with an adjacent channel leakage correction circuit with a feedback loop.

FIG. 20 operates in a manner similar to FIG. 19 except for the addition of a closed feedback loop made up of a power, gain, and phase sensing circuit 516 and feedback control circuit 2002. Circuit 516 sends a signal 1920 to feedback control circuit 2002 which processes a feedback signal from circuit 516. Feedback control circuit continuously adjusts the circuits 325, 327 and 329 to advantageously operate the second amplifier 1914 to reduce the adjacent channel leakage of signal 1918. This continuous ongoing adjustment of circuits 325, 327 and 329 is in contracts to the preset settings of these circuits as shown in FIG. 19.

In an alternative embodiment, software stored in a processor and memory of feedback control circuit 2002 controls the circuits 325, 327 and 329 and second amplifier 1914 in coordination with feedback signal 1920. The software uses artificial intelligence machine learning techniques to learn the patterns of the first power amplifier in different conditions (e.g., impedance mismatch, voltage standing wave ratio (VSWR), temperature change, etc.) and makes adjustments to circuits 325, 327 and 329 in accordance with this learned behavior. Artificial intelligence neural network algorithms may also be used in the software to anticipate and adapt to different environments in which the first amplifier 340 will operate.

Figure 21:
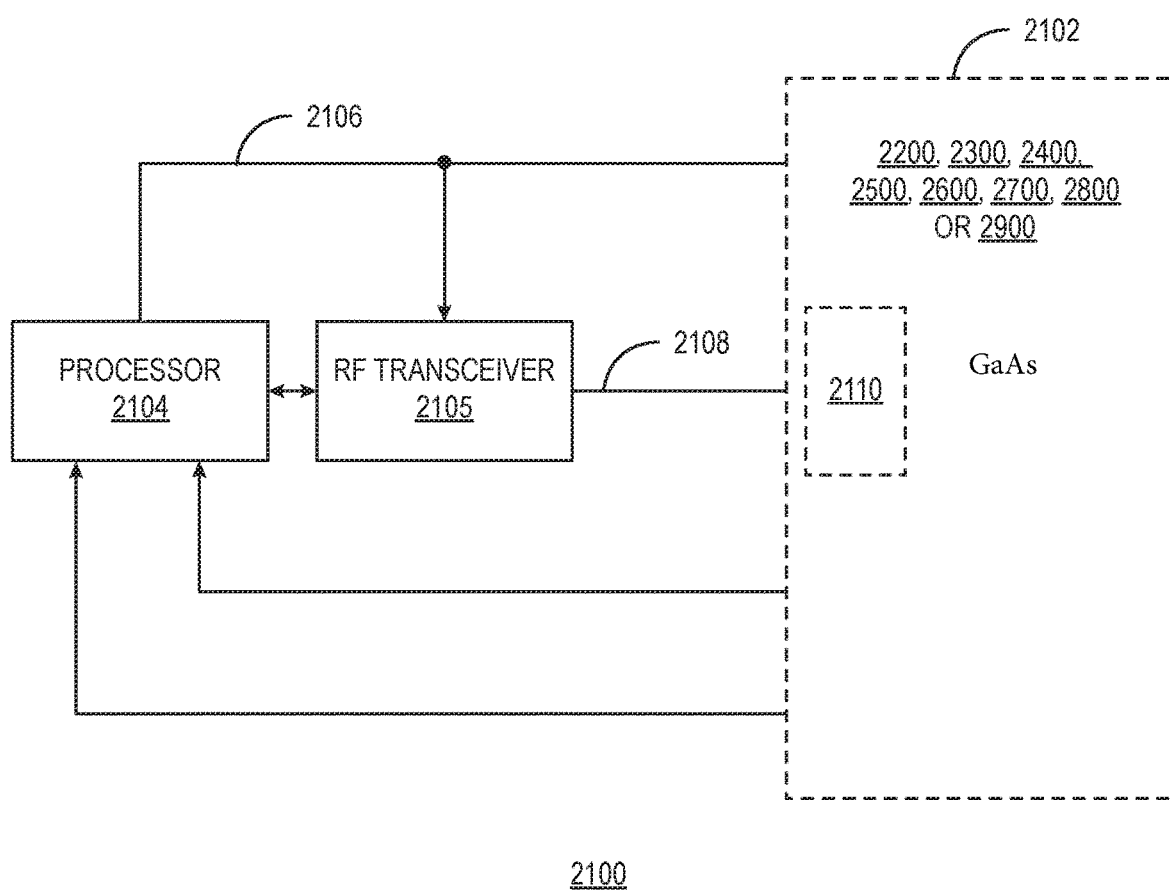
FIG. 21 illustrates an exemplary application of a RF system and method 2200 in a wireless communication device 2100.

The wireless RF semiconductor system disclosed herein has further embodiments in FIGS. 21-29B and include a configuration and packaging of active and passive RF components into a single packaged module. FIG. 21 illustrates an exemplary application of a RF system and method in a wireless communication device 2100. The wireless communication device 2100 can for example be implemented in mobile devices such as: a personal digital assistant (PDA), a handheld wireless digital device, a wireless local access network (WLAN) adaptor, mobile computer, wireless tablet, wireless phablet, cellular phone, Internet of Things device, base stations (e.g., cellular base stations) and repeaters. Reference 2102 of FIG. 21 will be used as a general reference for the wireless RF semiconductor system discussed with reference to FIGS. 22A-29B in detail below which are referenced as items: 2200, 2300, 2400, 2500, 2600, 2700, 2800 or 2900. Reference 2102 may be a wireless radio frequency (RF) single encased packaged module (such as plastic, ceramic, metal shield, or similar package) with at least one RF integrated circuit (IC). The wireless communication device 2100 can could be used in the following standards: 3rd generation (3G), 4th generation (4G), fifth generation (5G), 802.11 ac/ad, and other wireless communication standards.

The wireless communication device 2100 can include at least one processor (e.g. baseband, control processing unit (CPU)) 2104. The baseband 2104 (or in some embodiments inside the module 2102) includes artificial intelligence (AI). AI may be defined as the ability of the computer (i.e., baseband 2104) to behave or function like a human. The artificial intelligence includes the subsets machine learning and deep learning. Machine learning is the study of various data and later using their learning to make crucial decisions. The relation between AI and machine learning is that machine learning is a way to achieve AI. From a technology perspective, AI in the baseband 2104 (and/or module 2102) is about letting the hardware adjust its decision-making capability and allowing it to learn from patterns. Learning can improve the baseband functionality, which otherwise acts based on hard-coded settings. Of course, the pattern observations and execution of AI and machine learning (ML) require a certain amount of computing capacity. They also depend on software processes for decision making, as well as one or several data sources to use for pattern analysis. Applying ML to software functionalities boosts the strength of the network significantly, since many network functions can benefit from the same processes. The baseband 2104 may run ML in parallel with regular node traffic without reducing the capacity of the baseband. This would include analyzing huge amounts of data in real time, enabling instant communication traffic predictions. Besides automation, the AI and ML allow improved network coverage and the user experience by anticipating the needs of device 2100.

In addition, wireless device 2100 may include at least one RF transceiver 2105. In FIG. 21, the module 2102 could have the following active and passive RF components: power amplifiers, gain controllers, phase-shifters, input/output controllers, low noise amplifiers (LNAs), RF switches, power sensors, linearizer, antennas, antenna arrays, capacitors, inductors, and additional circuitry and components. The module 2102 is shown in a variety of different package configurations in FIGS. 22A-29B with the functionality divided up over several single chip circuits and/or among several different packages. The module 2102 includes at least one passive RF antenna and at least one RF IC that can be fabricated (or built) on the same semiconductor substrate (e.g., GaAs, GaN, CMOS, SiGe, and/or InP) and inside one single encased packaged module (such as plastic, ceramic, and a metal shield). Using one single encapsulated packaged module 2102 simplifies assembly, reduces size and cost, and allows for a quick time to market, while maximizing the RF performance demanded by fixed and mobile 4G, 5G and other wireless standards. As the need for higher bandwidth and higher speed increases the RF complexity and the cost, the modules 2102 described herein allow RF engineers to overcome these difficulties by combining passive and active RF components such as amplifiers, phase shifters, gain control, antenna and other RF front end elements in a single encased packaged module. The size of the package 2102 may vary depending on the frequency and the needs of RF engineer (e.g., how many antennas needed, how many amplifiers needed).

Processor 2104 uses control signals 2106 connected to a bus in the module 2102 to control its operations. The processor 2104 further generates digitally modulated signals. The frequency is up converted by the RF transceiver(s) 2105 to a RF signal suitable for transmission. The processor 2104 (e.g., central processing unit (CPU), baseband, Application Specific Integrated Circuit (ASIC)) is coupled serially or in parallel to an input/output controller or a plurality of I/O controllers in module 2102 through the bus 2108. Processor 2104 provides control for the RF front end of the wireless device 2100 such as phase adjustment of signal information, gain adjustment, on/off, and duty cycle. The plurality of I/O controllers (not shown) in module 2102 receive information from the processor 2104 and performs functions such as turning on a phase shifter, how much signal will be shifted, what to with gain, programming, adjusting. The RF ICs in RF module 2102 may also each have their own I/O controllers which function to provide voltage to the PA amplifiers in module 2102. The module 2102 can amplify and/or phase shift the input RF signals 2108. The frequency of RF input signals 2108 can be in microwave or millimeter wave range. For example, the RF input signals 2108 may be lower than approximately 6 GHz such as approximately one of 2.5 GHz, 3.5 GHz, 5.1 GHz, or 5.8 GHz and/or higher than approximately 6 GHz such as approximately one of 14 GHz, 17 GHz, 28 GHz, 37 GHz, 38 GHz, 39 GHz, 60 GHz, or 70 GHz. The RF input signal 2108 may be, but is not limited to, the following communication standards and protocols: Discrete Fourier Transform (DTF)-Spread-OFDM, OFDM, OFDMA, Generalized Frequency Division Multiplexing (GFDM), Unique Word (UW)-OFDM, Cyclical Prefix (CP)-OFDM or single carrier OFDMA (SC-OFDMA), Code Division Multiple Access (CDMA), Wideband Code Division Multiple Access (WCDMA), High-Speed Downlink Packet Access (HSDPA), High-Speed Packet Access (HSPA), Ultra Mobile Broadband (UMB), Long Term Evolution (LTE), WiMax, WiBro, WiFi, WLAN, 802.16, and others. The single chip RF circuits of the module 2102 can be manufactured using Gallium Arsenide Heterojunction Bipolar Transistors (GaAs HBT), Gallium Nitride (GaN), Indium Phosphide (InP), Complementary Metal-Oxide-Semiconductor (CMOS), Silicon Germanium (SiGe), and other semiconductor material.

Figure 22A:
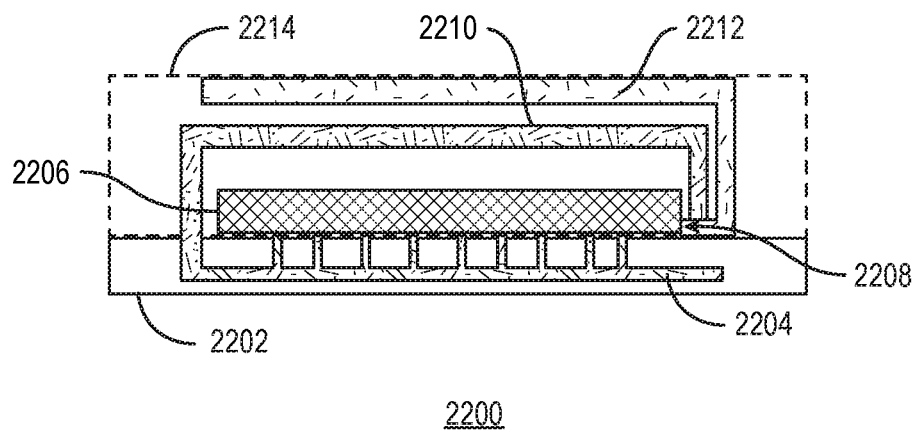
FIG. 22A discloses an embodiment of RF system 2200 in the form of a top emitting patch antenna (e.g., Yagi) module.

FIG. 22A discloses an embodiment of RF packaged module 2102 in the form of a top emitting patch antenna or an edge emitting Yagi antenna single packaged module 2200. (Note: in the discussion of FIGS. 23A-29B below like referenced elements will perform the same function as those described in relation to FIGS. 22A and 22B including operating at the frequencies discussed with respect to FIGS. 22A and 22B). Packaged module 2200 may provide a unitary or common component which may be conveniently assembled in RF communication device 2100, with correspondingly simplified assembly, compact three-dimensional (3D) size, and enhanced RF performances. As discussed above, the module 2102 may include active RF components such as RF power amplifiers (PA), low noise amplifiers (LNA), switches, filters, other circuitry and auxiliary electronic components. The module 2200 can operate in frequencies ranging from approximately 6 GHz to 100 GHz. In alternative embodiments, the module 2200 can operate in frequencies lower than approximately 6 GHz such as approximately one of 2.5 GHz, 3.5 GHz, 5.1 GHz, or 5.8 GHz and/or higher than approximately 6 GHz such as approximately one of 14 GHz, 17 GHz, 28 GHz, 37 GHz, 38 GHz, 39 GHz, 60 GHz, or 70 GHz.

The module 2200 may have a miniature size of a few millimeters. The module 2200 can be implemented as an integrated circuit(s) on a common integrated circuit IC substrate 2202 which can be a multiplayer printed circuit board, lead frame, lower-temperature co-fired ceramics (LTCC), or other suitable electronic materials. The substrate 2202 includes metal pins adapted to receive connecting terminals of integrated circuits including a stage power amplifier, main and the auxiliary power amplifiers, biasing circuits, power sensing circuits, Vmode control circuits, and optional control logic circuits. Bonded to the substrate 2204 is a RF semiconductor integrated circuit (IC) 2206 (or RF IC) which includes a power amplifier having an input and output 2208. RF semiconductor IC 2206 in module 2200 can include active RF components such as a power amplifier, low noise amplifier, RF switch, phase-shifter, power sensor, and/or a linearizer. In alternative embodiments, reference 2206 could be: 1) an RF IC; 2) an RF IC and a baseband IC; or 3) a combined RF and baseband IC. In an alternative embodiment, the baseband IC could have the AI and ML discussed above in connection with processor 2104. Furthermore, the RF IC 2206 can include a up and down RF frequency converter and mixer.

The RF IC 2206 can be fabricated using different semiconductor materials, such as gallium arsenide (GaAs), gallium nitride (GaN), silicon germanium (SiGe), and complementary metal oxide semiconductor (CMOS). The RF IC 2206 can operate in a single frequency and/or multi-band frequencies. The RF IC 2206 and module 2200 can include electrically conductive layers, patches and/or heat dissipator 2204 for proper grounding and cooling of the module 2200. The module 2200 can be used in any wireless standard, such as 4G, 5G, and beyond. The module 2200 can have at least one power management chip (PMIC) to provide needed voltage for normal operation. The module 2200 can utilize beam-forming or beam-steering technology to improve transmission or reception of the RF signal. The module 2200 can utilize multiple input, multiple output (MIMO) and single input, multiple output (SIMO) for better receive and transmit capabilities. The module 2200 can radiate power between approximately 19 decibels relative to one milliwatt (dBm) to 73 dBm equivalent isotropically radiated power (EIRP). The module 2200 can have a linearizing technology (e.g. DPD, ADP) to improve signal transmission (e.g. EVM, spectrum management, ACLR). The module 2200 can have envelope tracking technology to improve efficiency of the transmission. The module 2200 can operate in a single and/or multiple frequencies. The module 2200 can have at least one power sensor for sensing both the received signal and/or transmitted signal. The module 2200 could be used in a repeater application. At least two or more wireless RF ICs 2206 could be combined in the module 2200 to operate simultaneously to increase the EIRP as desired. In alternative embodiments, the RF IC 2206 could have at least one baseband IC (as discussed above). The module 2200 could have at least one artificial intelligence (AI) IC (as discussed above).

Figure 22B:
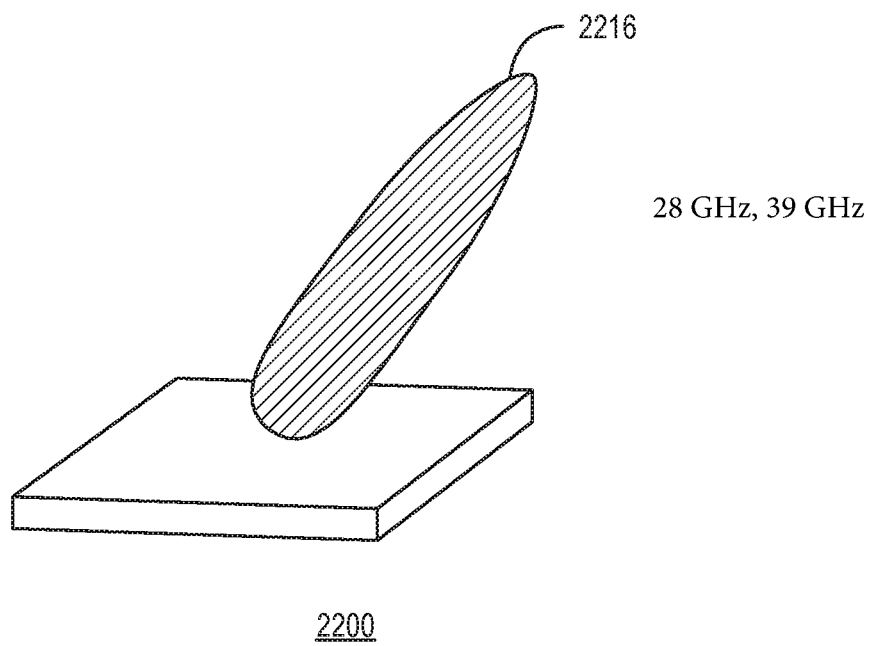
FIG. 22B is a perspective view of the module 2200.

Referring to FIG. 22A, the module 2200 further includes a ground 2210 and antenna 2212 (e.g., mmWave antenna, microwave antenna) and surrounded by molding compound 2214 (e.g., epoxy resin). Ground 2210 may be located between antenna 2212 and RF semiconductor IC 2206 to isolate and minimize electromagnetic interference between antenna 2212 and RF IC 2206. In some embodiments, ground 2210 may almost completely enclose the RF IC 2206 to provide shielding from antenna 2212. RF antenna 2212 can have a single or a dual polarization for a better signal reception and/or transmission. RF antenna 2212 can operate in single and/or multi-band frequencies. The RF antenna 2212 can resonate at different frequencies at the same time. For example, the antenna 2212 can receive and/or transmit RF signals at 28 GHz and 39 GHz at the same time. The same RF antenna 2212 can be used to transmit or receive an RF signal (e.g., in Time Division Duplex (TDD) operation). In alternative embodiments, the antenna 2212 can be located on top of the module 2200 (i.e., outside moulding compound 2214), on the bottom of the module 2200, or on one side of the module 2200. FIG. 22B is a perspective view of the module 2200. Top emitting beam 2216 is a signal from antenna 2212 under the molding compound 2214.

Figure 23:
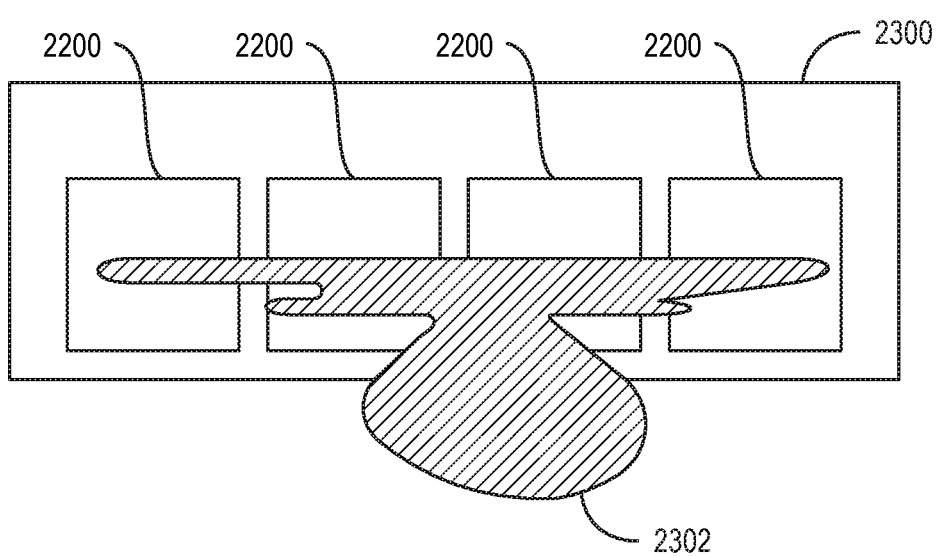
FIG. 23 shows a plurality of modules 2200 arranged in an array 2300.

FIG. 23 shows a plurality of modules 2200 arranged in an array 2300. Array 2300 of a plurality of modules 2200 is 1×4 as shown but may also be in other arrangements 2×2, 4×4, or N×N (where predetermined N is a number). Array 2300 may be configured so that the modules 2200 are all encased in a molding compound. Array 2300 forms a top beam 2302.

As discussed above, in high frequency radio applications (such as millimeter wave, approximately 2.3-2.7 GHz, approximately 3.3-3.8 GHz, or approximately 5.0-6.0 GHz), there is a need to control the direction of signal radiation. This direction controlled signal radiation is called beam steering. Beam steering is needed to improve the signal reception in a particular direction. In the digital method as used herein, phase shifters in package 2200 are utilized along with array antenna 2300 setup to focus the signal radiation of beam 2302 in a particular direction without the need to turn the antenna physically. The signal interaction depends on the phase of the radiated signal which is being controlled by the phase shifter in the transmitter each of the modules 2200. FIG. 23 shows that there are 4 antenna modules 2200 which are radiating signals generated by a signal generator. The main beam 2302 of the radiated signal may be steered towards a particular direction based on the phase of each signal being radiated from the array antenna system of antenna packages 2200.

Figure 24A:
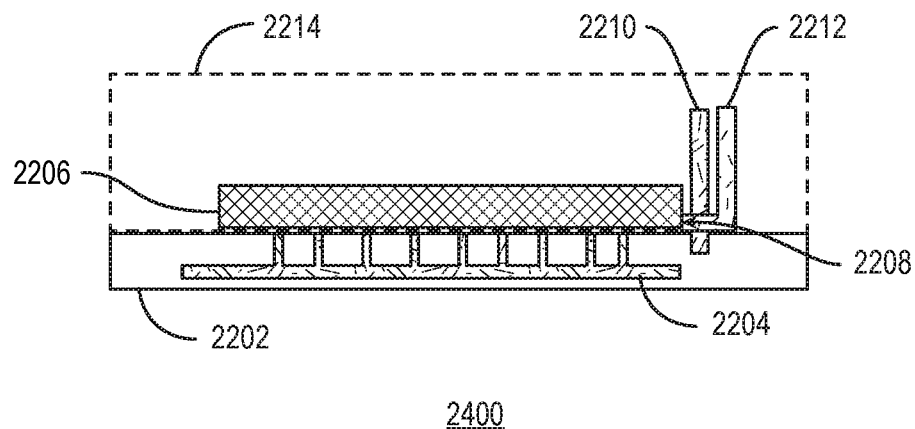
FIG. 24A shows module 2400 which is an alternative embodiment of module 2200 shown in FIGS. 21A-21B.
Figure 24B:
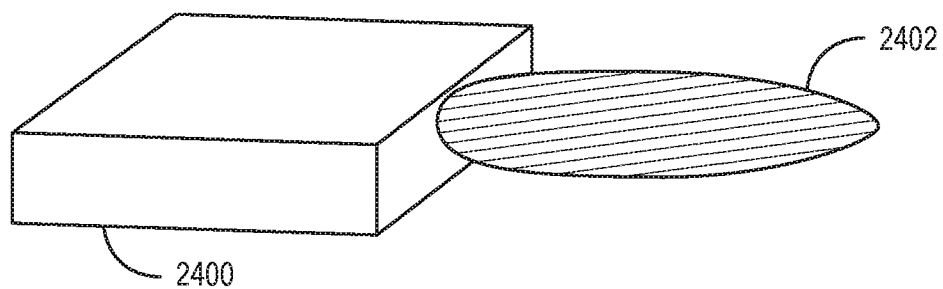
FIG. 24B is a perspective view of module 2400 with a side emitting beam 2402.

FIG. 24A shows module 2400 which is an alternative embodiment of module 2200 shown in FIGS. 22A-22B. Module 2400 includes a side emitting patch antenna 2212. In this module 2400, the ground 2210 is arranged in a position next to RF IC 2206 and in parallel to antenna 2212. FIG. 24B is a perspective view of module 2400 with a side emitting beam 2402. The module 2400 may be thicker (or taller) than module 2200 by using an antenna substantially perpendicular to the substrate 2202.

Figure 25:
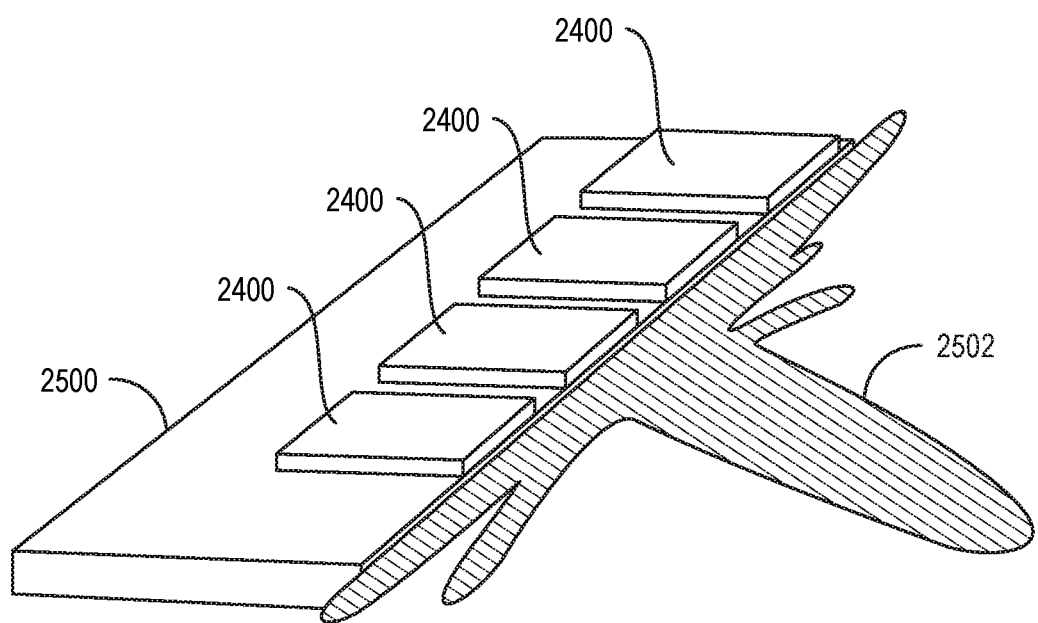
FIG. 25 shows a plurality of modules 2400 arranged in an array 2500.

FIG. 25 shows a plurality of modules 2400 arranged in an array 2500. Array 2300 of modules 2400 by 1×4 as shown but may also be in other arrangements 2×2, 4×4, or N×N. Array 2500 may be configured so that the modules 2400 are encased in a molding compound. Array 2300 forms a beam 2502.

Figure 26A:
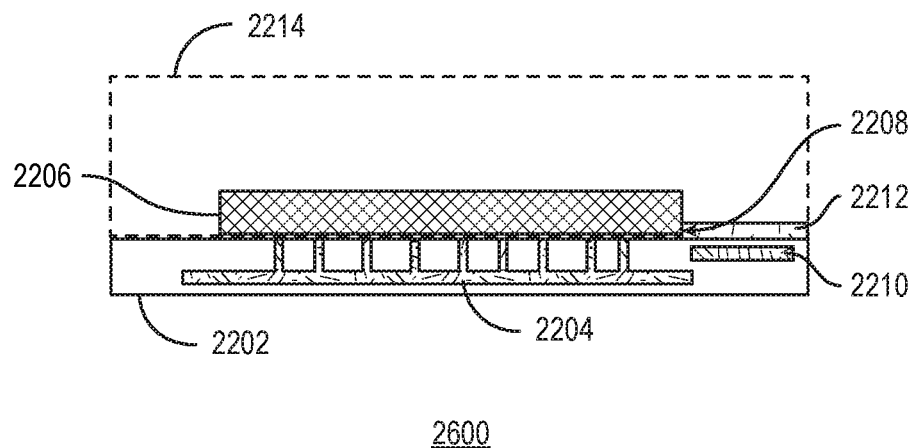
FIG. 26A shows module 2600 which is an alternative embodiment of module 2200 shown in FIGS. 21A-21B.
Figure 26B:
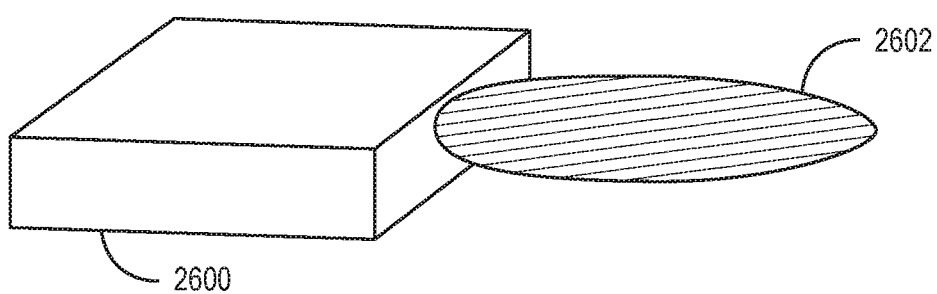
FIG. 26B is a perspective view of module 2600 with a side emitting beam 2602.

FIG. 26A shows module 2600 which is an alternative embodiment of package 2200 shown in FIGS. 21A-21B. Module 2600 is a side emitting yagi antenna 2212. In this module 2600, the antenna 2212 is printed on the substrate 2202 with the ground 2210 parallel to the antenna 2212. FIG. 26B is a perspective view of module 2600 with a side emitting beam 2602. The module 2600 may be thinner than module 2200 shown in FIG. 22A because the antenna 2212 is next to and substantially parallel in direction with the RF IC 2206.

Figure 27:
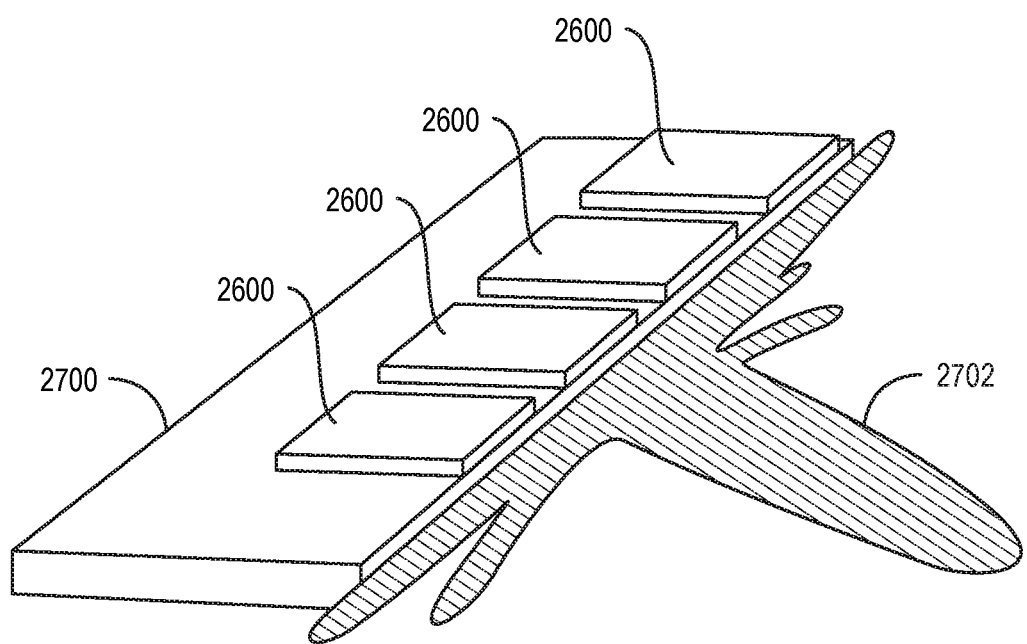
FIG. 27 shows a plurality of modules 2600 arranged in an array 2700.

FIG. 27 shows a plurality of modules 2600 arranged in an array 2700. Array 2700 of modules 2600 by 1×4 as shown but may also be in other arrangements 2×2, 4×4, or N×N. Array 2700 may be configured so that the modules 2600 are encased in a molding compound. Array 2700 forms a beam 2702.

Figure 28A:
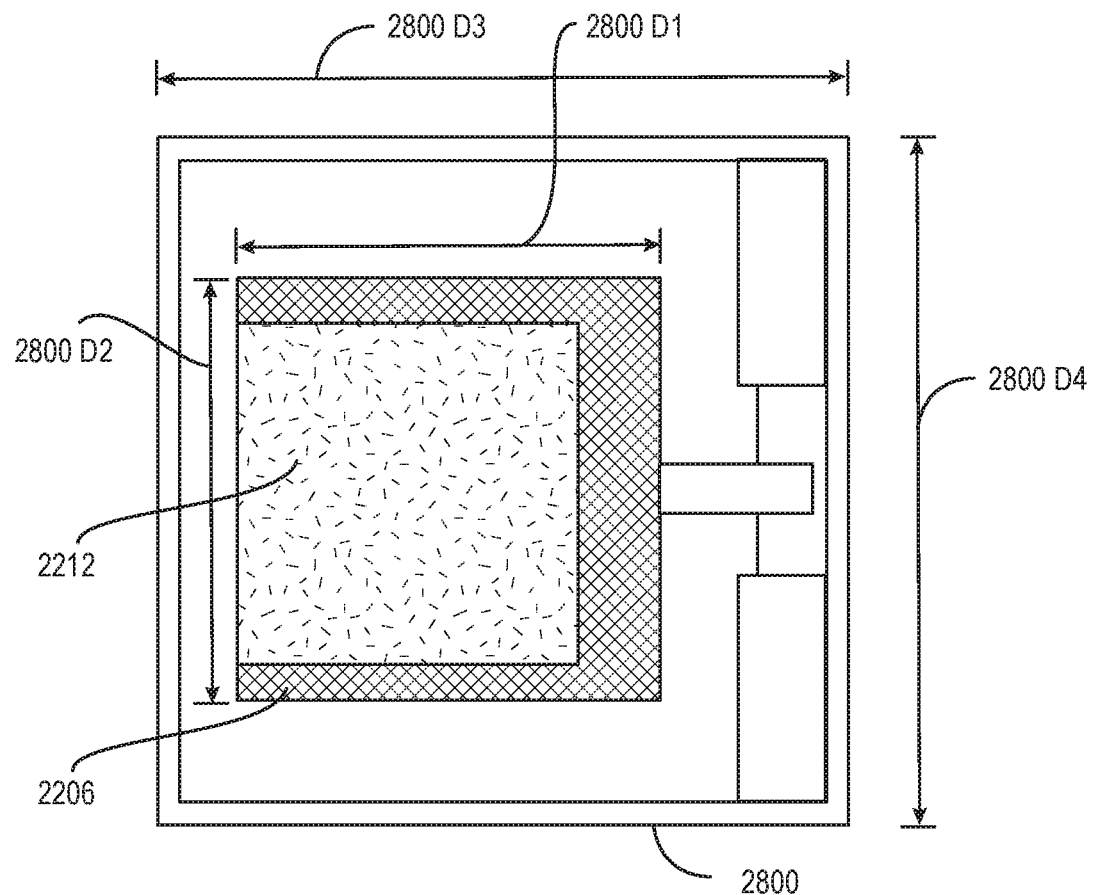
FIG. 28A is a top view and FIG. 28B a side view of another embodiment with the antenna on top of the package.
Figure 28B:
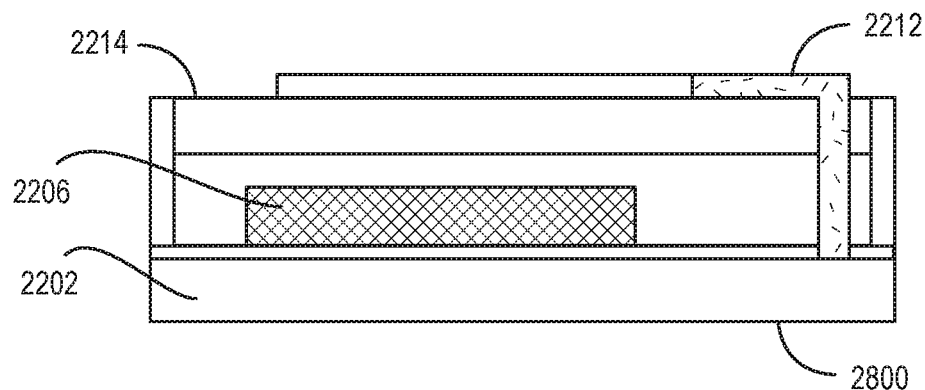

FIG. 28A is a top view and FIG. 28B a side view of another embodiment with the antenna 2212 on top of the module 2800. The antenna 2212 is located outside the molding 2214 and in a substantially parallel relationship with the RF IC 2206 located inside the module 2800. 2800D1 indicates a first dimension of the RF IC 2206 and 2800D2 indicates a second dimension of the RF IC 2206 as shown in FIG. 28A. 2800D1 and 2800D2 have dimensions in the range of up to approximately 3.04 mm or less. 2800D3 indicates a first dimension of the module 2800 and 2800D4 indicates a second dimension of the module 2800 as shown in FIG. 28A. 2800D3 and 2800D4 have dimensions in the range of up to approximately 5 mm or less.

Figure 29A:
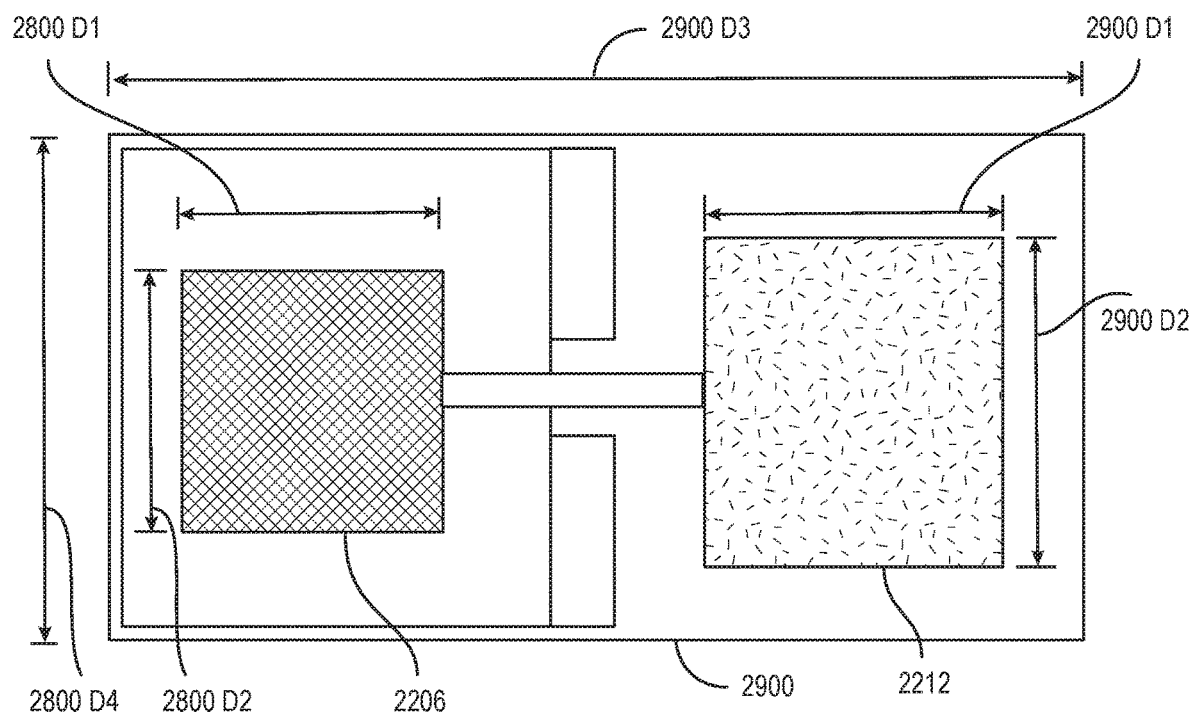
FIG. 29A is a top view and FIG. 29B a side view of an antenna mounted next to the package.
Figure 29B:
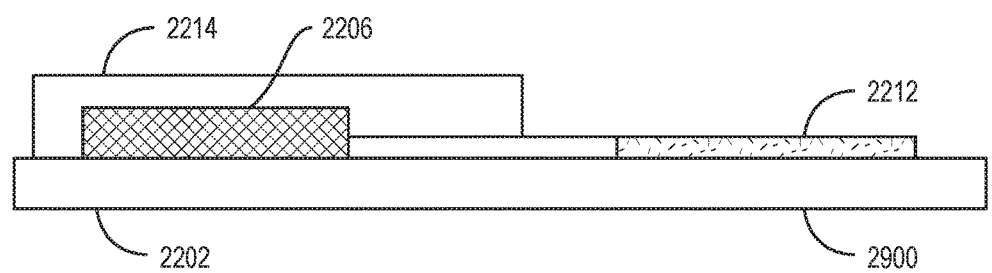

FIG. 29A is a top view and FIG. 29B a side view of an antenna 2212 mounted next to the RF IC 2206 and on the same substrate 2202. The RF IC 2206 is incapsulated in molding 2214 but the antenna 2212 is exposed outside of the molding 2214. Dimensions 2800D1, 2800D2, and 2800D4 in FIG. 29A are the same as that of FIGS. 28A-28B. Dimensions 2900D1 and 2900D2 may have dimensions in the range of up to approximately 3.04 mm or less. Dimension 2900D3 may be in the range of up to approximately 10 mm or less.

The foregoing described embodiments have been presented for purposes of illustration and description and are not intended to be exhaustive or limiting in any sense. Alterations and modifications may be made to the embodiments disclosed herein without departing from the spirit and scope of the invention. No language in the specification should be construed as indicating any non-claimed element as essential to the practice of the invention. The actual scope of the invention is to be defined by the claims. In the foregoing specification, embodiments have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

Although process (or method) steps may be described or claimed in a particular sequential order, such processes may be configured to work in different orders. In other words, any sequence or order of steps that may be explicitly described or claimed does not necessarily indicate a requirement that the steps be performed in that order unless specifically indicated. Further, some steps may be performed simultaneously despite being described or implied as occurring non-simultaneously (e.g., because one step is described after the other step) unless specifically indicated. Moreover, the illustration of a process by its depiction in a drawing does not imply that the illustrated process is exclusive of other variations and modifications thereto, does not necessarily imply that the illustrated process or any of its steps are necessary to the embodiment(s), and does not imply that the illustrated process is preferred.

The definitions of the words or elements of the claims shall include not only the combination of elements which are literally set forth, but all equivalent structure, material or acts for performing substantially the same function in substantially the same way to obtain substantially the same result.

Neither the Title (set forth at the beginning of the first page of the present application) nor the Abstract (set forth at the end of the present application) is to be taken as limiting in any way as the scope of the disclosed invention(s). The title of the present application and headings of sections provided in the present application are for convenience only, and are not to be taken as limiting the disclosure in any way.

Devices that are described as in "communication" with each other or "coupled" to each other need not be in continuous communication with each other or in direct physical contact, unless expressly specified otherwise. On the contrary, such devices need only transmit to each other as necessary or desirable, and may actually refrain from exchanging data most of the time. For example, a machine in communication with or coupled with another machine via the Internet may not transmit data to the other machine for long period of time (e.g. weeks at a time). In addition, devices that are in communication with or coupled with each other may communicate directly or indirectly through one or more intermediaries.

It should be noted that the recitation of ranges of values in this disclosure are merely intended to serve as a shorthand method of referring individually to each separate value falling within the range, unless otherwise indicated herein, and each separate value is incorporated into the specification as if it were individually recited herein. Therefore, any given numerical range shall include whole and fractions of numbers within the range. For example, the range "1 to 10" shall be interpreted to specifically include whole numbers between 1 and 10 (e.g., 1, 2, 3, . . . 9) and non-whole numbers (e.g., 1.1, 1.2, . . . 1.9).

The invention claimed is:

1. A wireless radio frequency (RF) semiconductor single packaged Gallium Arsenide Heterojunction Bipolar Transistor (GaAs HBT) module comprising:
- an RF antenna and an RF integrated circuit (RF IC) arranged with a ground plane located therebetween and spaced apart from a top surface of the RFIC, wherein the ground plane shields the RF IC from the RF antenna and is connected directly to a heat dissipator located at a bottom side of the RF IC; and
- wherein the GaAs HBT module transmits or receives one or more RF frequency bands.

2. The module of claim 1, wherein the ground plane encloses the RF IC to provide electromagnetic shielding from the RF antenna.

3. The module of claim 1, wherein the RF antenna has a single or a dual polarization for a better signal reception and transmission.

4. The module of claim 1, wherein the RF antenna can resonate and operate at different frequencies at the same time.

5. The module of claim 1, wherein the RF antenna is capable of resonating at 28 GigaHertz (GHz) and 39 GHz at the same time.

6. The module of claim 1, wherein the RF antenna is an array of elements.

7. The module of claim 1, wherein the RF IC includes at least one of the group consisting of: a power amplifier, low noise amplifier, RF switch, phase-shifter, power sensor, and linearizer.

8. The module of claim 1, wherein the RF IC is fabricated using semiconductor materials from the group consisting of: gallium arsenide (GaAs), gallium nitride (GaN), silicon germanium (SiGe), and complementary metal oxide semiconductor (CMOS).

9. The module of claim 1, wherein the module operates in frequency range from 6 GigaHertz (GHz) to 100 GHz.

10. The module of claim 1, wherein the physical location of the RF antenna relative to the module is on a top-side of the module.

11. The module of claim 1, wherein the RF IC operates in at least one of: a single frequency and multi-band frequencies.

12. The module of claim 1 further comprising: at least one power management chip (PMIC) toprovide needed voltage for normal operation.

13. The module of claim 1, wherein the module utilizes beam-forming or beam-steering to improve transmission or reception of the RF signal.

14. The module of claim 1, wherein the module utilizes multiple input multiple output (MIMO) and single input multiple output (SIMO).

15. The module of claim 1, wherein the module radiates power between 19 decibel milliwatts (dBm) to 73 dBm equivalent isotropically radiated power (EIRP).

16. The module of claim 1, wherein the module is configured for linearizing using digital predistortion (DPD) or analog predistortion (ADP) to improve signal transmission.

17. The module of claim 1, wherein the module comprises: at least two RF ICs which are configured to be combined to operate simultaneously to increase equivalent isotropically radiated power (EIRP) as desired.

18. The module of claim 1 further comprising: at least one of the group consisting of: a baseband chip, a transceiver chip, and an artificial intelligence (AI) chip.

19. The module of claim 1, wherein the RF IC has at least one RF up or down frequency converter and mixer.

20. A wireless radio frequency (RF) semiconductor single packaged Gallium Arsenide Heterojunction Bipolar Transistor (GaAs HBT) array module comprising:
- an RF antenna and an RF integrated circuit (RF IC) arranged with a ground plane located therebetween and spaced apart from a top surface of the RFIC, wherein the ground plane shields the RF IC from the RF antenna and is connected directly to a heat dissipator located at a bottom side of the RF IC; and
- wherein the GaAs HBT array module performs beam-steering in at least one or more RF frequency bands and radiates power between approximately 19 decibel milliwatts (dBm) to 73 dBm equivalent isotropically radiated power (EIRP).

* * * * *